United States Patent
Hwang et al.

(10) Patent No.: US 12,082,489 B2
(45) Date of Patent: *Sep. 3, 2024

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Kyuyoung Hwang, Anyang-si (KR); Seungyeon Kwak, Suwon-si (KR); Soyeon Kim, Seoul (KR); Sunyoung Lee, Seoul (KR); Jungin Lee, Seoul (KR); Hyeonho Choi, Seoul (KR); Whail Choi, Seoul (KR); Yoonhyun Kwak, Seoul (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 100 days.
This patent is subject to a terminal disclaimer.

(21) Appl. No.: 17/896,231

(22) Filed: Aug. 26, 2022

(65) Prior Publication Data
US 2023/0038197 A1 Feb. 9, 2023

Related U.S. Application Data
(63) Continuation of application No. 16/043,323, filed on Jul. 24, 2018, now Pat. No. 11,476,429.

(30) Foreign Application Priority Data
Jul. 26, 2017 (KR) .......... 10-2017-0094963

(51) Int. Cl.
| | | |
|---|---|---|
| H10K 85/30 | (2023.01) | |
| C07F 15/00 | (2006.01) | |
| C09K 11/06 | (2006.01) | |
| H10K 50/11 | (2023.01) | |
| H10K 50/15 | (2023.01) | |
| H10K 50/16 | (2023.01) | |
| H10K 50/17 | (2023.01) | |
| H10K 50/18 | (2023.01) | |
| H10K 101/10 | (2023.01) | |
| H10K 101/30 | (2023.01) | |
| H10K 101/40 | (2023.01) | |

(52) U.S. Cl.
CPC ....... *H10K 85/346* (2023.02); *C07F 15/0086* (2013.01); *C09K 11/06* (2013.01);
(Continued)

(58) Field of Classification Search
CPC ....... C09K 2211/185; C09K 2211/1044; C07F 15/0086; H01L 51/0087; H10K 85/346
See application file for complete search history.

(56) References Cited

U.S. PATENT DOCUMENTS
| | | |
|---|---|---|
| 2012/0018711 A1 | 1/2012 | Che et al. |
| 2013/0261098 A1 | 10/2013 | Pan et al. |
(Continued)

FOREIGN PATENT DOCUMENTS
| | | | |
|---|---|---|---|
| JP | 2014111549 A | * | 6/2014 |
| JP | 2014111549 A | | 6/2014 |
| KR | 1020150102680 A | | 9/2015 |

OTHER PUBLICATIONS
Machine Translation of JP2014111549 (Year: 2014).*
(Continued)

*Primary Examiner* — Jenna N Chandhok
(74) *Attorney, Agent, or Firm* — CANTOR COLBURN LLP

(57) ABSTRACT

An organometallic compound represented by Formula 1:

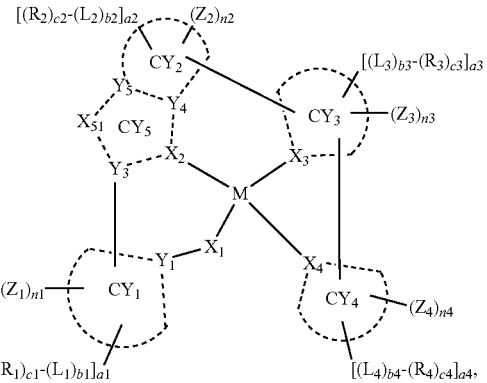

Formula 1 wherein, in Formula 1, groups and variables are the same as described in the specification.

19 Claims, 1 Drawing Sheet

(52) U.S. Cl.
CPC ............ *C09K 2211/1044* (2013.01);
*C09K 2211/185* (2013.01); *H10K 50/11*
(2023.02); *H10K 50/15* (2023.02); *H10K*
*50/16* (2023.02); *H10K 50/17* (2023.02);
*H10K 50/171* (2023.02); *H10K 50/18*
(2023.02); *H10K 85/324* (2023.02); *H10K*
*2101/10* (2023.02); *H10K 2101/30* (2023.02);
*H10K 2101/40* (2023.02)

(56) References Cited

U.S. PATENT DOCUMENTS

| | | |
|---|---|---|
| 2015/0249222 A1 | 9/2015 | Szigethy et al. |
| 2016/0240800 A1 | 8/2016 | Ma et al. |
| 2017/0025630 A1* | 1/2017 | Seo ............... H10K 50/15 |
| 2017/0098790 A1 | 4/2017 | Kwong et al. |
| 2018/0013078 A1 | 1/2018 | Lee et al. |
| 2018/0208615 A1 | 7/2018 | Lin et al. |
| 2018/0244706 A1 | 8/2018 | Lee et al. |

OTHER PUBLICATIONS

English Translation of Office Action issued Jan. 21, 2022, in corresponding KR Patent Application No. 10-2017-0094963, 8 pp.
Machine English Translation of JP 2014111549, 2014.
Office Action issued Jan. 21, 2022, in corresponding KR Patent Application No. 10-2017-0094963, 7 pp.
Wang et al., "Strongly phosphorescent platinum(ii) complexes supported by tetradentate benzazole-containing ligands*", Journal of Materials Chemistry C, 3, 2015, 8212.

* cited by examiner

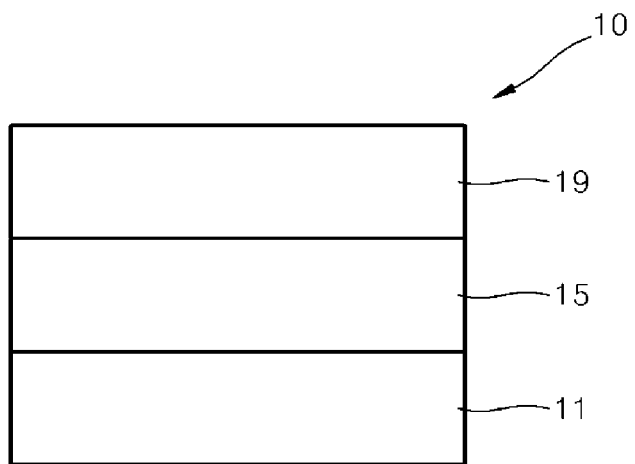

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This is a continuation application of U.S. application Ser. No. 16/043,323, filed on Jul. 24, 2018, which claims priority to Korean Patent Application No. 10-2017-0094963, filed on Jul. 26, 2017, in the Korean Intellectual Property Office, and all the benefits accruing therefrom under 35 U.S.C. § 119, the contents of which are incorporated herein in their entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, luminance, a driving voltage, and a response speed, and which produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of such luminescent compounds is a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to one or more embodiments, an organometallic compound represented by Formula 1 is provided.

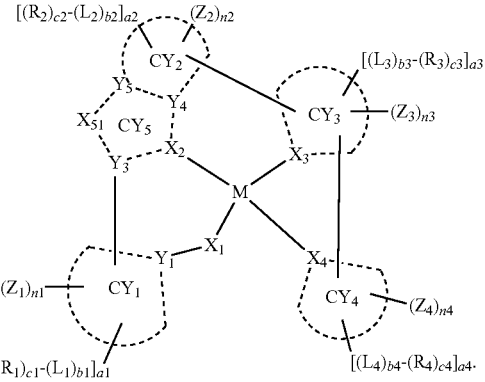

Formula 1

In Formula 1,
M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), rhutenium (Ru), rhodium (Rh), palladium (Pd), silver (Ag), rhenium (Re), platinum (Pt), or gold (Au), $X_1$ may be a chemical bond, O, S, N(R'), P(R'), B(R'), C(R')(R''), Si(R')(R''), or N(R')(R''), and when $X_1$ is a chemical bond, $Y_1$ is directly bonded with M, a bond between $X_1$ and M may be a covalent bond, $X_2$ to $X_4$ may each independently be N or C, one bond selected from a bond between $X_2$ and M, a bond between $X_3$ and M, and a bond between $X_4$ and M is a covalent bond, and the remaining two bonds are coordinate bonds, $Y_1$ and $Y_3$ to $Y_5$ may each independently be C or N, regarding a pair of $X_2$ and $Y_3$, a pair of $X_2$ and $Y_4$, a pair of $Y_4$ and $Y_5$, a pair of $X_{51}$ and $Y_3$, and a pair of $X_{51}$ and $Y_5$, components constituting each pair may be connected to each other via a chemical bond, $CY_1$ to $CY_5$ may each independently be selected from a $C_5$-$C_{30}$ carbocyclic group and a $C_1$-$C_{30}$ heterocyclic group, a cyclometalated ring formed by $CY_5$, $CY_2$, $CY_3$, and M may be a 6-membered ring, $X_{51}$ may be selected from O, S, N-[$(L_7)_{b7}$-$(R_7)_{c7}$], C($R_7$)($R_8$), Si($R_7$)($R_8$), Ge($R_7$)($R_8$), C(=O), N, C($R_7$), Si($R_7$), and Ge($R_7$), $R_7$ and $R_8$ may be optionally bonded to each other via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ may each independently be selected from a single bond, a substituted or unsubstituted $C_5$-$C_{30}$ carbocyclic group, and a substituted or unsubstituted $C_1$-$C_{30}$ heterocyclic group, b1 to b4 and b7 may each independently be an integer from 1 to 5, $R_1$ to $R_4$, $R_7$, $R_8$, R', and R'' may each independently selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), c1 to c4 and c7 may each independently be an integer from 1 to 5, $Z_1$ to $Z_4$ may each independently be a cyano group (CN)—containing group, a1 to a4 and n1, n2, n3, and n4 may each independently be an integer from 0 to 20, two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, two or more neighboring substituents selected from groups $R_1$ to $R_4$, $R_7$, and $R_8$ may optionally be linked to form a substituted or unsubstituted $C_5$-$C_{30}$ carbocyclic group or a substituted or unsubstituted $C_1$-$C_{30}$ heterocyclic group, i) when $X_{51}$ is O, S, C(=O), or N, the sum of n1, n2, n3, and n4 may be 1 or more, ii) when $X_{51}$ is N[($L_7$)$_{b7}$-($R_7$)$_{c7}$], C($R_7$), Si($R_7$), or Ge($R_7$), $R_7$ may be a cyano group-containing group or the sum of n1, n2, n3, and n4 may be 1 or more, iii) when $X_{51}$ is C($R_7$)($R_8$), Si($R_7$)($R_8$), or Ge($R_7$)($R_8$), at least one selected from $R_7$ and $R_8$ may be a cyano group-containing group or the sum of n1, n2, n3, and n4 may be 1 or more, at least one of substituents of the substituted $C_5$-$C_{30}$ carbocyclic group, substituted $C_1$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{600}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$) and —P(=O)($Q_{38}$)($Q_{39}$), wherein $Q_1$ to $Q_9$, $Q_{11}$ to $Q_{19}$, $Q_{21}$ to $Q_{29}$ and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Another aspect of the present disclosure provides an organic light-emitting device including:
a first electrode,
a second electrode, and
an organic layer disposed between the first electrode and the second electrode,
wherein the organic layer includes an emission layer and at least one organometallic compound.

The organometallic compound of the organic layer may act as a dopant.

Another aspect of the present disclosure provides a diagnostic composition including at least one organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment is represented by Formula 1 below:

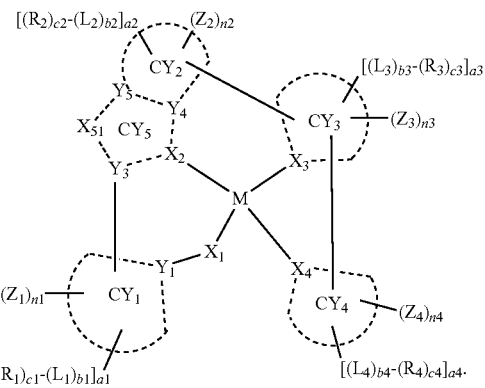

Formula 1

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), rhutenium (Ru), rhodium (Rh), palladium (Pd), silver (Ag), rhenium (Re), platinum (Pt), or gold (Au).

For example, M in Formula 1 may be platinum, but embodiments of the present disclosure are not limited thereto.

The organometallic compound represented by Formula 1 may not consist of an ion pair of a cation and an anion, that is, may be neutral.

$X_1$ in Formula 1 may be a chemical bond (for example, a single bond or a covalent bond), O, S, N(R'), P(R'), B(R'), C(R')(R"), Si(R')(R"), or N(R')(R"), and a bond between $X_1$ and M may be a covalent bond. When $X_1$ is a chemical bond, $Y_1$ may be directly bonded with M.

For example, $X_1$ in Formula 1 may be chemical bond or O, but embodiments of the present disclosure are not limited thereto.

In Formula 1, $X_2$ to $X_4$ may each independently be N or C, and one bond selected from a bond between $X_2$ and M, a bond between $X_3$ and M, and a bond between $X_4$ and M may be a covalent bond, and the remaining two bonds may each be a coordinate bond.

For example, in Formula 1,
  i) $X_2$ and $X_4$ may each be N, $X_3$ may be C, a bond between $X_2$ and M and a bond between $X_4$ and M may each be a coordinate bond, and a bond between $X_3$ and M may be a covalent bond,
  ii) $X_3$ and $X_4$ may each be N, $X_2$ may be N, a bond between $X_3$ and M and a bond between $X_4$ and M may each be a coordinate bond, and a bond between $X_2$ and M may be a covalent bond,
  iii) $X_2$ and $X_3$ may each be N, $X_4$ may be N, a bond between $X_2$ and M may be a covalent bond, and a bond between $X_3$ and M and a bond between $X_4$ and M may each be coordinate bond, or
  iv) $X_2$ and $X_3$ may each be N, $X_4$ may be C, a bond between $X_2$ and M and a bond between $X_3$ and M may each be a coordinate bond, and a bond between $X_4$ and M may be a covalent bond, but embodiments of the present disclosure are not limited thereto.

$Y_1$ and $Y_3$ to $Y_5$ in Formula 1 may each independently be C or N.

A pair of $X_2$ and $Y_3$, a pair of $X_2$ and $Y_4$, a pair of $Y_4$ and $Y_5$, a pair of $X_{51}$ and $Y_3$, and a pair of $X_{51}$ and $Y_5$ in Formula 1 may each be bonded via a chemical bond (for example, a single bond, a double bond, a bond constituting a carbene ligand, or the like) to form a part of $CY_1$ to $CY_5$.

$CY_1$ to $CY_5$ in Formula 1 may each independently be selected from a $C_5$-$C_{30}$ carbocyclic group and a $C_1$-$C_{30}$ heterocyclic group.

In one or more embodiments, in Formula 1,
  $CY_1$, $CY_2$, and $CY_4$ may each independently be a 6-membered ring group,
  $CY_3$ may be selected from a 6-membered ring group, a fluorene group, a carbazole group, a dibenzofuran group, a dibenzothiophene group, a dibenzosilole group, an azafluorene group, an azacarbazole group, an azadibenzofuran group, an azadibenzothiophene group, and an azadibenzosilole group,
  $CY_5$ may be a 5-membered ring.

In one or more embodiments, $CY_1$ to $CY_4$ in Formula 1 may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group, but embodiments of the present disclosure are not limited thereto.

In one or more embodiments, $CY_1$ to $CY_4$ in Formula 1 may each independently be selected from a) 6-membered ring, b) a condensed ring in which two or more 6-membered rings are condensed with each other, or c) a condensed ring in which one or more 6-membered ring is condensed with one or more 5-membered ring,
  the 6-membered ring may be selected from a cyclohexane group, a cyclohexene group, an adamantane group, a norbornane group, a norbornene group, a benzene group, a pyridine group, a pyrimidine group, a pyrazine group, a pyridazine group, and a triazine group, and
  the 5-membered ring may be selected from a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group and thiadiazole group.

A cyclometalated ring formed by $CY_5$, $CY_2$, $CY_3$, and M in Formula 1 is a 6-membered ring.

$X_{51}$ in Formula 1 may be selected from O, S, N-[$(L_7)_{b7}$-$(R_7)_{c7}$], C($R_7$)($R_8$), Si($R_7$)($R_8$), Ge($R_7$)($R_8$), C(=O), N, C($R_7$), Si($R_7$), and Ge($R_7$), and $R_7$ and $R_8$ may optionally be linked via a first linking group to form a substituted or unsubstituted $C_5$-$C_{30}$ carbocyclic group or a substituted or unsubstituted $C_1$-$C_{30}$ heterocyclic group (for example, a 5-membered to 7-membered cyclic group having the carbon number of 5 or 6; or a 5-membered to 7-membered cyclic group of which the carbon number is 5 or 6 and which is substituted with at least one selected from deuterium, a cyano group, —F, a $C_1$-$C_{10}$ alkyl group, and a $C_6$-$C_{14}$ aryl group). $L_7$, b7, $R_7$, $R_8$, and c7 will be described in detail.

The first linking group may be selected from a single bond, *—O—*', *—S—*'. *—C($R_5$)($R_6$)—*', *—C($R_5$)=*', *=C($R_6$)—*', *—C($R_5$)=C($R_6$)—*', *—C(=O)—*', *—C(=S)—*', *—C≡C—*', *—N($R_5$)—*'. *—Si($R_5$)($R_6$)—*', and *—P($R_5$)($R_6$)—*', $R_5$ and $R_6$ may be the same as described in connection with $R_1$, and * and *' each indicate a binding site to a neighboring atom.

In one or more embodiments, in Formula 1,
  i) $Y_3$ to $Y_5$ may each be C, a bond between $X_{51}$ and $Y_3$ and a bond between $X_{51}$ and $Y_5$ may each be a single bond, and $X_{51}$ may be O, S, N-[$(L_7)_{b7}$-$(R_7)_{c7}$], C($R_7$)($R_8$), Si($R_7$)($R_8$), Ge($R_7$)($R_8$), or C(=O),
  ii) $Y_3$ and $Y_4$ may each be C, $Y_5$ may be N, a bond between $X_{51}$ and $Y_3$ may be a double bond, a bond between $X_{51}$ and $Y_5$ may be a single bond, and $X_{51}$ may be N, $C(R_7)$, $Si(R_7)$, or $Ge(R_7)$, iii) $Y_3$ and $Y_5$ may each be C, $Y_4$ may be N, a bond between $X_{51}$ and $Y_3$ may be a single bond, a bond between $X_{51}$ and $Y_5$ may be a double bond, and $X_{51}$ may be N, $C(R_7)$, $Si(R_7)$, or $Ge(R_7)$, iv) $Y_3$ may be N, $Y_4$ and $Y_5$ may each be C, a bond between $X_{51}$ and $Y_3$ may be a single bond, a bond between $X_{51}$ and $Y_5$ may be a double bond, and $X_{51}$ may be N, $C(R_7)$, $Si(R_7)$, or $Ge(R_7)$, or v) $Y_3$ to $Y_5$ may each be C, a bond between $X_{51}$ and $Y_3$ may be a double bond, a bond between $X_{51}$ and $Y_5$ may be a single bond, and $X_{51}$ may be N, $C(R_7)$, $Si(R_7)$, or $Ge(R_7)$.

$L_1$ to $L_4$ and $L_7$ in Formula 1 may each independently be selected from a single bond, a substituted or unsubstituted $C_5$-$C_{30}$ carbocyclic group, and a substituted or unsubstituted $C_1$-$C_{30}$ heterocyclic group.

For example, $L_1$ to $L_4$ and $L_7$ in Formula 1 may each independently be selected from:

a single bond, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzooxadiazole group, and a benzothiadiazole group; and a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzooxadiazole group, and a benzothiadiazole group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$);

$Q_{31}$ to $Q_{39}$ may each independently be selected from: —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

b1 to b4 and b7 in Formula 1 indicate numbers of $L_1$ to $L_4$ and $L_7$, respectively, and may each independently an integer from 1 to 5. When b1 is 2 or more, two or more groups $L_1$ may be identical to or different from each other. b2 to b4 and b7 may each be the same as described in connection with b1.

In an embodiment, b1 to b4 and b7 in Formula 1 may each be 1 or 2, but embodiments of the present disclosure are not limited thereto.

$R_1$ to $R_4$, $R_7$, $R_8$, R' and R" in Formula 1 may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$).

For example, $R_1$ to $R_4$, $R_7$, $R_8$, R', and R" may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, C$_1$-C$_{20}$ alkyl group, and a C$_1$-C$_{20}$ alkoxy group;

a C$_1$-C$_{20}$ alkyl group and a C$_1$-C$_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group and —Si(Q$_{33}$)(Q$_{34}$)(Q$_{35}$); and —N(Q$_1$)(Q$_2$), —Si(Q$_3$)(Q$_4$)(Q$_5$), —B(Q$_6$)(Q$_7$) and —P(=O)(Q$_8$)(Q$_9$);

wherein Q$_1$ to Q$_9$ and Q$_{33}$ to Q$_{35}$ are each the same as described in connection with Q$_{31}$.

In an embodiment, the R$_1$ to R$_4$, R$_7$, R$_8$, R' and R" are each independently selected from:

hydrogen, deuterium, —F, a cyano group, a nitro group, —SF$_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, —CD$_3$, —CD$_2$H, —CDH$_2$, —CF$_3$, —CF$_2$H, —CFH$_2$, a cyano group, a nitro group, a C$_1$-C$_{10}$ alkyl group, a C$_1$-C$_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, a dibenzosilolyl group, and —Si(Q$_{33}$)(Q$_{34}$)(Q$_{35}$); and N(Q$_1$)(Q$_2$), —Si(Q$_3$)(Q$_4$)(Q$_5$), —B(Q$_6$)(Q$_7$) and —P(=O)(Q$_8$)(Q$_9$), wherein Q$_1$ to Q$_9$ and Q$_{33}$ to Q$_{35}$ may be the same as described above, but embodiments of the present disclosure are not limited thereto.

In one or more embodiments, R$_1$ to R$_4$, R$_7$, R$_8$, R', and R" may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, —C(CD$_3$)$_3$, groups represented by Formulae 9-1 to 9-19, groups represented by Formulae 10-1 to 10-140, —N(Q$_1$)(Q$_2$), —Si(Q$_3$)(Q$_4$)(Q$_5$), —B(Q$_6$)(Q$_7$) and —P(=O)(Q$_8$)(Q$_9$) (wherein Q$_1$ to Q$_9$ may each be the same as described above), but embodiments of the present disclosure are not limited thereto:

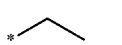

Formula 9-1

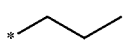

Formula 9-2

Formula 9-3

Formula 9-4

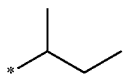

Formula 9-5

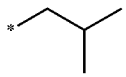

Formula 9-6

-continued

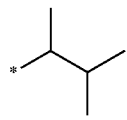

Formula 9-7

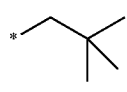

Formula 9-8

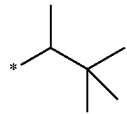

Formula 9-9

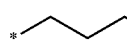

Formula 9-10

Formula 9-11

Formula 9-12

Formula 9-13

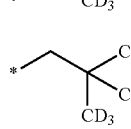

Formula 9-14

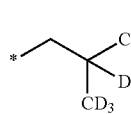

Formula 9-15

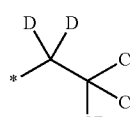

Formula 9-16

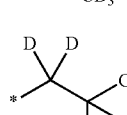

Formula 9-17

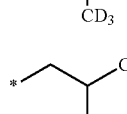

Formula 9-18

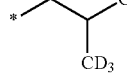

Formula 9-19

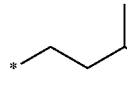

Formula 10-1

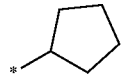

Formula 10-2

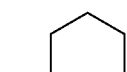

Formula 10-3

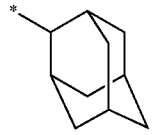

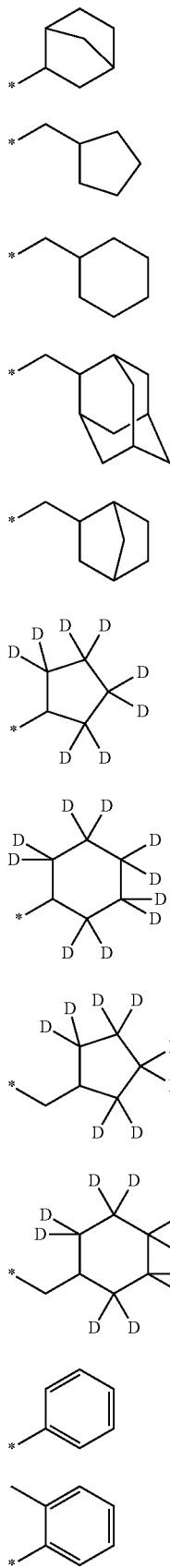
Formula 10-4
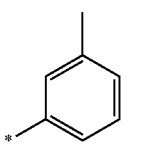
Formula 10-5
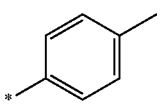
Formula 10-6
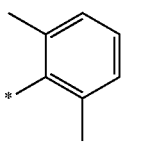
Formula 10-7
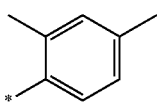
Formula 10-8
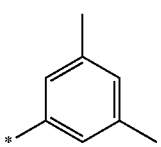
Formula 10-9
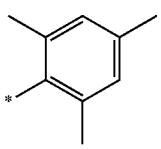
Formula 10-10
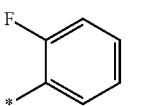
Formula 10-11
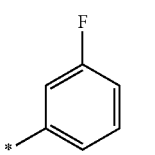
Formula 10-12
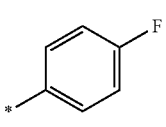
Formula 10-13
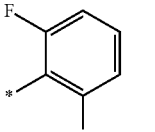
Formula 10-14
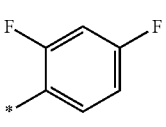
Formula 10-15
Formula 10-16
Formula 10-17
Formula 10-18
Formula 10-19
Formula 10-20
Formula 10-21
Formula 10-22
Formula 10-23
Formula 10-24
Formula 10-25

Formula 10-26
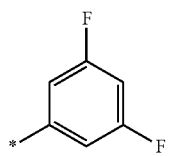
Formula 10-27
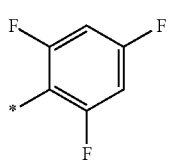
Formula 10-28
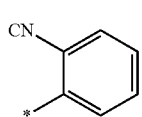
Formula 10-29
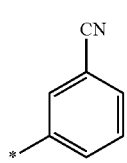
Formula 10-30
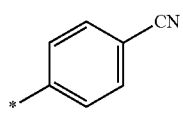
Formula 10-31
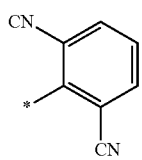
Formula 10-32
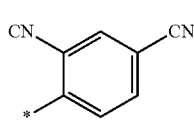
Formula 10-33
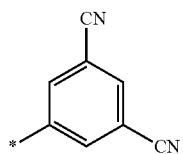
Formula 10-34
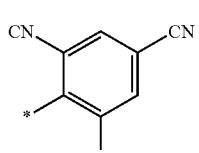
Formula 10-35
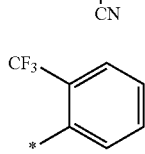
Formula 10-36
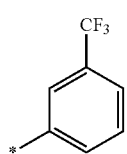
Formula 10-37
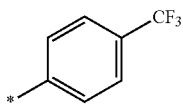
Formula 10-38
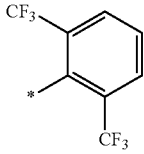
Formula 10-39
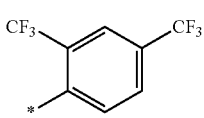
Formula 10-40
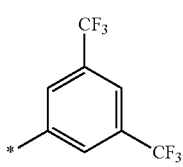
Formula 10-41
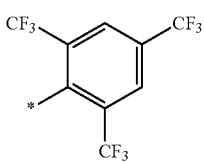
Formula 10-42
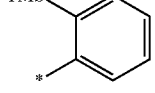
Formula 10-43
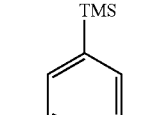
Formula 10-44
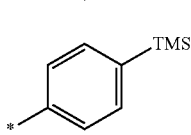
Formula 10-45
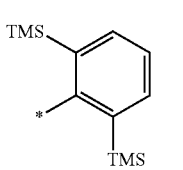
Formula 10-46
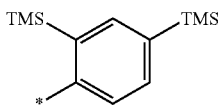
Formula 10-47
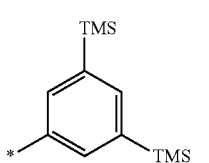

-continued
Formula 10-48
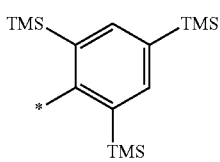
Formula 10-49
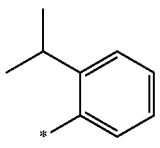
Formula 10-50
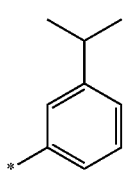
Formula 10-51
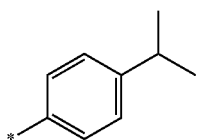
Formula 10-52
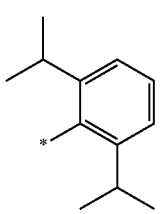
Formula 10-53
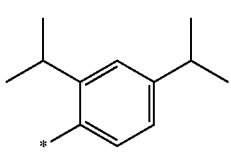
Formula 10-54
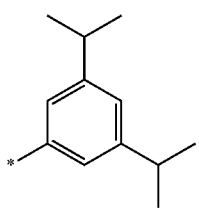
Formula 10-55
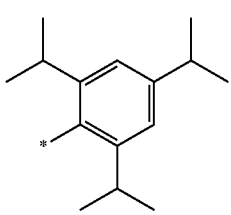
Formula 10-56
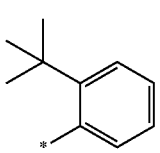
-continued
Formula 10-57
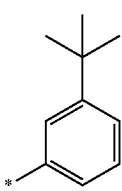
Formula 10-58
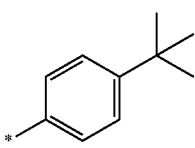
Formula 10-59
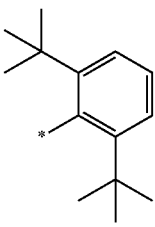
Formula 10-60
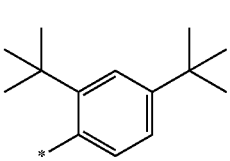
Formula 10-61
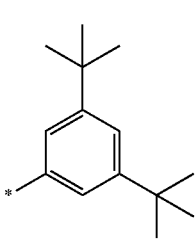
Formula 10-62
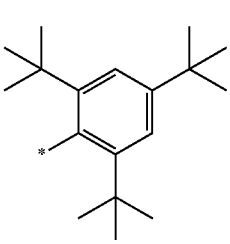
Formula 10-63
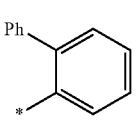
Formula 10-64
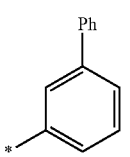
Formula 10-65
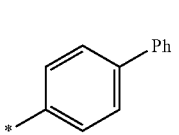

Formula 10-66
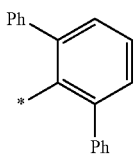
Formula 10-67
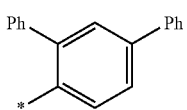
Formula 10-68
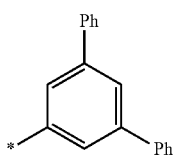
Formula 10-69
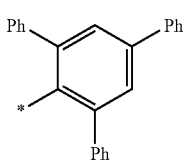
Formula 10-70
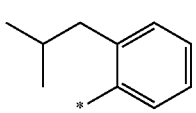
Formula 10-71
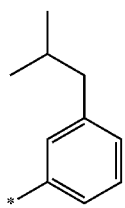
Formula 10-72
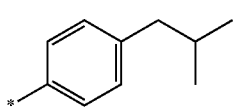
Formula 10-73
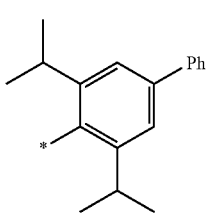
Formula 10-74
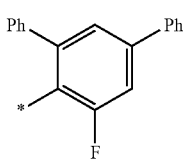
Formula 10-75
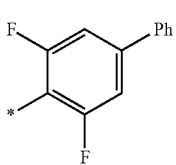
Formula 10-76
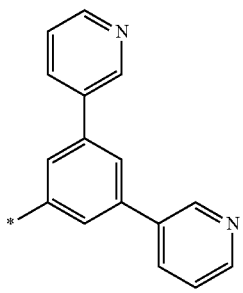
Formula 10-77
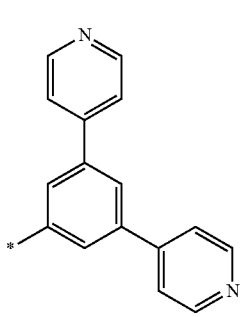
Formula 10-78
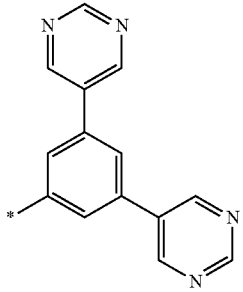
Formula 10-79
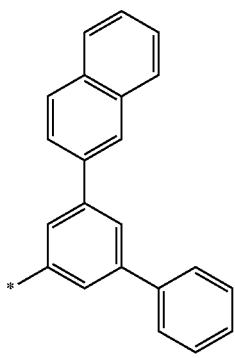
Formula 10-80
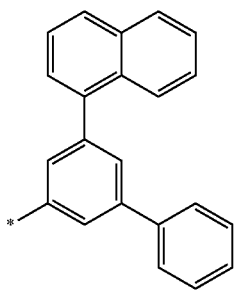

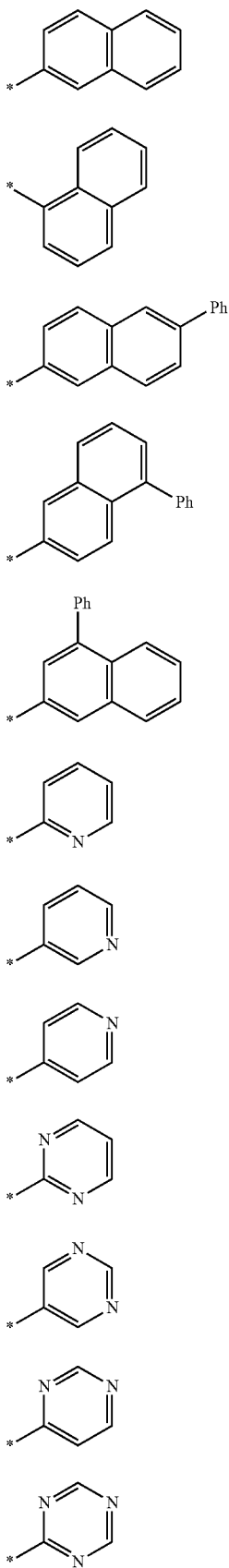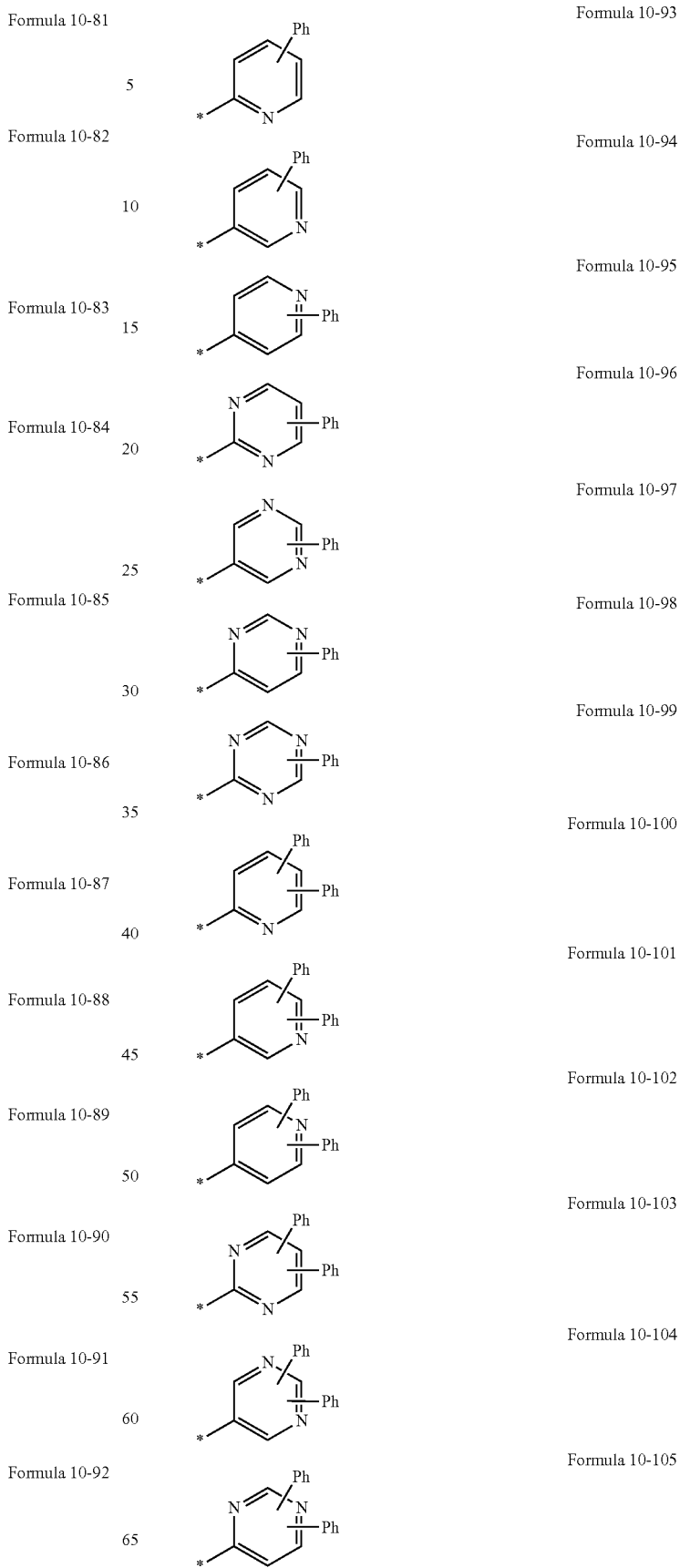

-continued
Formula 10-106
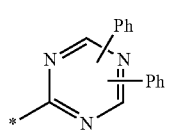
Formula 10-107
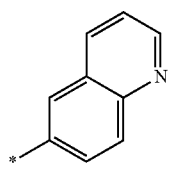
Formula 10-108
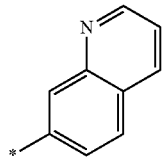
Formula 10-109
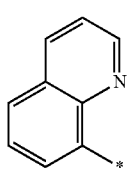
Formula 10-110
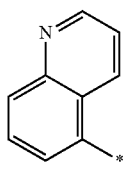
Formula 10-111
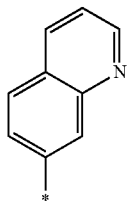
Formula 10-112
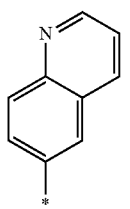
Formula 10-113
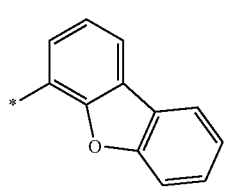
Formula 10-114
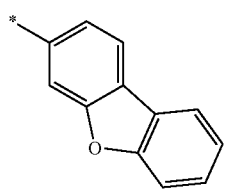
-continued
Formula 10-115
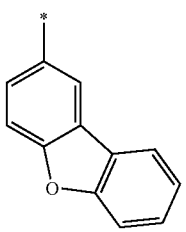
Formula 10-116
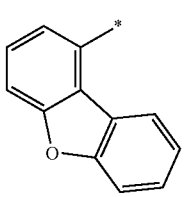
Formula 10-117
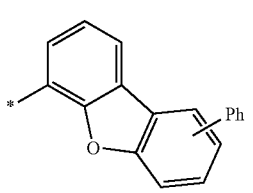
Formula 10-118
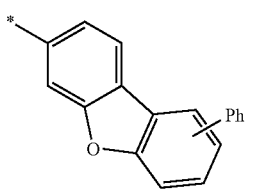
Formula 10-119
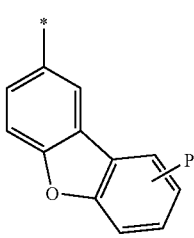
Formula 10-120
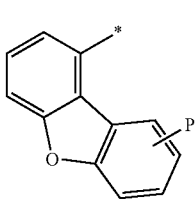
Formula 10-121
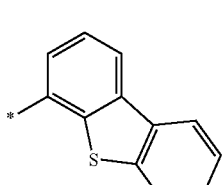
Formula 10-122
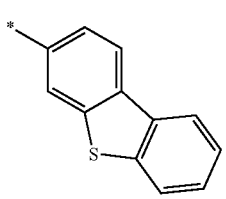

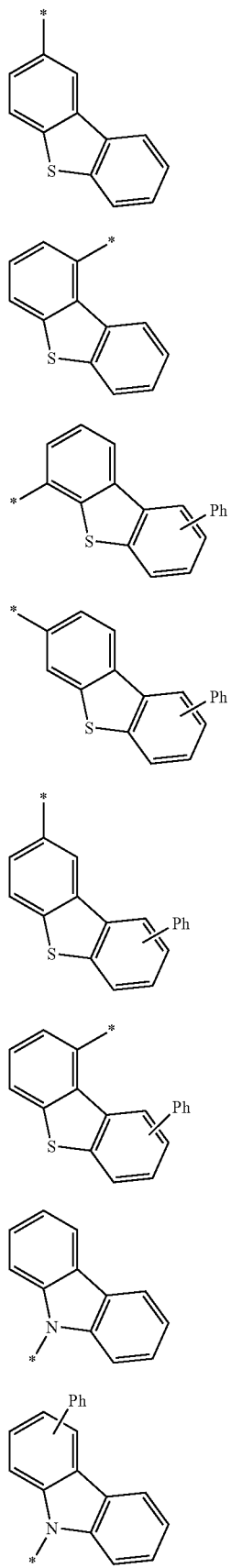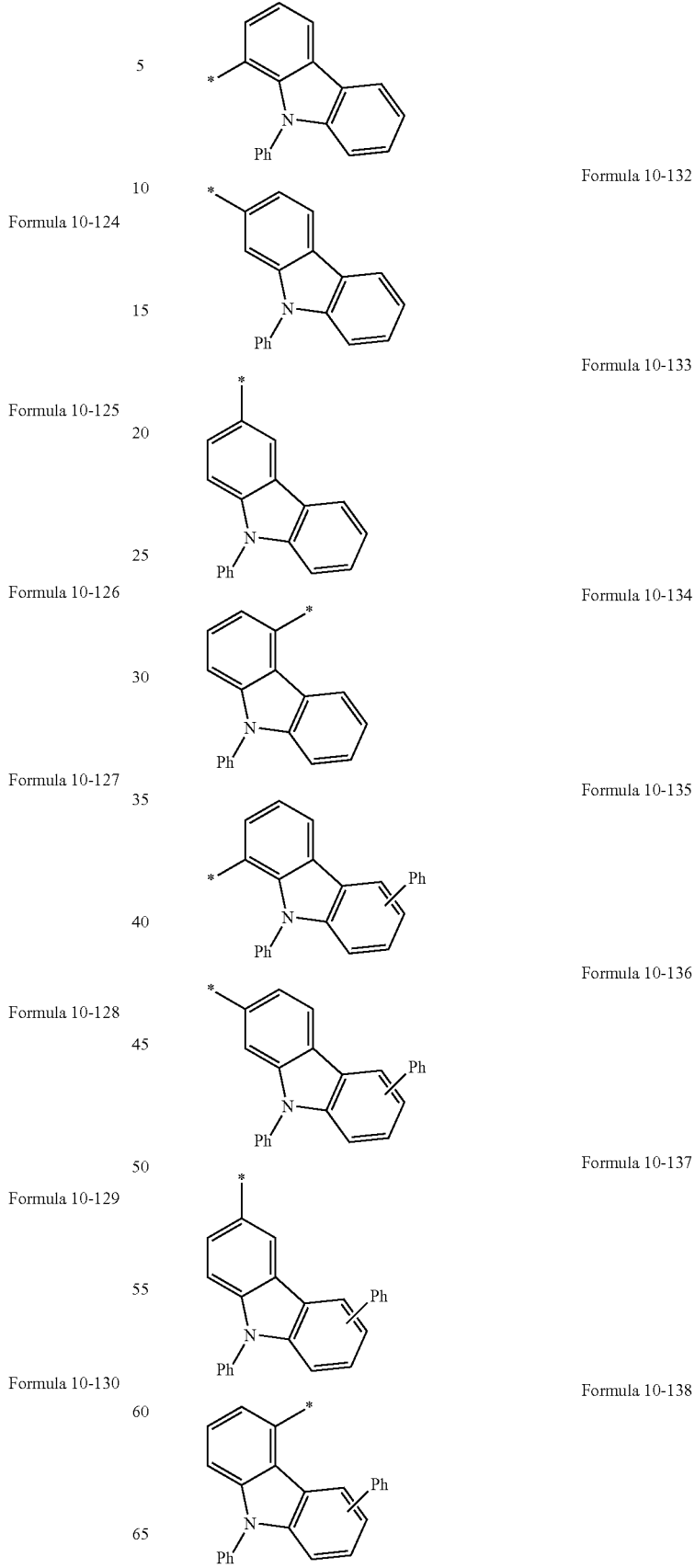

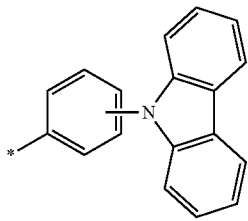

Formula 10-139

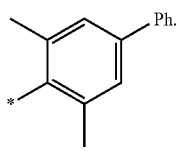

Formula 10-140

In Formulae 9-1 to 9-19 and 10-1 to 10-140,
* indicates a binding site to a neighboring atom,
"Ph" indicates a phenyl group, and
"TMS" indicates a trimethylsilyl group.

c1 to c4 and c7 in Formula 1 respectively indicate the numbers of $R_1$ to $R_4$ and $R_7$, and may each independently be an integer from 1 to 5. When c1 is two or more, two or more of groups $R_1$ may be identical to or different from each other. c2 to c4 and c7 are the same as described in connection with c1.

In one or more embodiments, c1 to c4 and c7 in Formula 1 may be 1 or 2, but embodiments of the present disclosure are not limited thereto.

$Z_1$ to $Z_4$ in Formula 1 may each independently be a cyano group (CN)—containing group.

The cyano group-containing group may be
a cyano group; or
a first group substituted with at least one cyano group;
the first group may be selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In an embodiment, the first group may be the same as described in connection with $R_1$. For example, the first group may be selected from —$SF_5$, —$CH_3$, —$CD_3$, —$CD_2H$, —$CDH_2$, —$CF_3$, —$CF_2H$, —$CFH_2$, —$C(CD_3)_3$, groups represented by Formulae 9-1 to 9-19, groups represented by Formulae 10-1 to 10-140, —$N(Q_1)(Q_2)$, —$Si(Q_3)(Q_4)(Q_5)$, —$B(Q_6)(Q_7)$, and —$P(=O)(Q_8)(Q_9)$, but embodiments of the present disclosure are not limited thereto.

When the cyano group-containing group is "the first group substituted with at least one cyano group" and the first group is *—$CH_3$, it would be understood through the present specification that the cyano group-containing group includes *—$C(CN)_3$, *—$CH(CN)_2$, and *—$CH_2(CN)$.

In an embodiment, the cyano group-containing group may be a cyano group.

In Formula 1, a1 to a4 indicate the numbers of *-$[(L_1)_{b1}$-$(R_1)_{c1}]$, *-$[(L_2)_{b2}$-$(R_2)_{c2}]$, *-$[(L_3)_{b3}$-$(R_3)_{c3}]$, and *-$[(L_4)_{b4}$-$(R_4)_{c4}]$, respectively, and n1, n2, n3, and n4 indicate the numbers of $Z_1$ to $Z_4$, respectively, and may each independently be an integer from 0 to 20. When a1 is two or more, two or more groups *-$[(L_1)_{b1}$-$(R_1)_{c1}]$ may be identical to or different from each other, when a2 is two or more, two or more groups *-$[(L_2)_{b2}$-$(R_2)_{c2}]$ may be identical to or different from each other, when a3 is two or more, two or more groups *-$[(L_3)_{b3}$-$(R_3)_{c3}]$ may be identical to or different from each other, when a4 is two or more, two or more groups *-$[(L_4)_{b4}$-$(R_4)_{c4}]$ may be identical to or different from each other, when n1 is two or more, two or more groups $Z_1$ may be identical to or different from each other, when n2 is two or more, two or more groups $Z_2$ may be identical to or different from each other, when n3 is two or more, two or more groups $Z_3$ may be identical to or different from each other, and when n4 is two or more, two or more groups $Z_4$ may be identical to or different from each other.

In Formula 1, i) two of a plurality of neighboring groups $R_1$ may optionally be linked to form a substituted or unsubstituted $C_5$-$C_{30}$ carbocyclic group or a substituted or unsubstituted $C_1$-$C_{30}$ heterocyclic group, ii) two of a plurality of neighboring groups $R_2$ may optionally be linked to form a substituted or unsubstituted $C_5$-$C_{30}$ carbocyclic group or a substituted or unsubstituted $C_1$-$C_{30}$ heterocyclic group, iii) two of a plurality of neighboring groups $R_3$ may optionally be linked to form a substituted or unsubstituted $C_5$-$C_{30}$ carbocyclic group or a substituted or unsubstituted $C_1$-$C_{30}$ heterocyclic group, iv) two of a plurality of neighboring groups $R_4$ may optionally be linked to form a substituted or unsubstituted $C_5$-$C_{30}$ carbocyclic group or a substituted or unsubstituted $C_1$-$C_{30}$ heterocyclic group, v) two or more selected from groups $R_1$ to $R_4$, and $R_7$ and $R_8$ may optionally be linked to form a substituted or unsubstituted $C_5$-$C_{30}$ carbocyclic group or a substituted or unsubstituted $C_1$-$C_{30}$ heterocyclic group.

For example, in Formula 1, i) a substituted or unsubstituted $C_5$-$C_{30}$ carbocyclic group or a substituted or unsubstituted $C_1$-$C_{30}$ heterocyclic group, formed by bonding two of a plurality of neighboring groups $R_1$, ii) a substituted or unsubstituted $C_5$-$C_{30}$ carbocyclic group or a substituted or unsubstituted $C_1$-$C_{30}$ heterocyclic group, formed by bonding two of a plurality of neighboring groups $R_2$, iii) a substituted or unsubstituted $C_5$-$C_{30}$ carbocyclic group or a substituted or unsubstituted $C_1$-$C_{30}$ heterocyclic group, formed by bonding two of a plurality of neighboring groups $R_3$, iv) a substituted or unsubstituted $C_5$-$C_{30}$ carbocyclic group or a substituted or unsubstituted $C_1$-$C_{30}$ heterocyclic group, formed by bonding two of a plurality of neighboring groups $R_4$, and v) a substituted or unsubstituted $C_5$-$C_{30}$ carbocyclic group or a substituted or unsubstituted $C_1$-$C_{30}$ heterocyclic group, formed by bonding two or more selected from $R_1$ to $R_4$, $R_7$, and $R_8$, may each independently be selected from:

a pentadiene group, a cyclohexane group, a cycloheptane group, an adamantane group, a bicycle-heptane group, a bicycle-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group; and a pentadiene group, a cyclohexane group, a cycloheptane group, an adamantane group, a bicycle-heptane group, a bicycle-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one selected from at least one $R_{10a}$;

but embodiments of the present disclosure are not limited thereto.

$R_{10a}$ may be the same as described in connection with $R_1$.

"An azabenzothiophene, an azabenzofuran, an azaindene, an azaindole, an azabenzosilole, an azadibenzothiophene, an azadibenzofuran, an azafluorene, an azacarbazole, and an azadibenzosilole" each have the same ring system as "a benzothiophene, a benzofuran, an indene, an indole, a benzosilole, a dibenzothiophene, a dibenzofuran, a fluorene, a carbazole, and a dibenzosilole," respectively, and each further contain a hetero ring in which at least one of ring-forming carbon atoms is substituted with nitrogen.

In Formula 1, i) when $X_{51}$ is O, S, C(=O), or N, the sum of n1, n2, n3, and n4 may be 1 or more (for example, 1, 2, 3, 4, or 5), ii) when $X_{51}$ is $N[(L_7)_{b7}-(R_7)_{c7}]$, $C(R_7)$, $Si(R_7)$, or $Ge(R_7)$, $R_7$ may be a cyano group-containing group or the sum of n1, n2, n3, and n4 may be 1 or more (for example, 1, 2, 3, 4, or 5), and iii) when $X_{51}$ is $C(R_7)(R_8)$, $Si(R_7)(R_8)$, or $Ge(R_7)(R_8)$, at least one selected from $R_7$ and $R_8$ may be a cyano group-containing group or the sum of n1, n2, n3, and n4 may be 1 or more (for example, 1, 2, 3, 4, or 5).

That is, the organometallic compound represented by Formula 1 essentially includes at least one cyano group-containing group as defined herein.

In an embodiment, the sum of n1, n2, n3, and n4 in Formula 1 may be 1, 2, 3, or 4, for example, 1 or 2. That is, the number of cyano group-containing groups included in Formula 1 may be 1, 2, 3, or 4, for example, 1 or 2, but embodiments of the present disclosure are not limited thereto.

In one or more embodiments, in Formula 1, i) n1=n2=n3=0, and n4=1, ii) n1=n2=n4=0, and n3=1, iii) n1=n3=n4=0, and n2=1, iv) n2=n3=n4=0, and n1=1, v) n1=n2=0, and n3=n4=1, vi) n2=n3=0, and n1=n4=1, vii) n2=n4=0, and n1=n3=1, or viii) n1=n3=0, and n2=n4=1, but embodiments of the present disclosure are not limited thereto.

In one or more embodiments, in Formula 1, i) $X_1$ is a chemical bond, and a moiety represented by

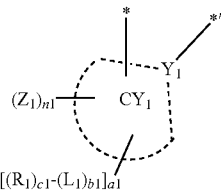

may be a group represented by Formula CY1-B, or ii) $X_1$ may be O, S, N(R'), P(R'), B(R'), C(R')(R"), Si(R')(R"), or N(R')(R"), and a moiety represented by

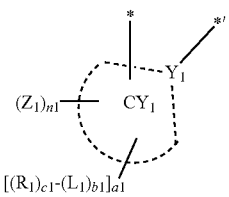

may be a group represented by Formula CY1-A:

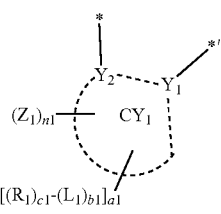

Formual CY1-A

Formula CY1-B

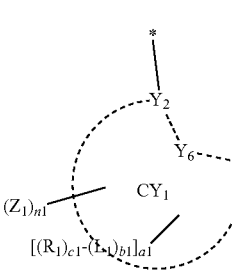

In Formulae CY1-A and CY1-B, $Y_1$, $CY_1$, $L_1$, b1, $R_1$, c1, a1, $Z_1$, and n1 are the same as described above, $Y_2$ and $Y_6$ may each independently be N or C; and a bond between $Y_1$ and $Y_2$, a bond between $Y_1$ and $Y_6$ and a bond between $Y_6$ and $Y_2$ may each be a chemical bond (for example, a single bond, a double bond, or a bond constituting a carbene ligand, or the like).

In one or more embodiments, in Formula 1, a moiety represented by

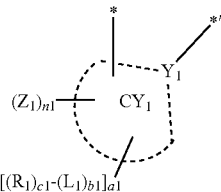

may be a group represented by Formulae CY1-1 to CY1-40:
Formula CY1-1
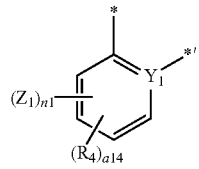
Formula CY1-2
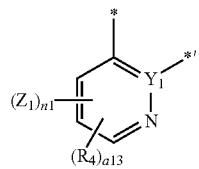
Formula CY1-3
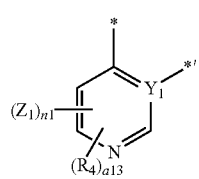
Formula CY1-4
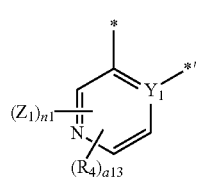
Formula CY1-5
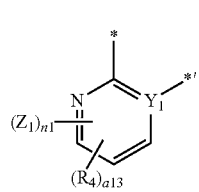
Formula CY1-6
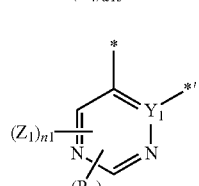
Formula CY1-7
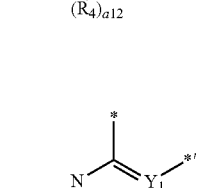
Formula CY1-8
Formula CY1-9
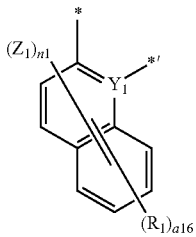
Formula CY1-10
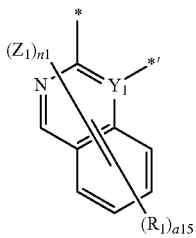
Formula CY1-11
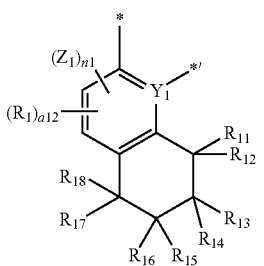
Formula CY1-12
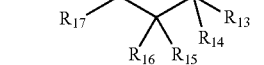
Formula CY1-13
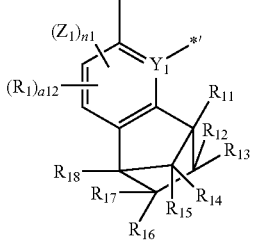
Formula CY1-14
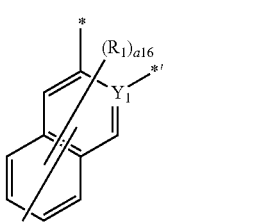
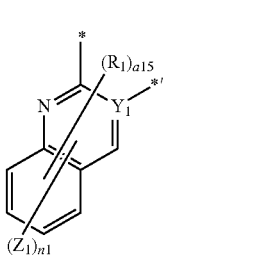

Formula CY1-15
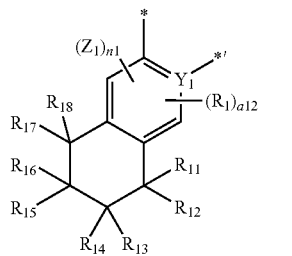
Formula CY1-16
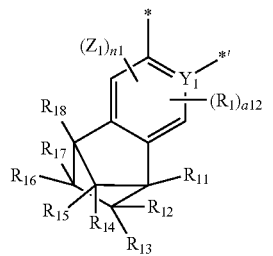
Formula CY1-17
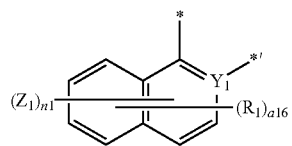
Formula CY1-18
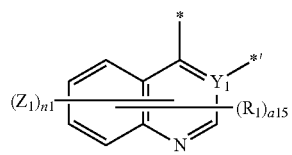
Formula CY1-19
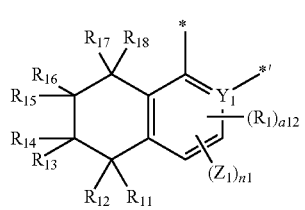
Formula CY1-20
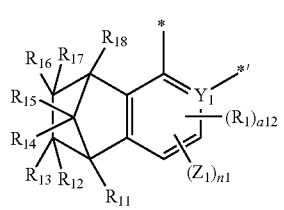
Formula CY1-21
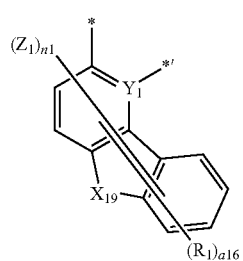
Formula CY1-22
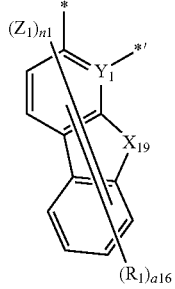
Formula CY1-23
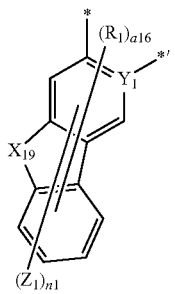
Formula CY1-24
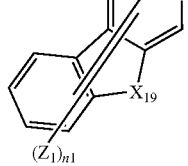
Formula CY1-25
Formula CY1-26
Formula CY1-27

Formula CY1-28

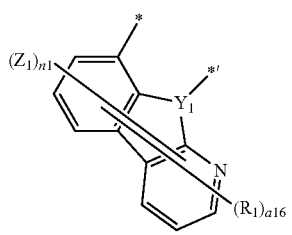

Formula CY1-29

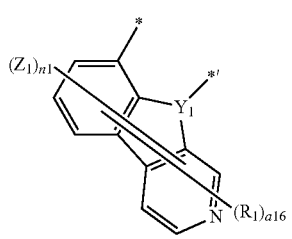

Formula CY1-30

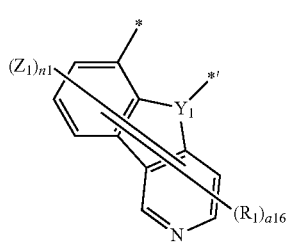

Formula CY1-31

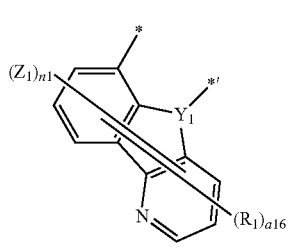

Formula CY1-32

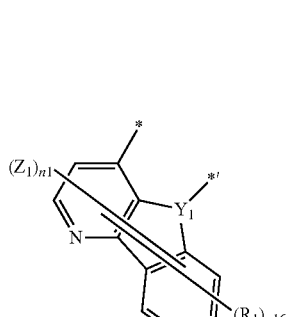

Formula CY1-33

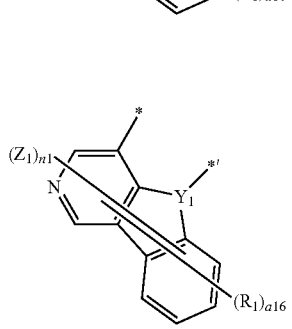

Formula CY1-34

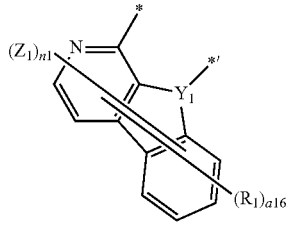

Formula CY1-35

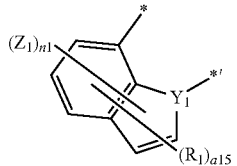

Formula CY1-36

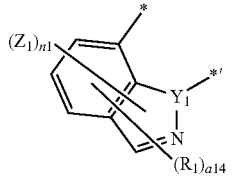

Formula CY1-37

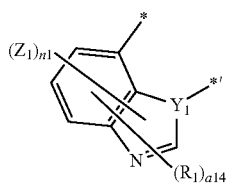

Formula CY1-38

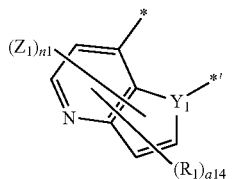

Formula CY1-39

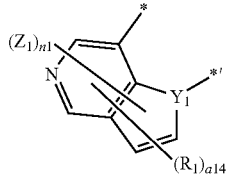

Formula CY1-40

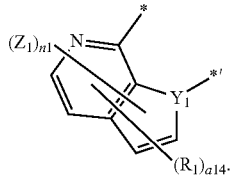

In Formulae CY1-1 to CY1-40, $Y_1$, $R_1$, $Z_1$, and n1 are the same as described above, n1 is 0, 1, or 2, $X_{19}$ is $C(R_{19a})(R_{19b})$, $N[(L_{19})_{b19}\text{-}(R_{19})_{c19}]$, O, S, or $Si(R_{19a})(R_{19b})$, $L_{19}$ may be the same as explained in connection with $L_1$, b19 and c19 are the same as described in connection with b1 and c1, $R_{11}$ to $R_{19}$, $R_{19a}$, and $R_{19b}$ may be the same as described in connection with $R_1$, a12 may be an integer from 0 to 2,
a13 may be an integer from 0 to 3,
a14 may be an integer from 0 to 4,
a15 may be an integer from 0 to 5,
a16 may be an integer from 0 to 6,
a17 may be an integer from 0 to 7,
*' indicates a binding site to M in Formula 1, and
* indicates a binding site to $CY_5$ in Formula 1.

In one or more embodiments, in Formula 1, a moiety represented by

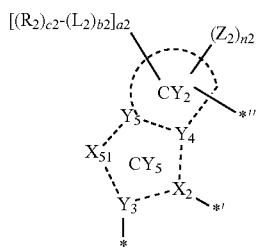

may be a group represented by Formulae CY2-1 to CY2-20:

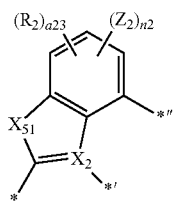

Formula CY2-1

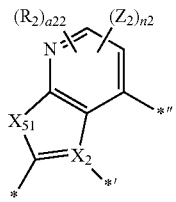

Formula CY2-2

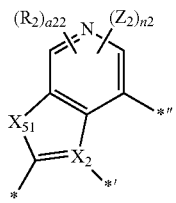

Formula CY2-3

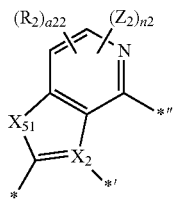

Formula CY2-4

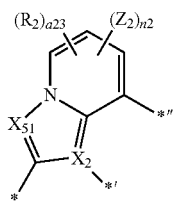

Formula CY2-5

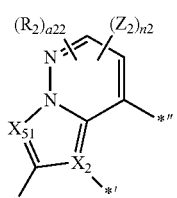

Formula CY2-6

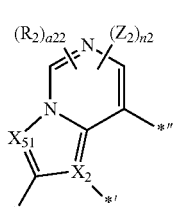

Formula CY2-7

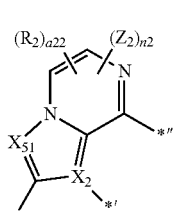

Formula CY2-8

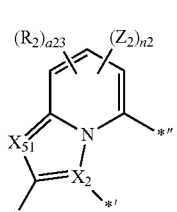

Formula CY2-9

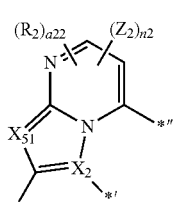

Formula CY2-10

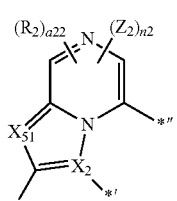

Formula CY2-11

Formula CY2-12

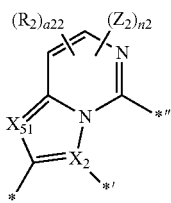

Formula CY2-13

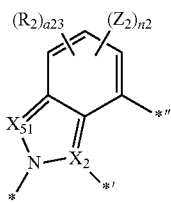

Formula CY2-14

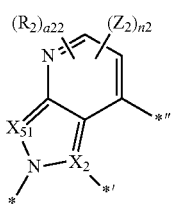

Formula CY2-15

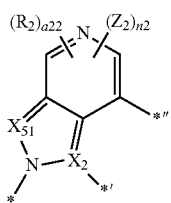

Formula CY2-16

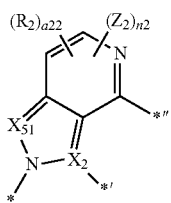

Formula CY2-17

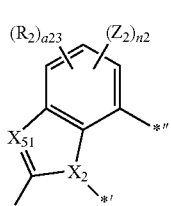

Formula CY2-18

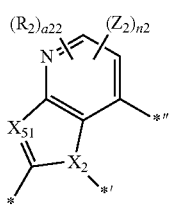

Formula CY2-19

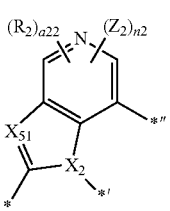

Formula CY2-20

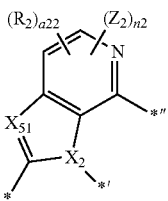

In Formulae CY2-1 to CY2-20, $R_2$, $Z_2$, and n2 may be the same as described above, n2 may be 0, 1, or 2, $X_{51}$ in Formulae CY2-1 to CY2-4 may be O, S, N-$[(L_7)_{b7}$-$(R_7)_{c7}]$, C($R_7$)($R_8$), Si($R_7$)($R_8$), Ge($R_7$)($R_8$), or C(=O), $X_{51}$ in Formulae CY2-5 to CY2-20 may be N, C($R_7$), Si($R_7$), or Ge($R_7$), $L_7$, b7, $R_7$, and c7 may be the same as described above, a22 may be an integer from 0 to 2, a23 may be an integer from 0 to 3,

*indicates a binding site to $CY_1$ in Formula 1,

*' indicates a binding site to M in Formula 1, and

*'' indicates a binding site to $CY_3$ in Formula 1.

In one or more embodiments, in Formula 1, a moiety represented by

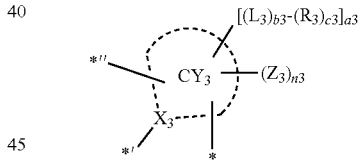

may be a group represented by one of Formulae CY3-1 to CY3-12:

Formula CY3-1

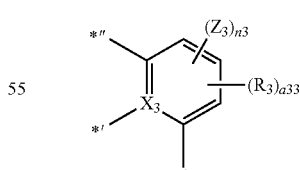

Formula CY3-2

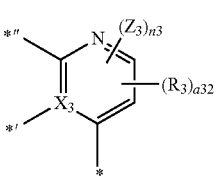

-continued

Formula CY3-3

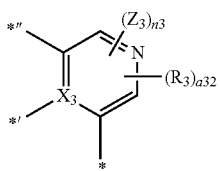

Formula CY3-4

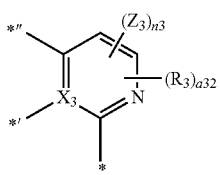

Formula CY3-5

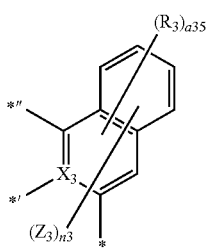

Formula CY3-6

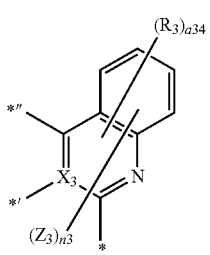

Formula CY3-7

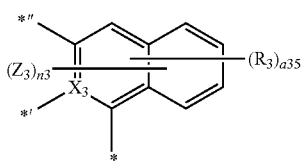

Formula CY3-8

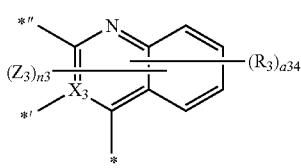

Formula CY3-9

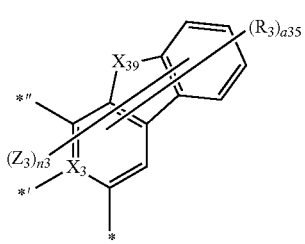

Formula CY3-10

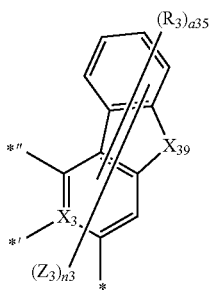

Formula CY3-11

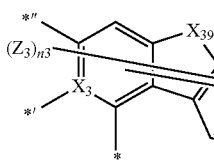

Formula CY3-12

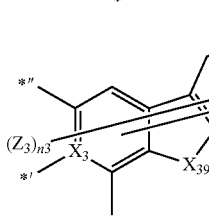

In Formulae CY3-1 to CY3-12, $X_3$, $R_3$, $Z_3$, and n3 may be the same as described above, n3 is 0, 1, or 2, $X_{39}$ may be $C(R_{39a})(R_{39b})$, $N[(L_{39})_{b39}$-$(R_{39})_{c39}]$, O, S, or $Si(R_{39a})(R_{39b})$, $L_{39}$ may be the same as explained in connection with $L_3$;

b39 and c39 may be the same as described in connection with b3 and c3, $R_{39a}$ and $R_{39b}$ may be the same as described in connection with $R_3$, a32 may be an integer from 0 to 2, a33 may be an integer from 0 to 3, a34 may be an integer from 0 to 4, a35 may be an integer from 0 to 5,

* indicates a binding site to $CY_4$ in Formula 1,

*' indicates a binding site to M in Formula 1, and

*" indicates a binding site to $CY_2$ in Formula 1.

In one or more embodiments, in Formula 1, a moiety represented by

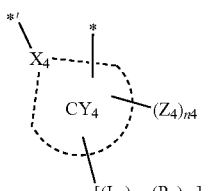

may be a group represented by one of Formulae CY4-1 to CY4-26:

Formula CY4-1
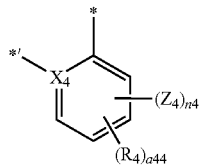
Formula CY4-2
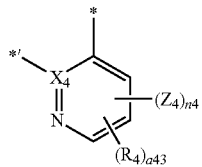
Formula CY4-3
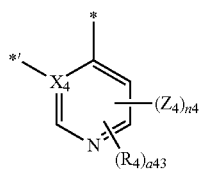
Formula CY4-4
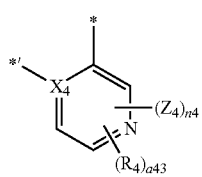
Formula CY4-5
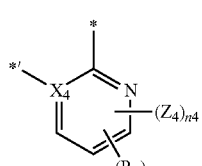
Formula CY4-6
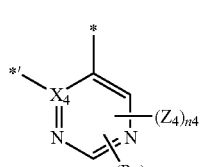
Formula CY4-7
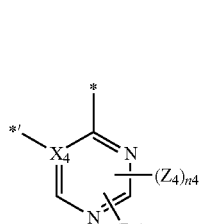
Formula CY4-8
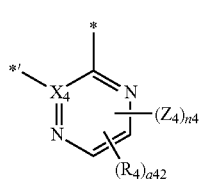
Formula CY4-9
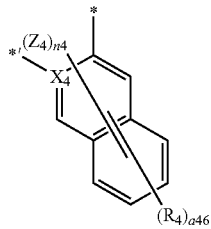
Formula CY4-10
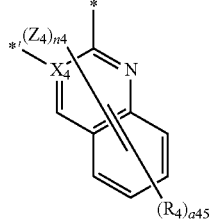
Formula CY4-11
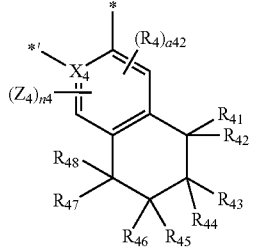
Formula CY4-12
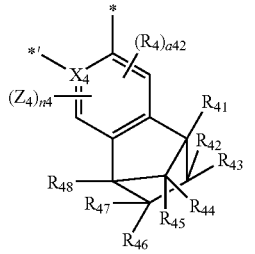
Formula CY4-13
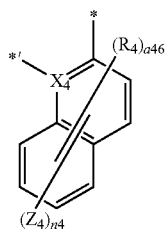
Formula CY4-14
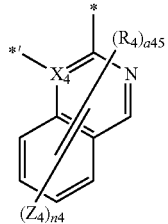

Formula CY4-15

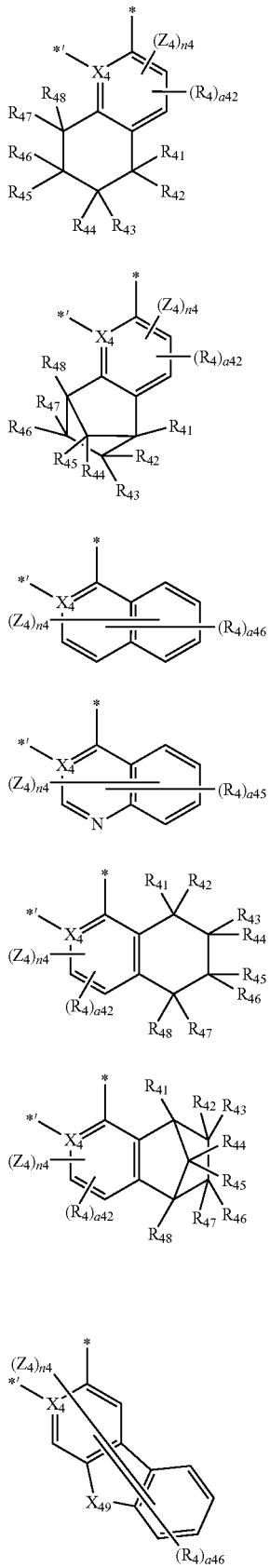

Formula CY4-16

Formula CY4-17

Formula CY4-18

Formula CY4-19

Formula CY4-20

Formula CY4-21

Formula CY4-22

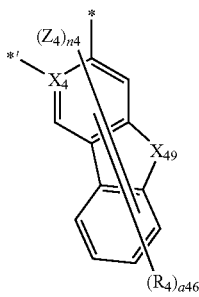

Formula CY4-23

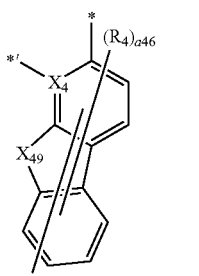

Formula CY4-24

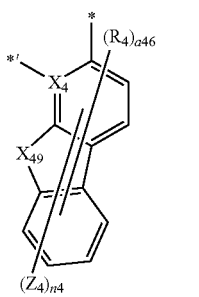

Formula CY4-25

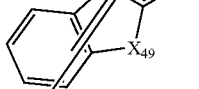

Formula CY4-26

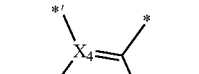

In Formulae CY4-1 to CY4-26, $X_4$, $R_4$, $Z_4$, and n4 may be the same as described above, n4 may be 0, 1, or 2, $X_{49}$ may be $C(R_{49a})(R_{49b})$, $N[(L_{49})_{b49}\text{-}(R_{49})_{c49}]$, O, S, or $Si(R_{49a})(R_{49b})$, $L_{49}$ may be the same as explained in connection with $L_4$;

b49 and c49 may be the same as described in connection with b4 and c4, $R_{41}$ to $R_{49}$, $R_{49a}$, and $R_{49b}$ may be the same as described in connection with $R_4$, a42 may be an integer from 0 to 2,
a43 may be an integer from 0 to 3,
a44 may be an integer from 0 to 4,
a45 may be an integer from 0 to 5,
a46 may be an integer from 0 to 6,
* indicates a binding site to $CY_3$ in Formula 1, and
*' indicates a binding site to M in Formula 1.

In one or more embodiments, regarding Formula 1, a moiety represented by

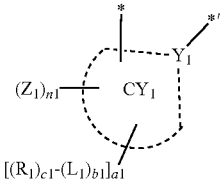

may be a group represented by Formulae CY1(1) to CY1(18) and CY1-CN(1) to CY1-CN(12), and(or) a moiety represented by

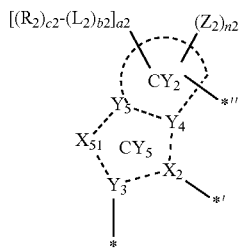

may be a group represented by Formulae CY2(1) to CY2(20) and CY2-CN(1) to CY2-CN(15), and(or) a moiety represented by

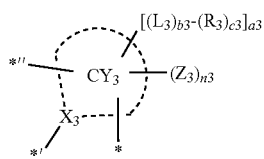

may be a group represented by Formulae CY3(1) to CY3(12) and CY3-CN(1) to CY3-CN(8), and(or) a moiety represented by

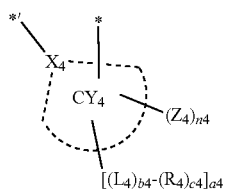

may be a group represented by Formulae CY4(1) to CY4(10) and CY4-CN(1) to CY4-CN(12), but embodiments of the present disclosure are not limited thereto:

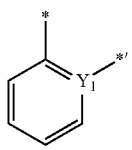

Formula CY1(1)

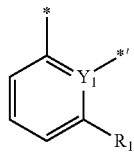

Formula CY1(2)

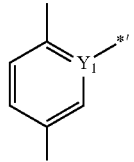

Formula CY1(3)

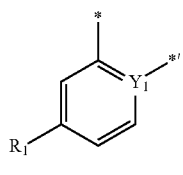

Formula CY1(4)

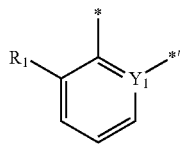

Formula CY1(5)

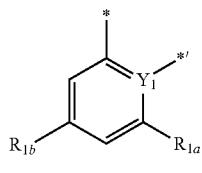

Formula CY1(6)

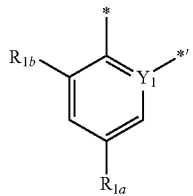

Formula CY1(7)

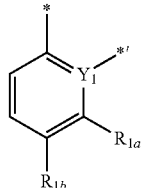

Formula CY1(8)

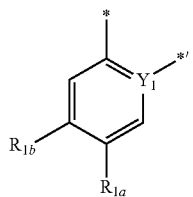

Formula CY1(9)

-continued
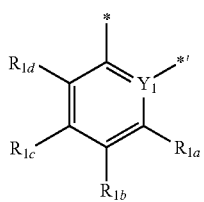
Formula CY1(10)
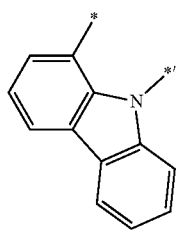
Formula CY1(11)
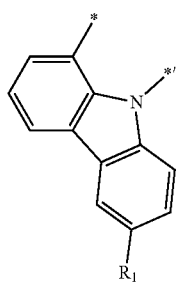
Formula CY1(12)
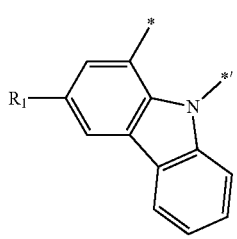
Formula CY1(13)
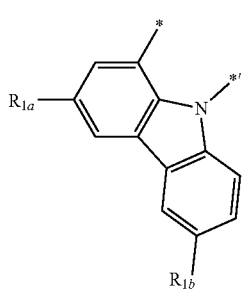
Formula CY1(14)
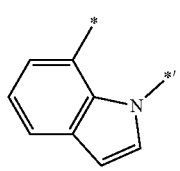
Formula CY1(15)
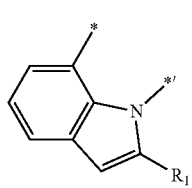
Formula CY1(16)
-continued
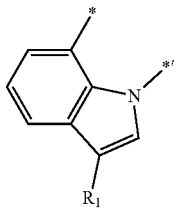
Formula CY1(17)
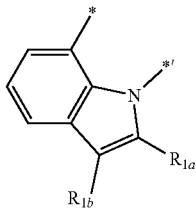
Formula CY1(18)
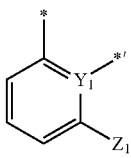
Formula CY1-CN(1)
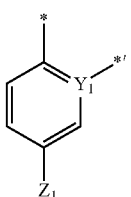
Formula CY1-CN(2)
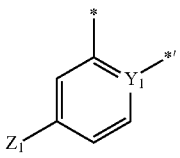
Formula CY1-CN(3)
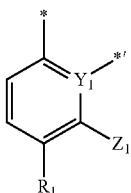
Formula CY1-CN(4)
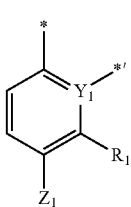
Formula CY1-CN(5)
Formula CY1-CN(6)

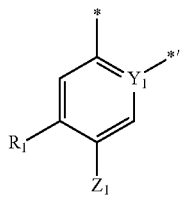
Formula CY1-CN(7)
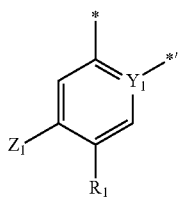
Formula CY1-CN(8)
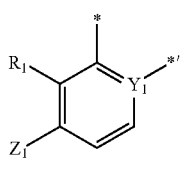
Formula CY1-CN(9)
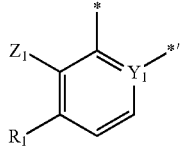
Formula CY1-CN(10)
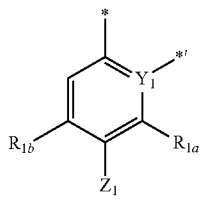
Formula CY1-CN(11)
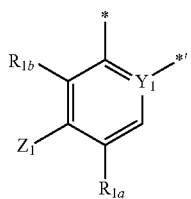
Formula CY1-CN(12)
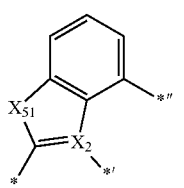
Formula CY2(1)
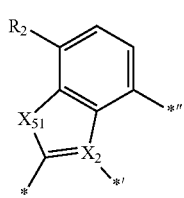
Formula CY2(2)
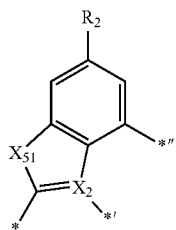
Formula CY2(3)
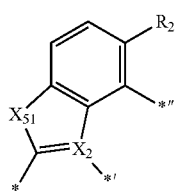
Formula CY2(4)
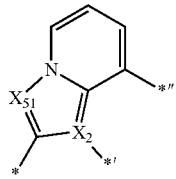
Formula CY2(5)
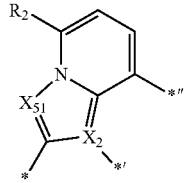
Formula CY2(6)
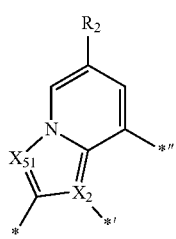
Formula CY2(7)
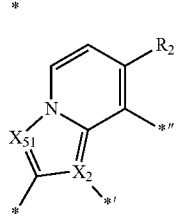
Formula CY2(8)
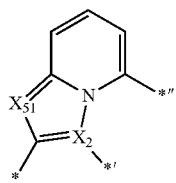
Formula CY2(9)
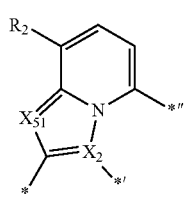
Formula CY2(10)

Formula CY2(11)
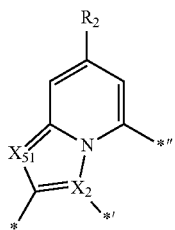
Formula CY2(12)
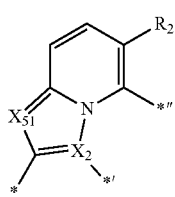
Formula CY2(13)
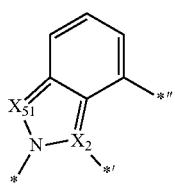
Formula CY2(14)
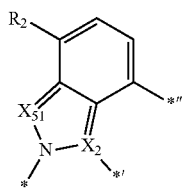
Formula CY2(15)
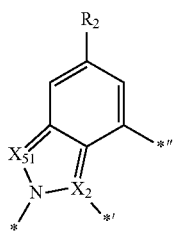
Formula CY2(16)
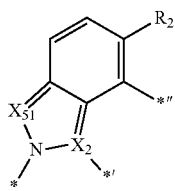
Formula CY2(17)
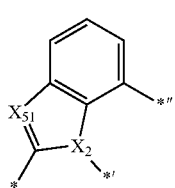
Formula CY2(18)
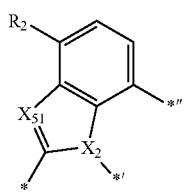
Formula CY2(19)
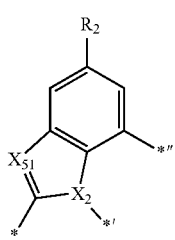
Formula CY2(20)
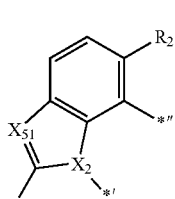
Formula CY2-CN(1)
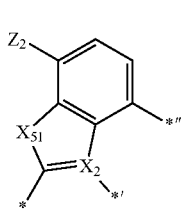
Formula CY2-CN(2)
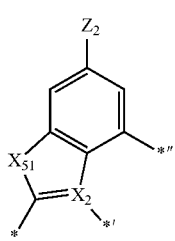
Formula CY2-CN(3)
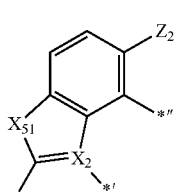
Formula CY2-CN(4)
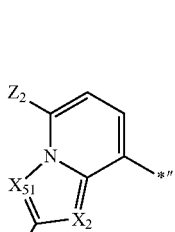
Formula CY2-CN(5)
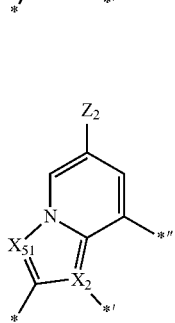

Formula CY2-CN(6)
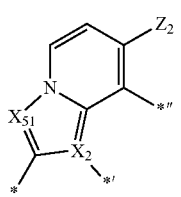
Formula CY2-CN(7)
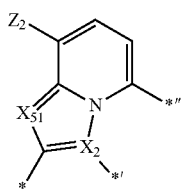
Formula CY2-CN(8)
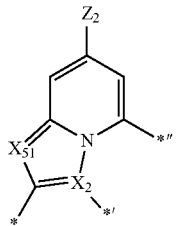
Formula CY2-CN(9)
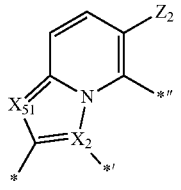
Formula CY2-CN(10)
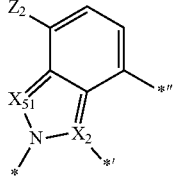
Formula CY2-CN(11)
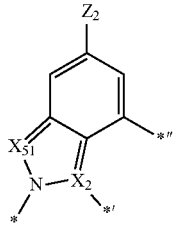
Formula CY2-CN(12)
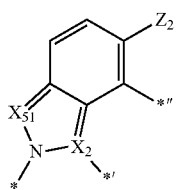
Formula CY2-CN(13)
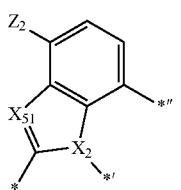
Formula CY2-CN(14)
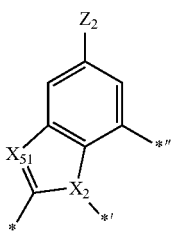
Formula CY2-CN(15)
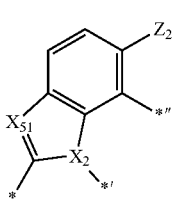
Formula CY3(1)
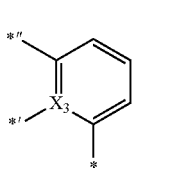
Formula CY3(2)
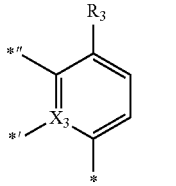
Formula CY3(3)
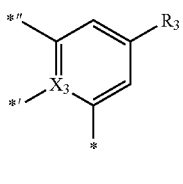
Formula CY3(4)
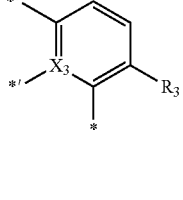
Formula CY3(5)
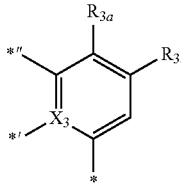
Formula CY3(6)
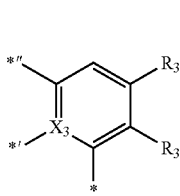

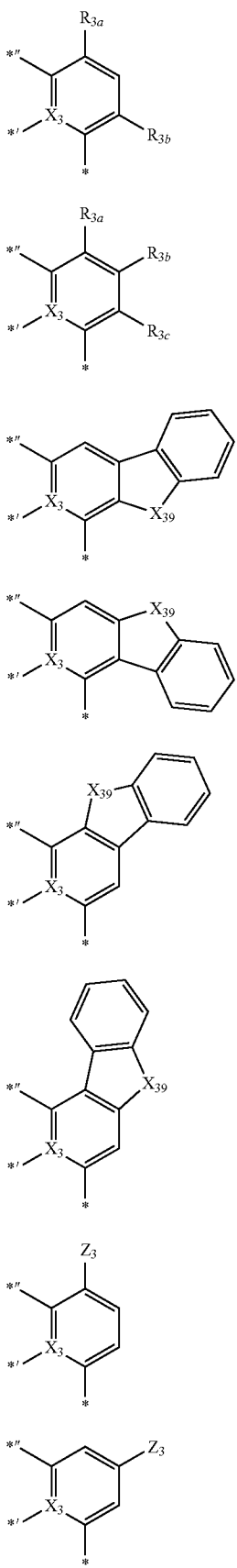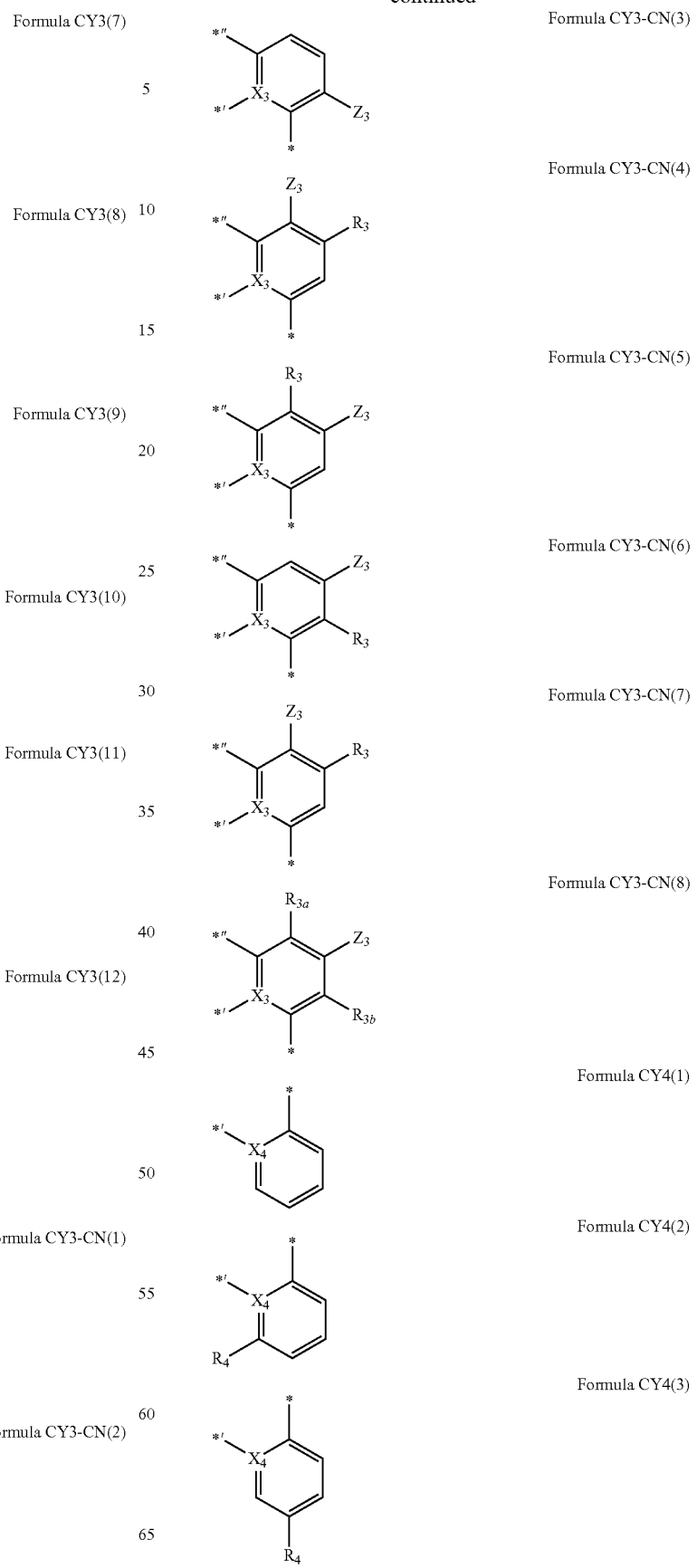

Formula CY4(4)
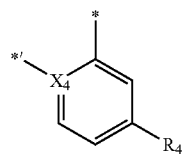
Formula CY4(5)
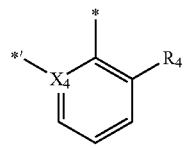
Formula CY4(6)
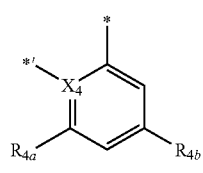
Formula CY4(7)
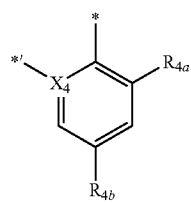
Formula CY4(8)
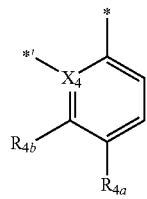
Formula CY4(9)
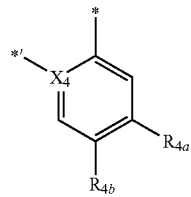
Formula CY4(10)
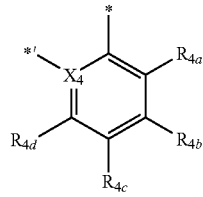
Formula CY4-CN(1)
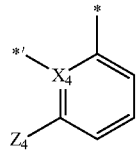
Formula CY4-CN(2)
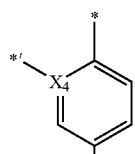
Formula CY4-CN(3)
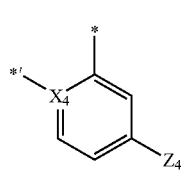
Formula CY4-CN(4)
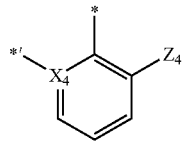
Formula CY4-CN(5)
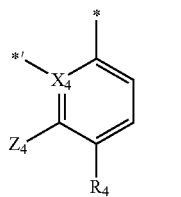
Formula CY4-CN(6)
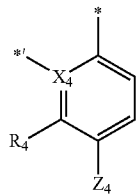
Formula CY4-CN(7)
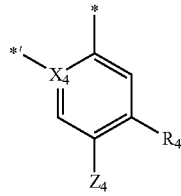
Formula CY4-CN(8)
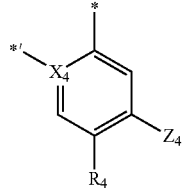
Formula CY4-CN(9)
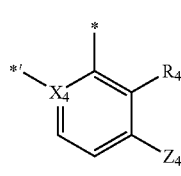

-continued

Formula CY4-CN(10)

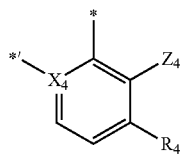

Formula CY4-CN(11)

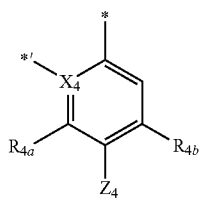

Formula CY4-CN(12)

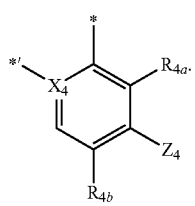

In Formulae CY1(1) to CY1(18), CY1-CN(1) to CY1-CN(12), CY2(1) to CY2(20), CY2-CN(1) to CY2-CN(15), CY3(1) to CY3(12), CY3-CN(1) to CY3-CN(8), CY4(1) to CY4(10), and CY4-CN(1) to CY4-CN(12), $X_2$ to $X_4$, $Y_1$, $R_1$ to $R_4$, and $Z_1$ to $Z_4$ may be the same as described above, $R_{1a}$ to $R_{1d}$ may be the same as described in connection with $R_1$, $X_{39}$ may be $C(R_{39a})(R_{39b})$, $N[(L_{39})_{b39}$-$(R_{39})_{c39}]$, O, S, or $Si(R_{39a})(R_{39b})$, $L_{39}$ may be the same as explained in connection with $L_3$;

b39 and c39 may be the same as described in connection with b3 and c3, $R_{3a}$, $R_{3b}$, $R_{39a}$, and $R_{39b}$ may be the same as described in connection with $R_3$, $R_{4a}$ to $R_{4d}$ may be the same as described in connection with $R_4$, $R_1$ to $R_4$, $R_{1a}$ to $R_{1d}$, $R_{3a}$, $R_{3b}$, and $R_{4a}$ to $R_{4d}$ may each not be hydrogen,

*' indicates a binding site to M in Formula 1,

*' in Formulae CY1(1) to CY1(18) and CY1-CN(1) to CY1-CN(12) indicates a binding site to $CY_5$ in Formula 1,

* in Formulae CY2(1) to CY2(20) and CY2-CN(1) to CY2-CN(15) indicates a binding site to $CY_1$ in Formula 1,

*''' in Formulae CY2(1) to CY2(20) and CY2-CN(1) to CY2-CN(15) indicates a binding site to $CY_3$ in Formula 1,

*''' in Formulae CY3(1) to CY3(12) and CY3-CN(1) to CY3-CN(8) indicates a binding site to $CY_2$ in Formula 1,

* in Formulae CY3(1) to CY3(12) and CY3-CN(1) to CY3-CN(8) indicates a binding site to $CY_4$ in Formula 1, and

* in Formulae CY4(1) to CY4(10) and CY4-CN(1) to CY4-CN(12) indicates a binding site to $CY_3$ in Formula 1.

For example, the organometallic compound may be one of Compounds 1 to 190, but embodiments of the present disclosure are not limited thereto:

1

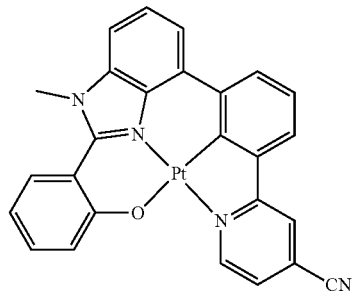

2

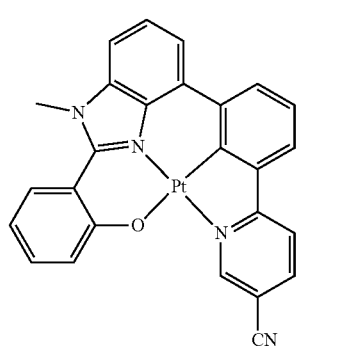

3

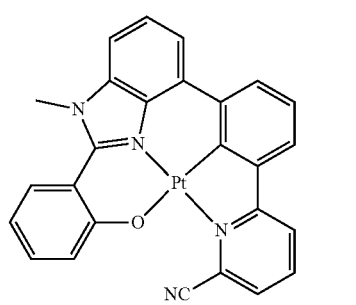

4

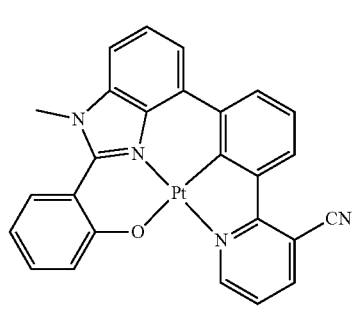

5

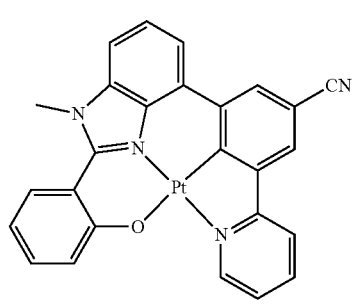

-continued
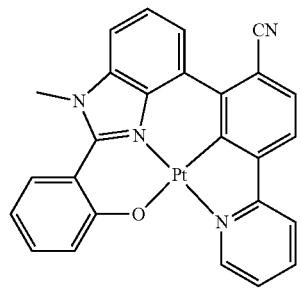
6
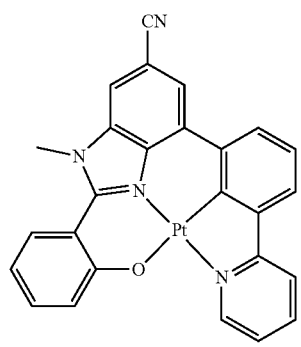
7
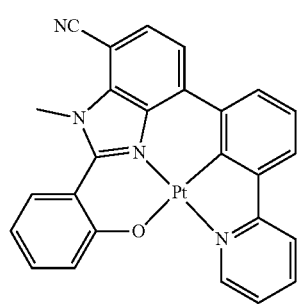
8
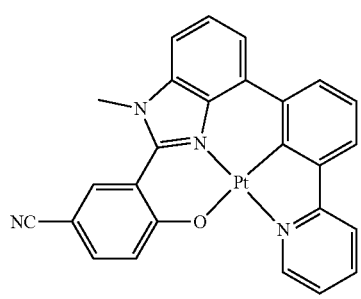
9
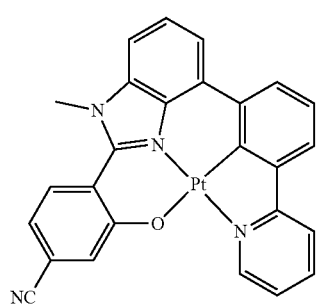
10
-continued
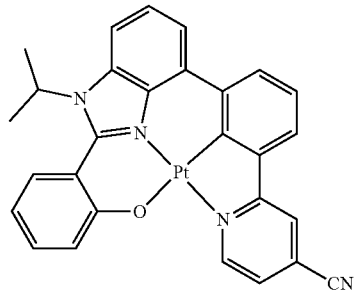
11
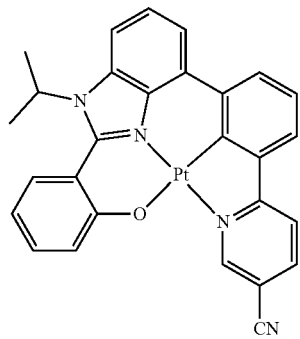
12
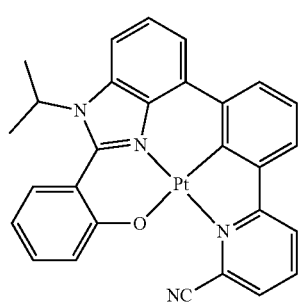
13
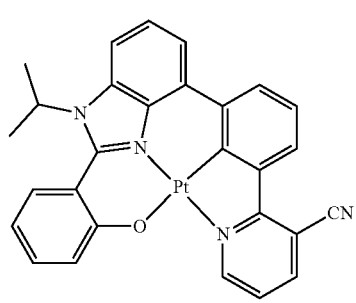
14
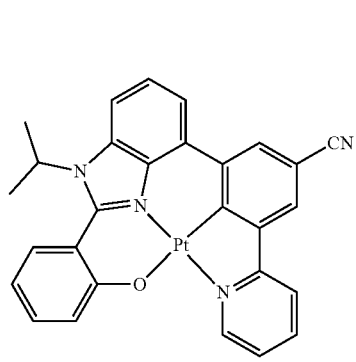
15

16
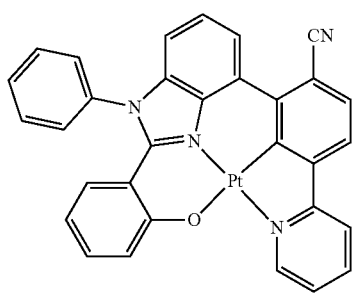
17
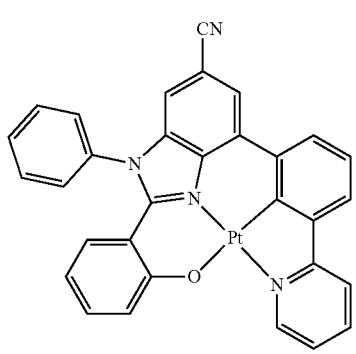
18
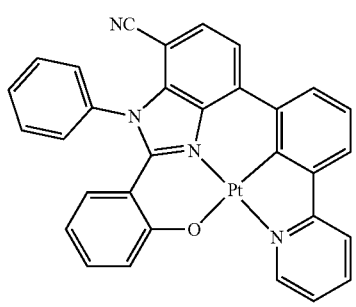
19
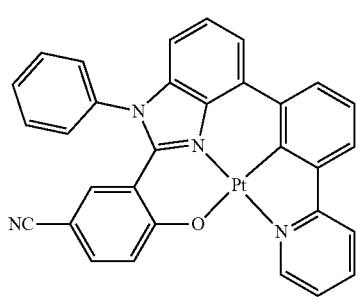
20
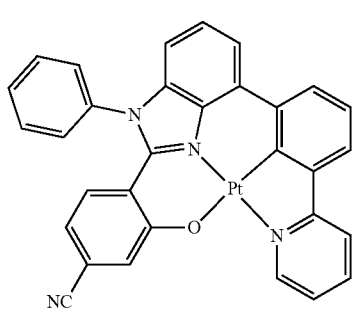
21
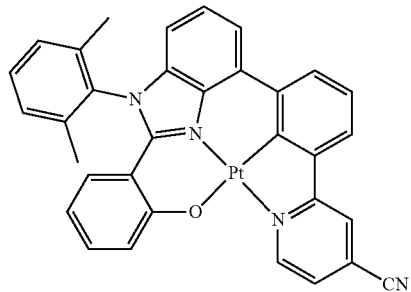
22
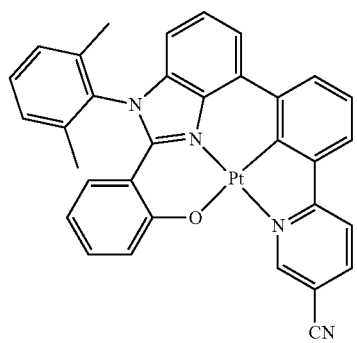
23
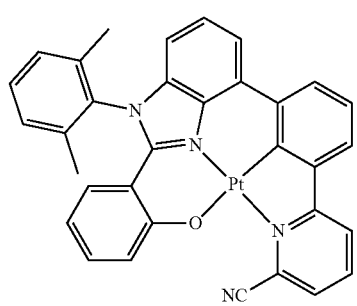
24
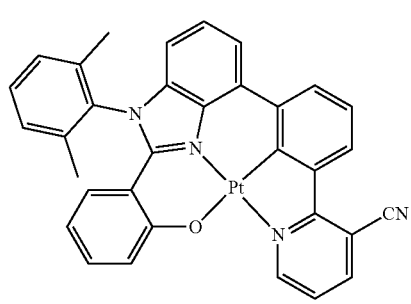
25
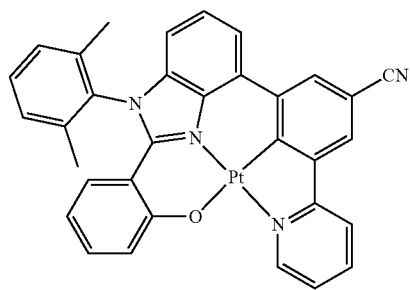

26
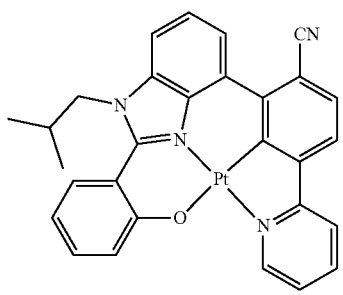
27
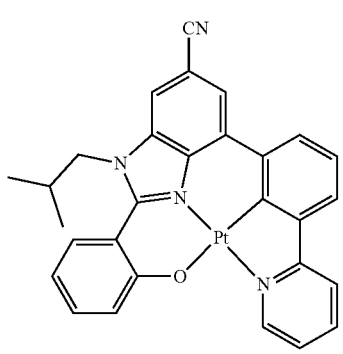
28
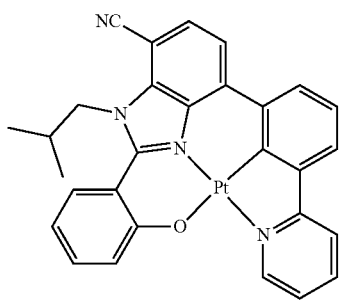
29
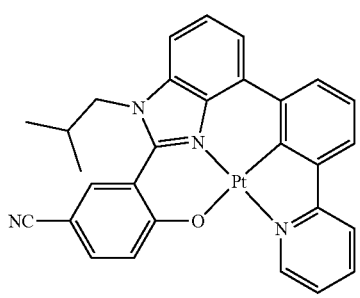
30
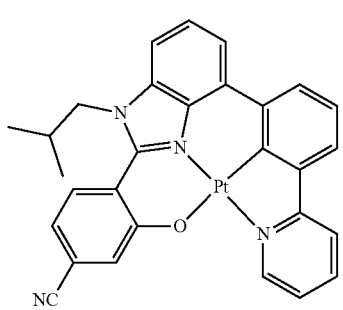
31
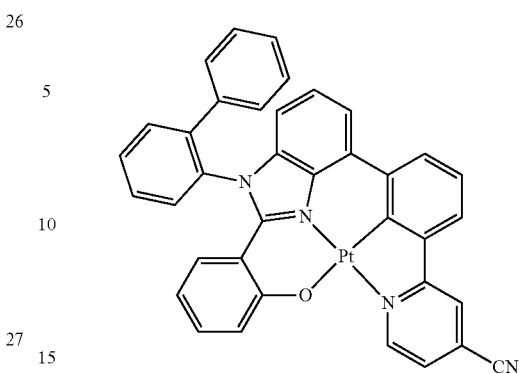
32
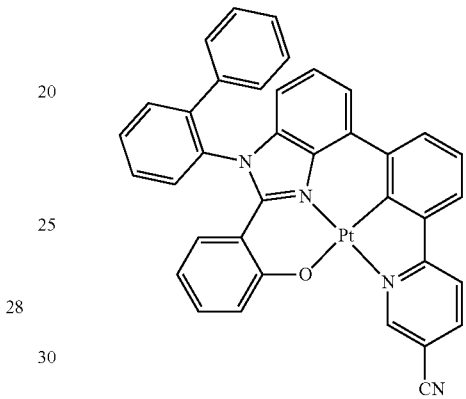
33
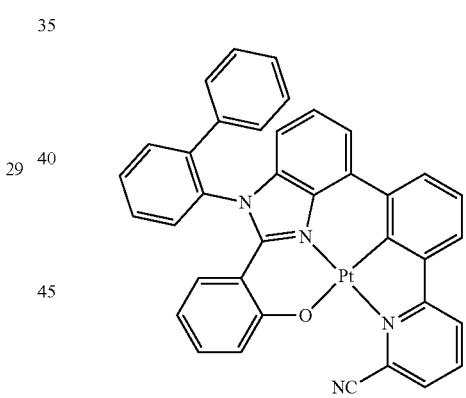
34
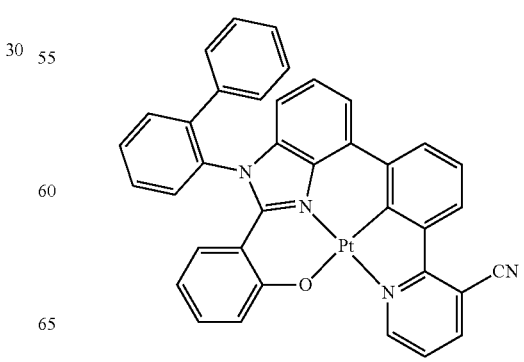

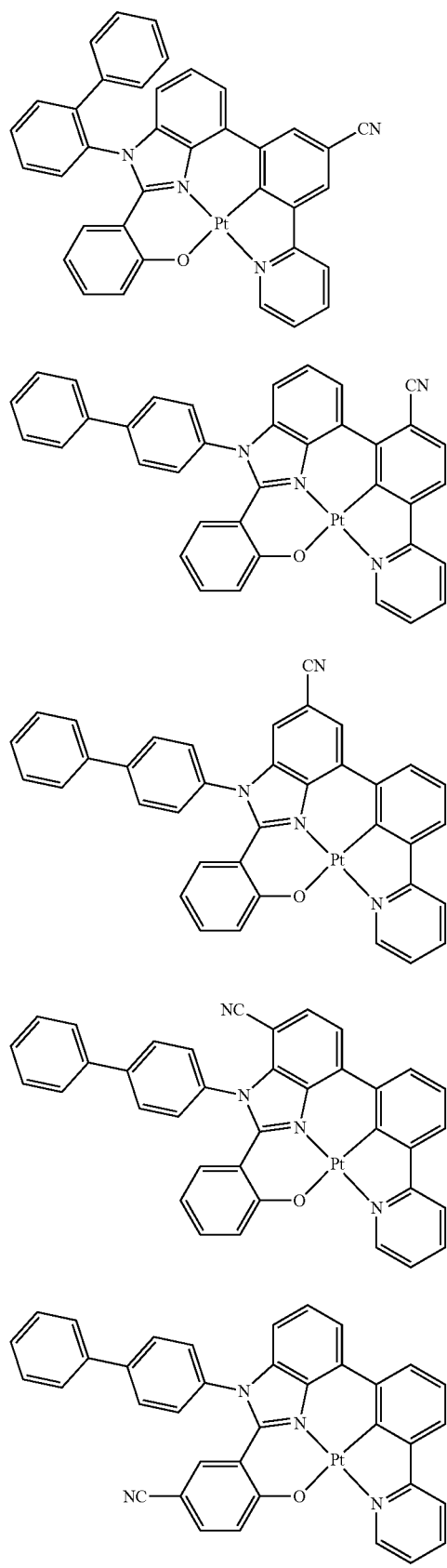
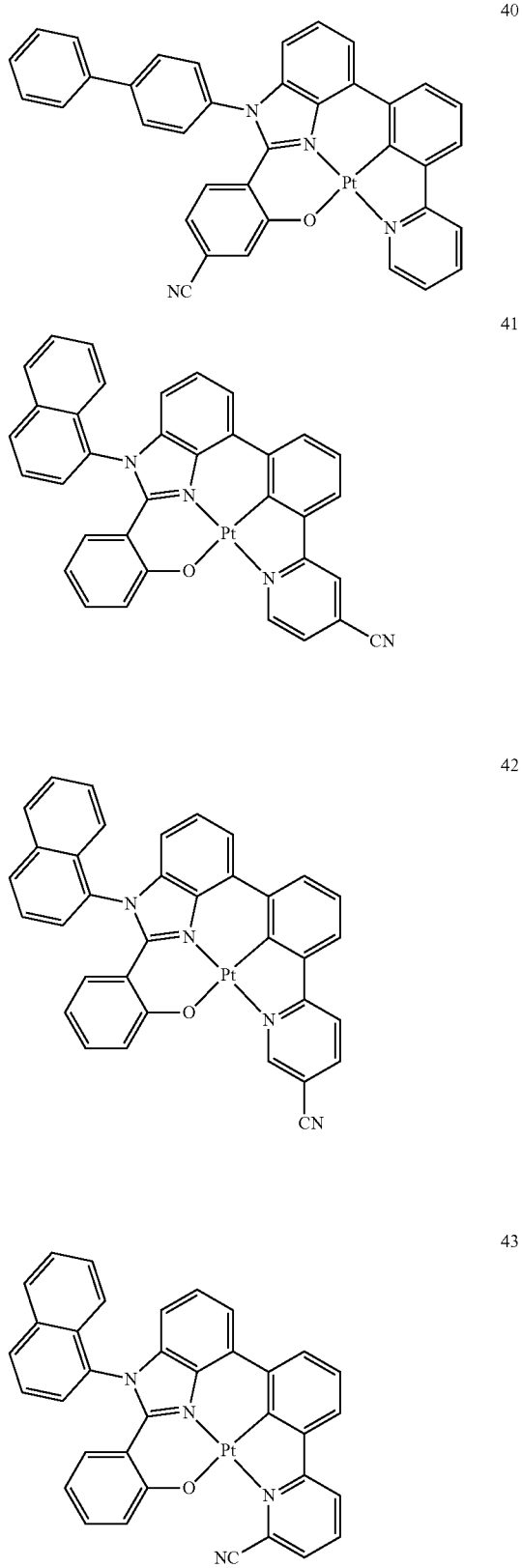

44
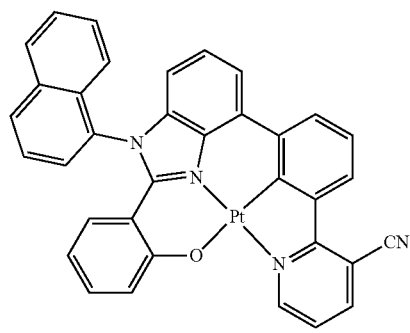
45
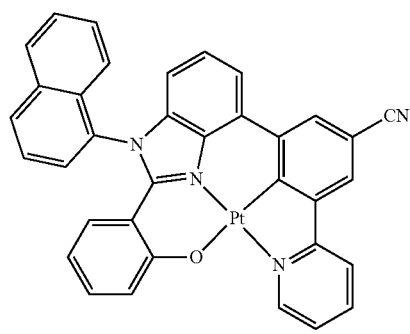
46
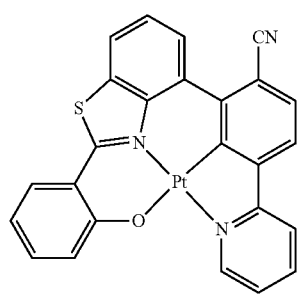
47
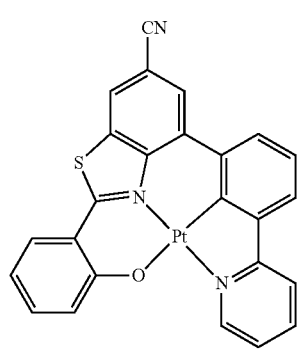
48
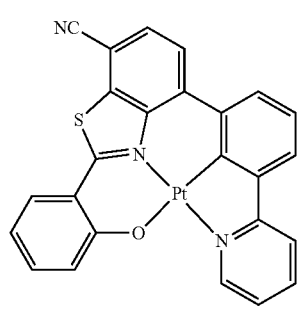
49
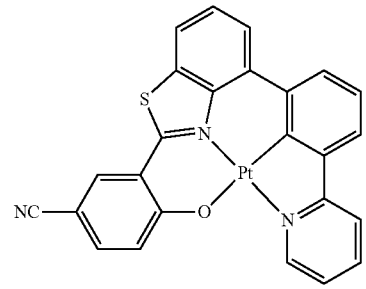
50
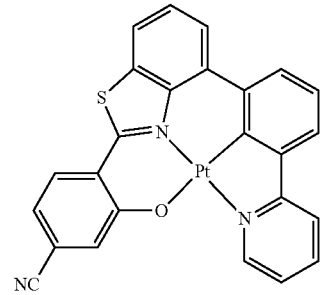
51
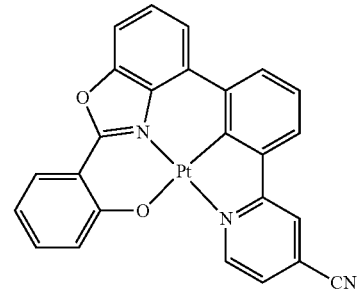
52
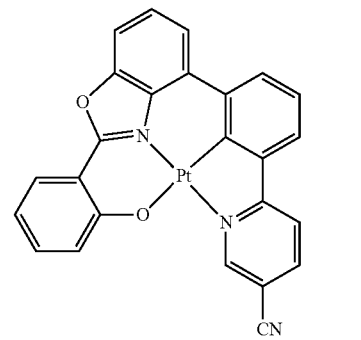
53
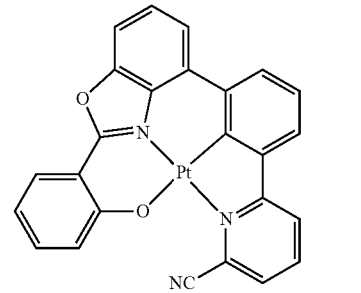

54
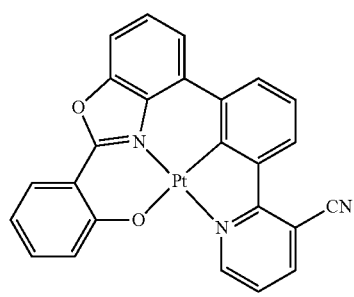
55
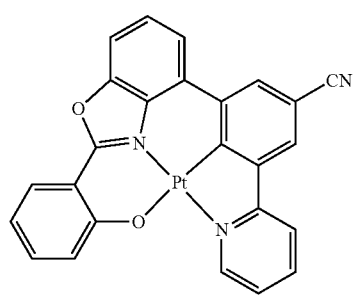
56
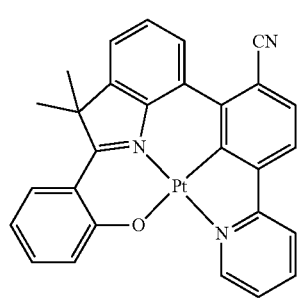
57
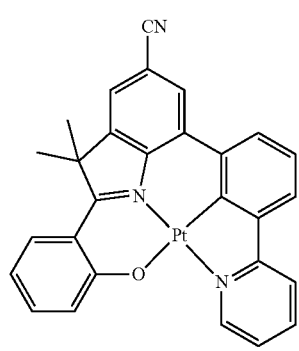
58
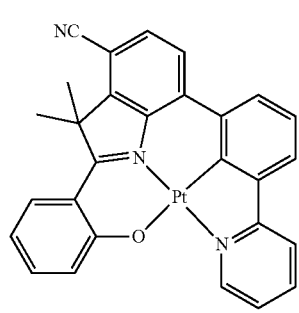
59
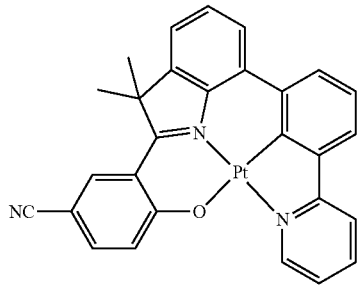
60
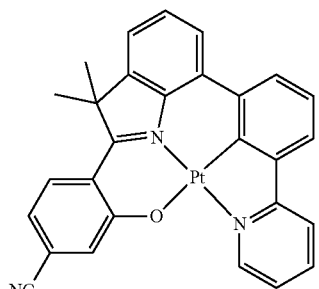
61
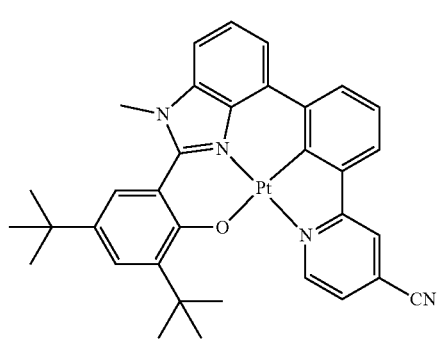
62
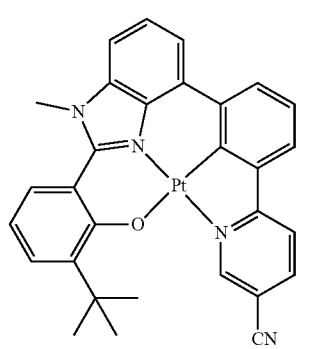
63
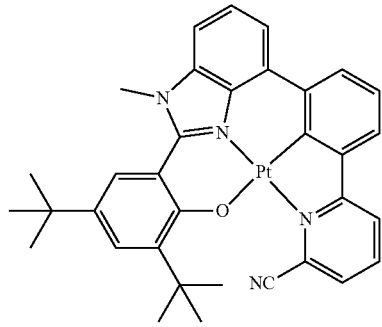

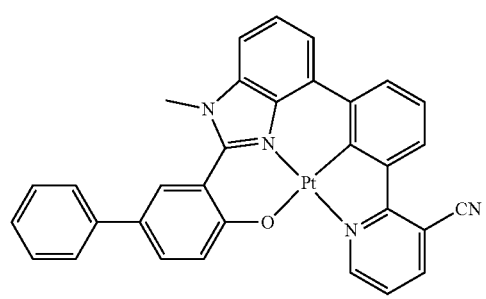
64
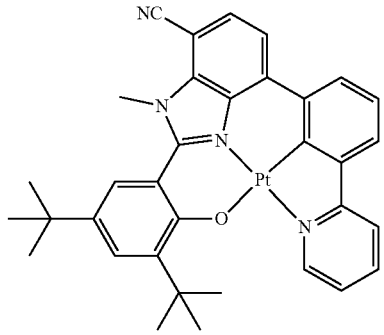
68
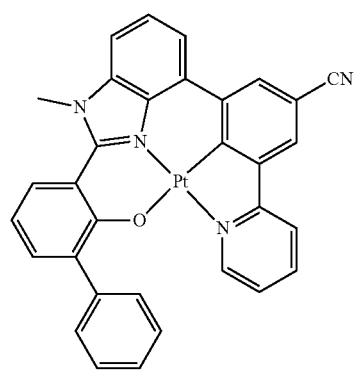
65
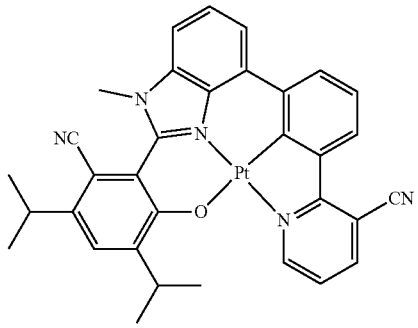
69
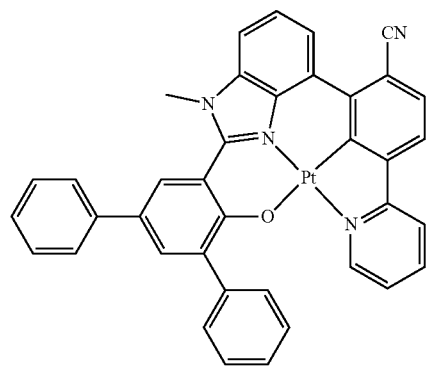
66
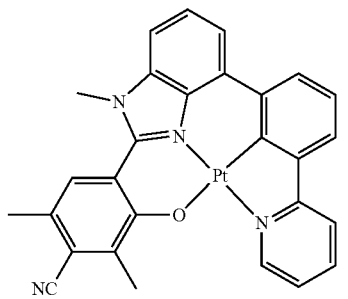
70
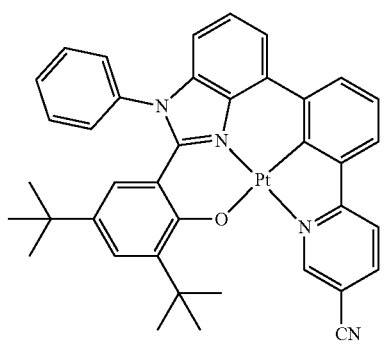
71
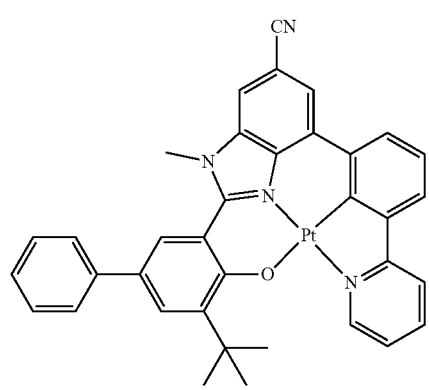
67
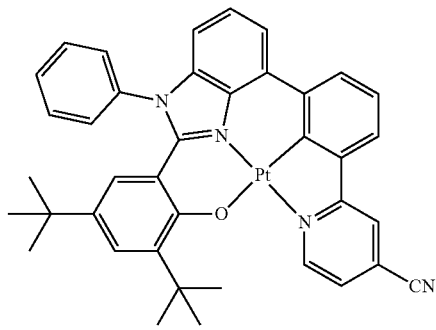
72

-continued
73
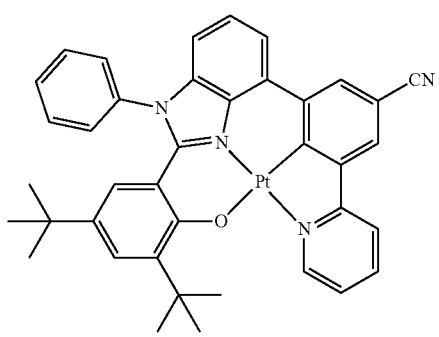
74
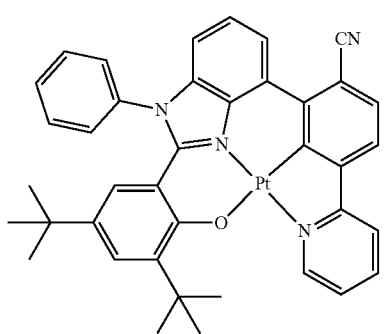
75
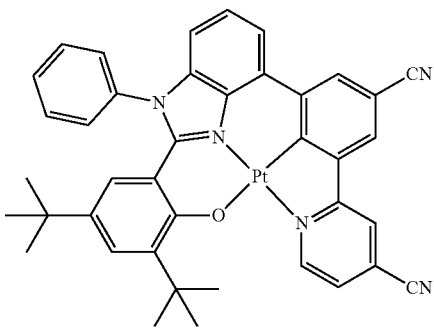
76
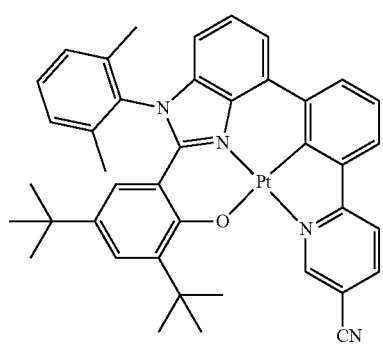
-continued
77
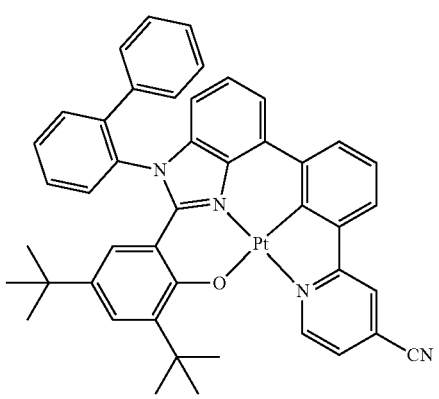
78
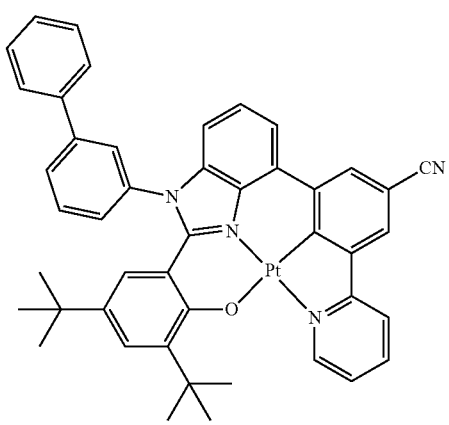
79
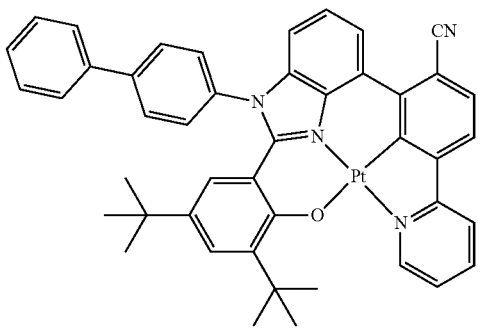
80
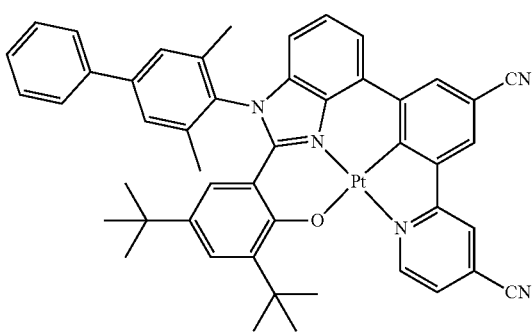

81
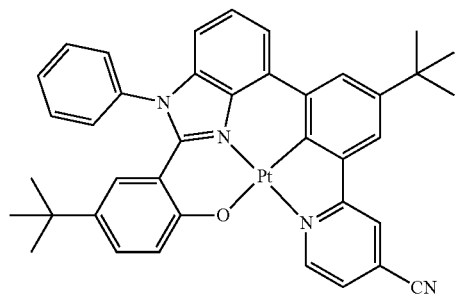
82
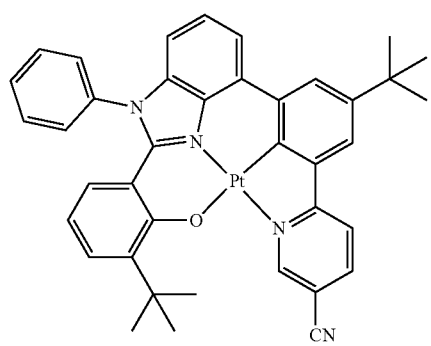
83
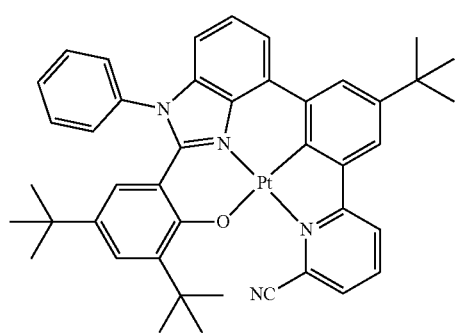
84
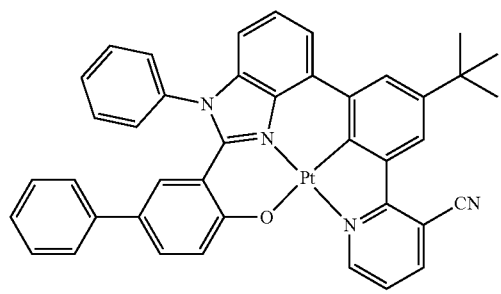
85
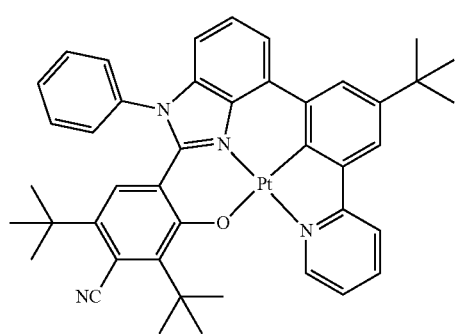
86
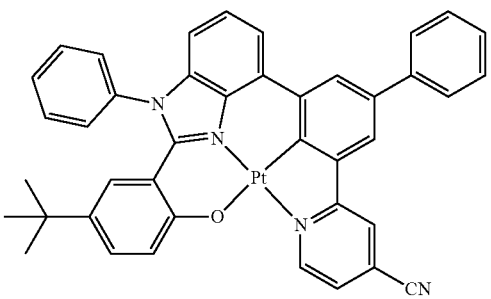
87
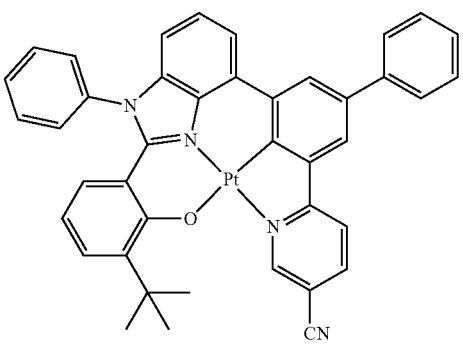
88
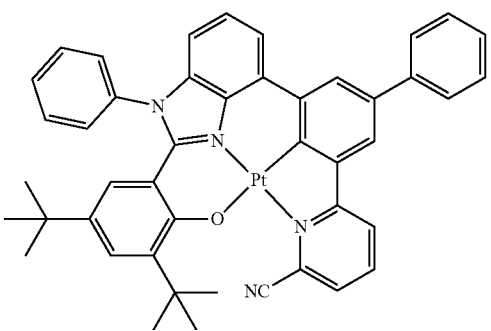
89
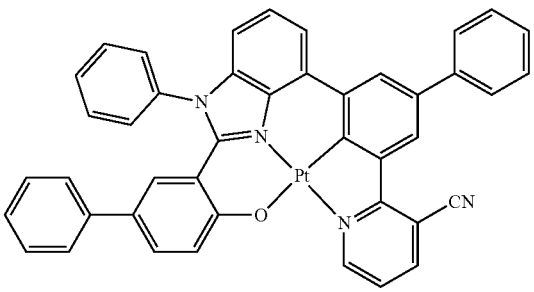
90
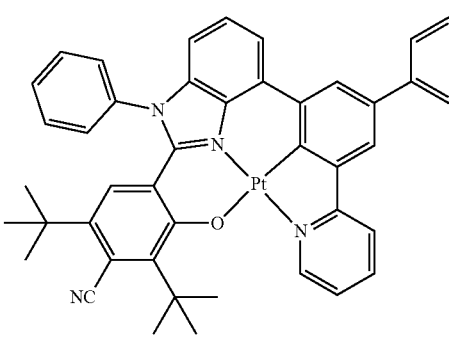

-continued
91
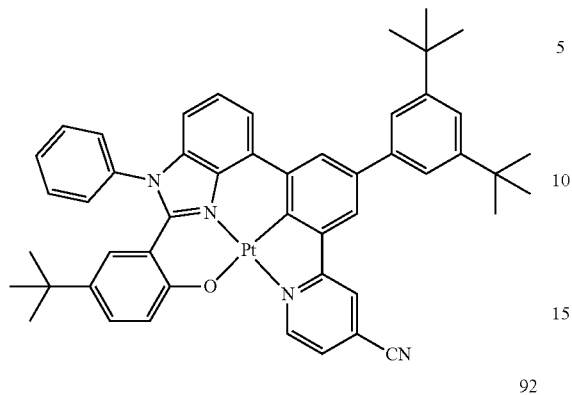
92
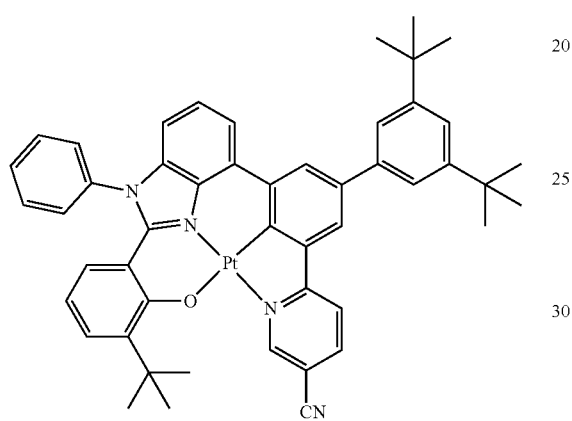
93
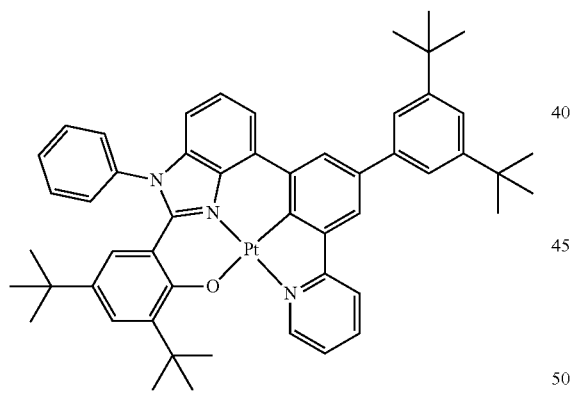
94
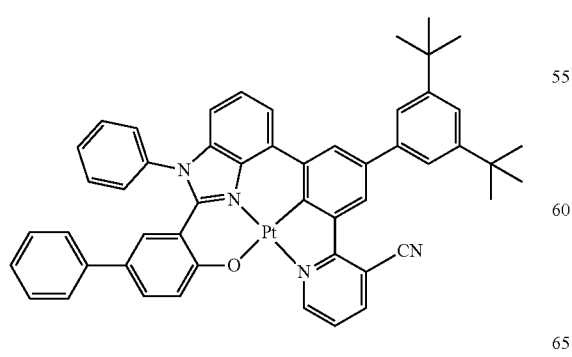
-continued
95
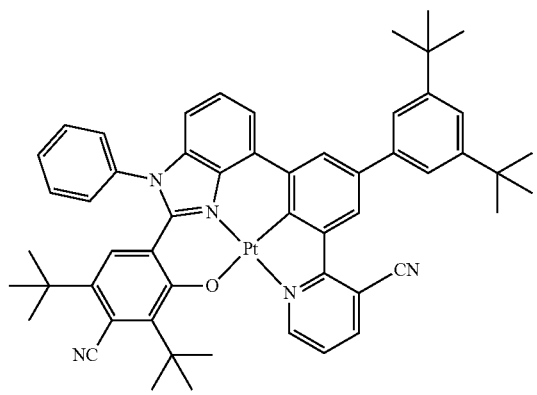
96
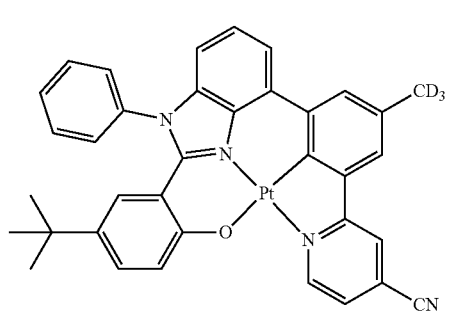
97
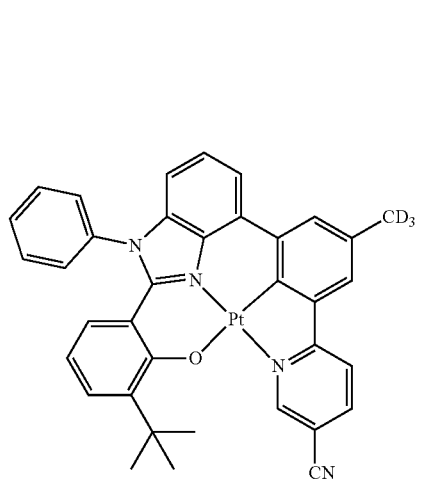
98
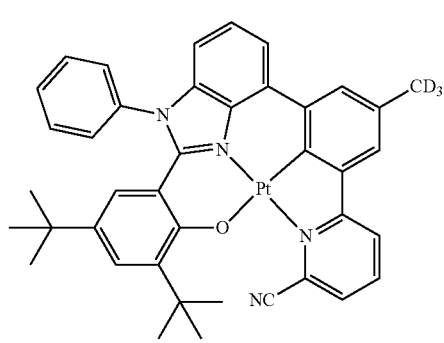

99
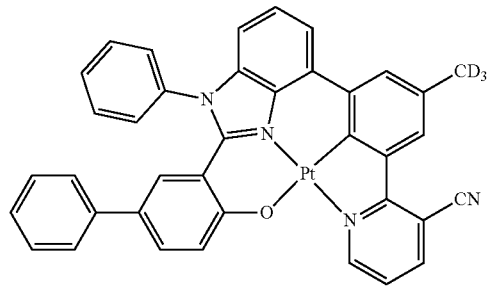
100
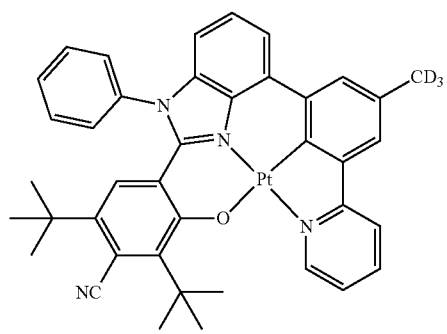
101
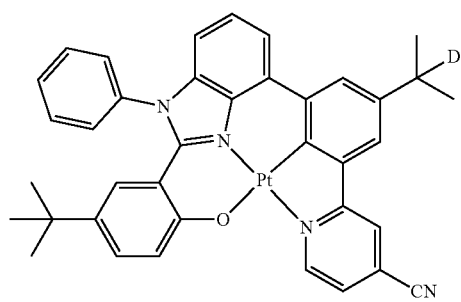
102
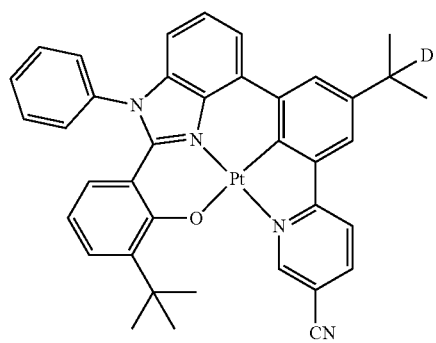
103
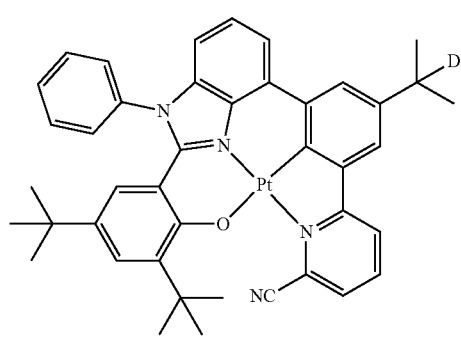
104
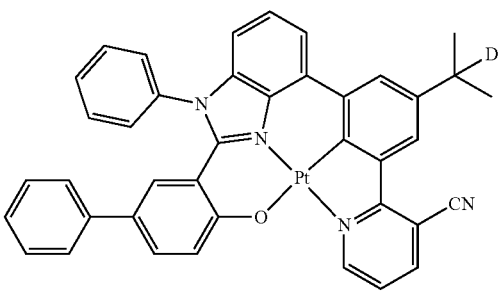
105
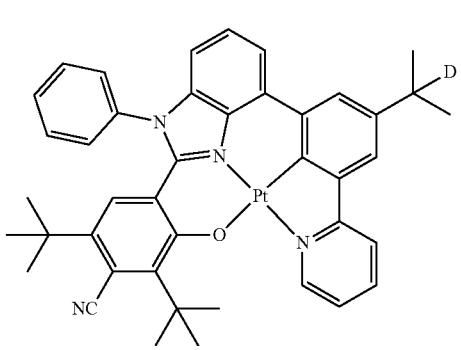
106
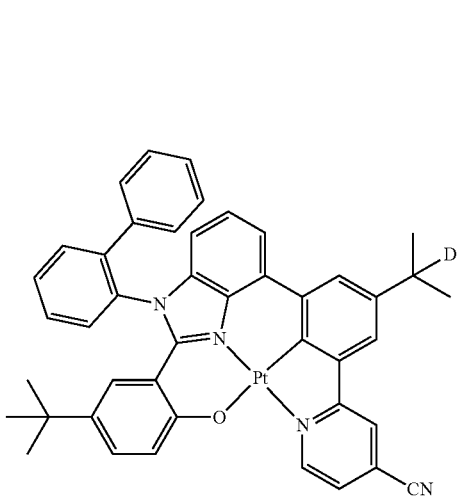
107
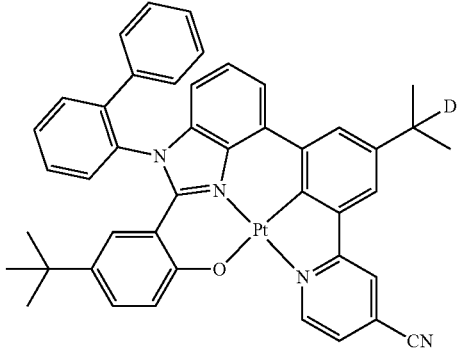

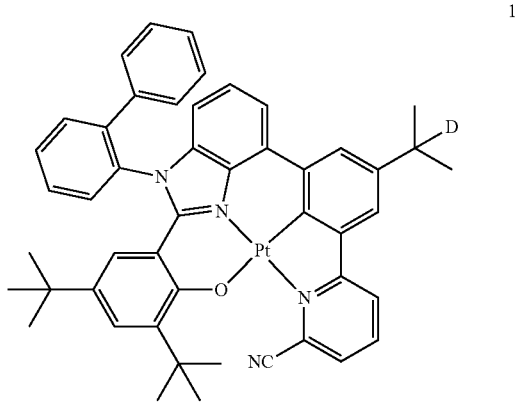
108
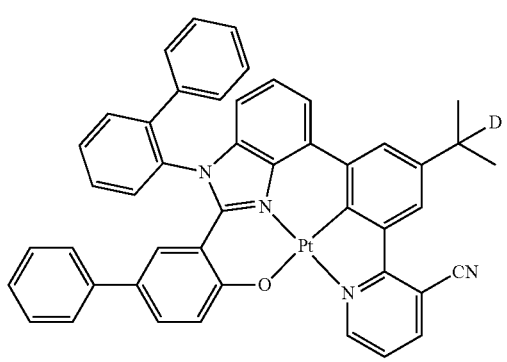
109
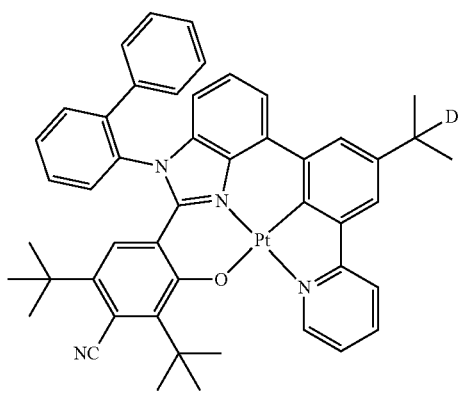
110
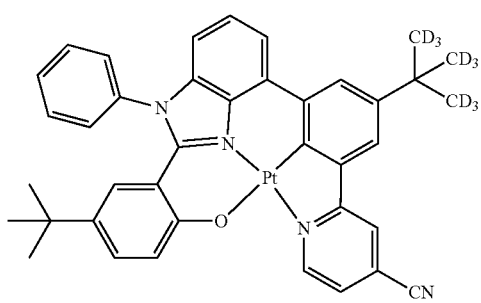
111
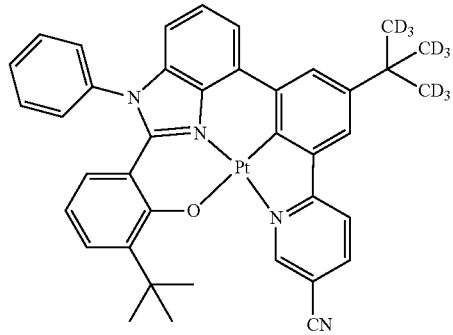
112
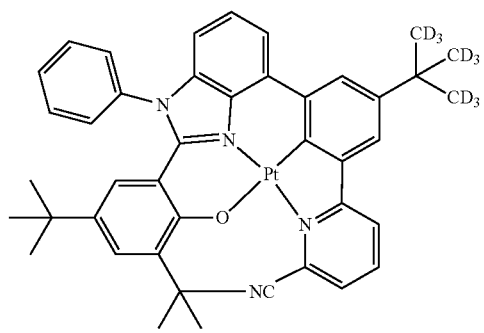
113
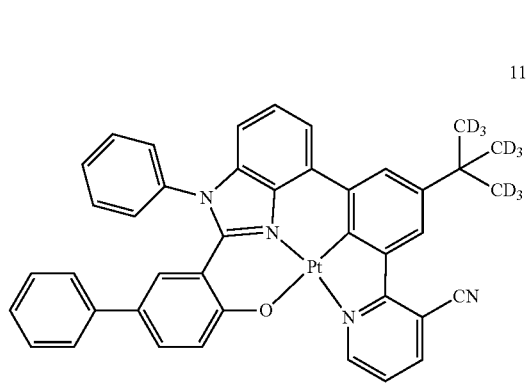
114
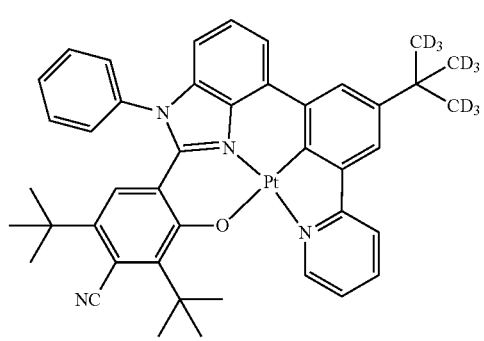
115

116 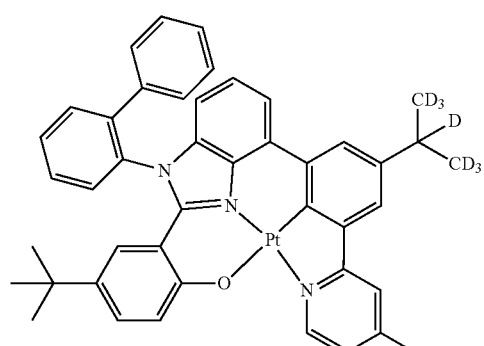
117 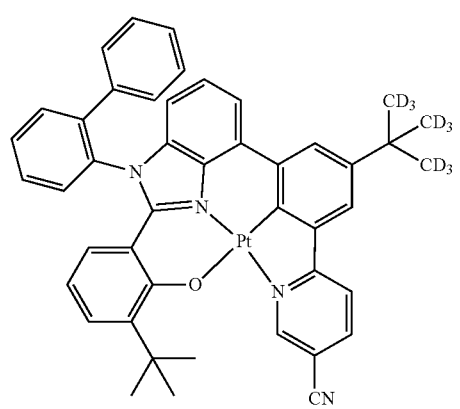
118 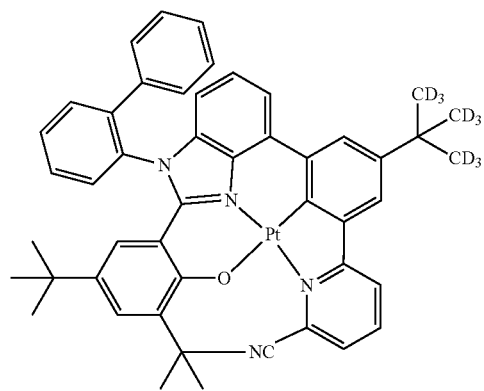
119 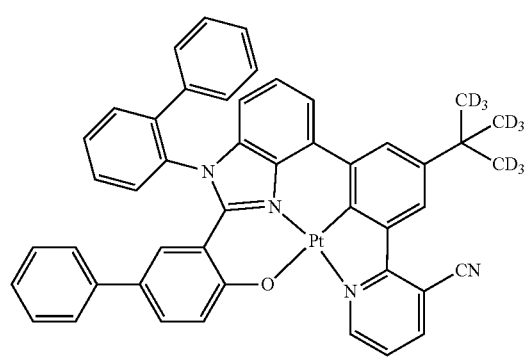
120 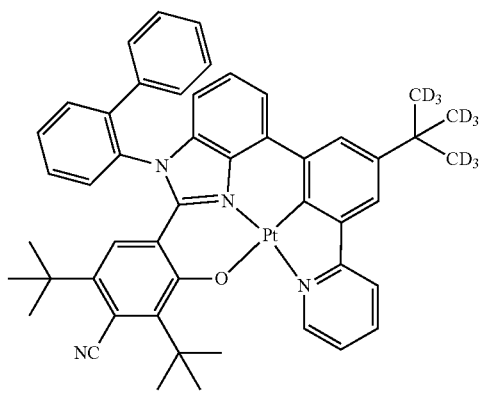
121 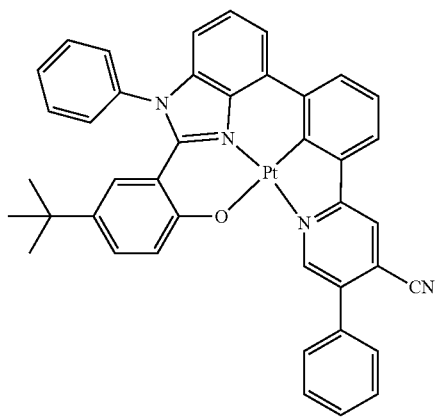
122 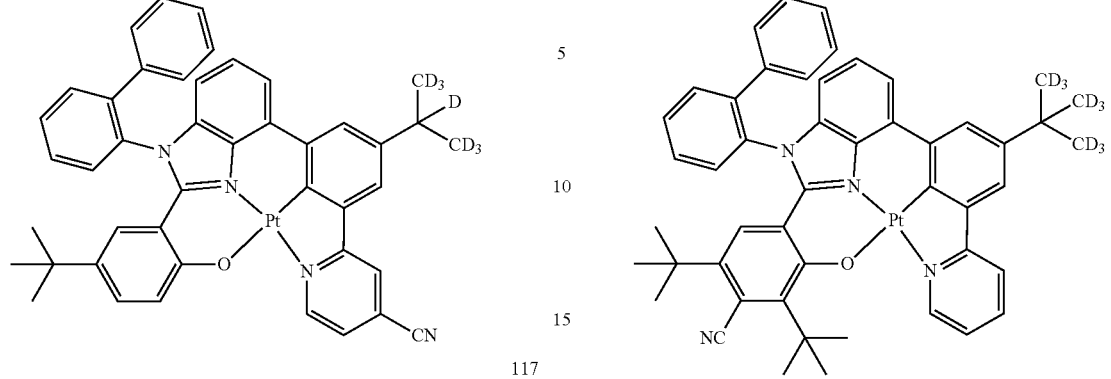

123
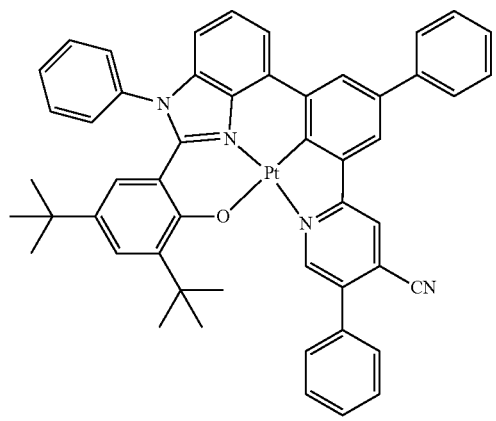
124
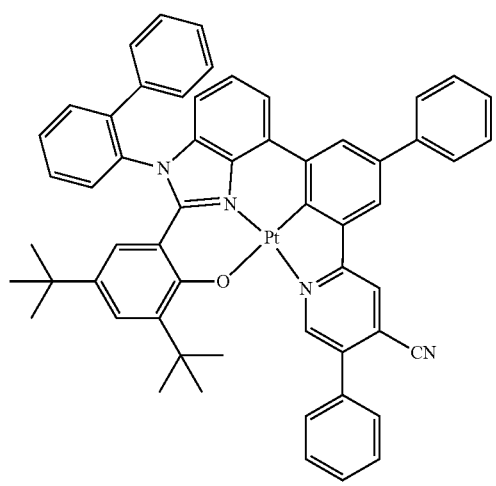
125
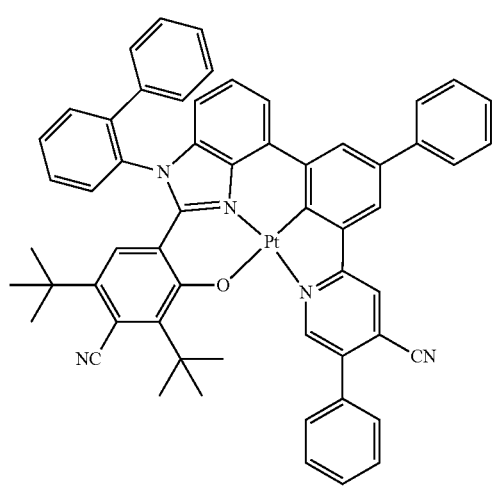
126
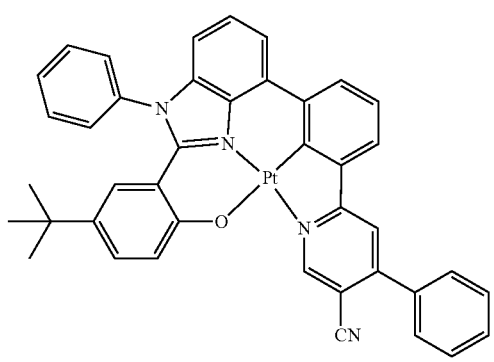
127
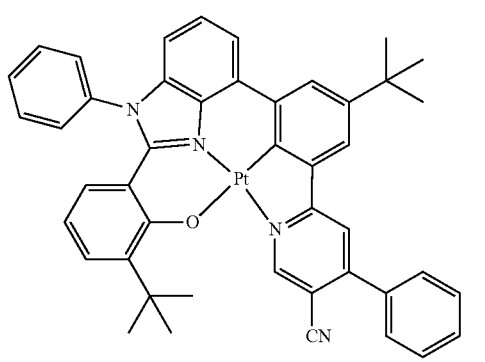
128
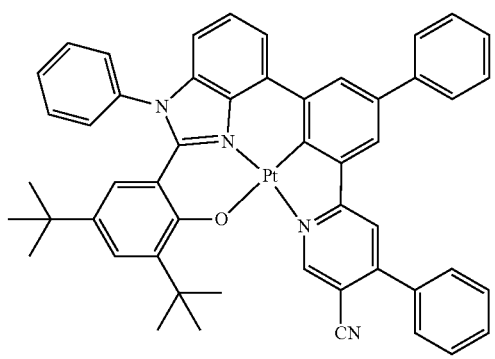
129
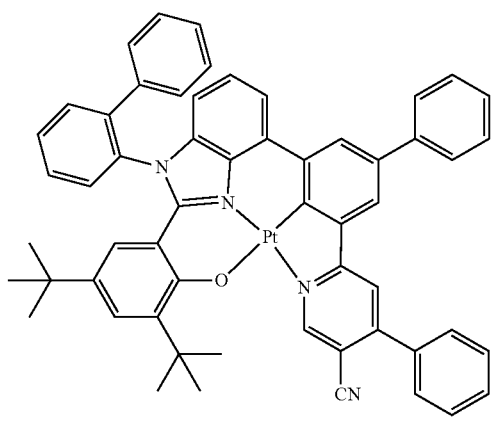

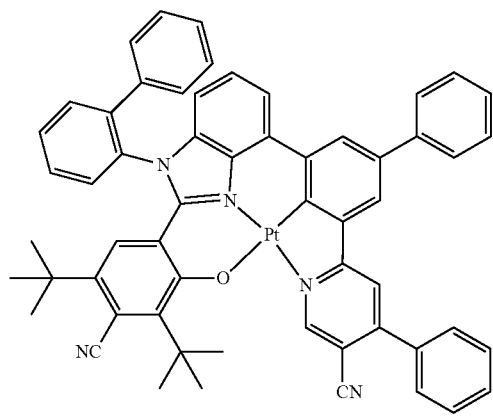
130
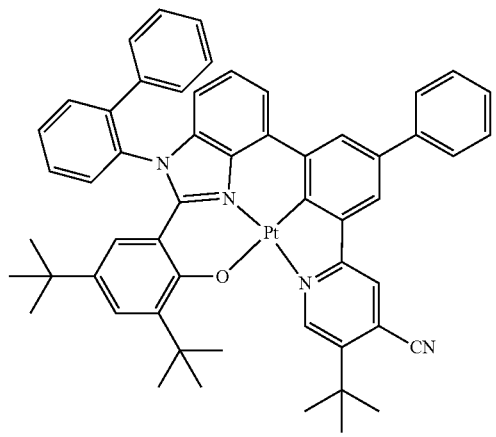
134
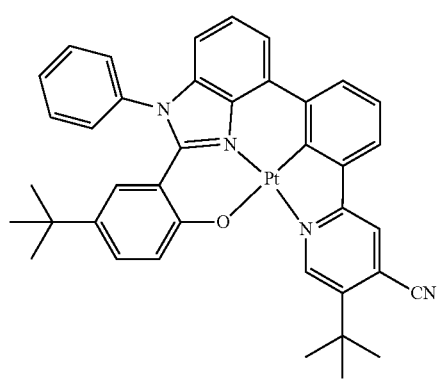
131
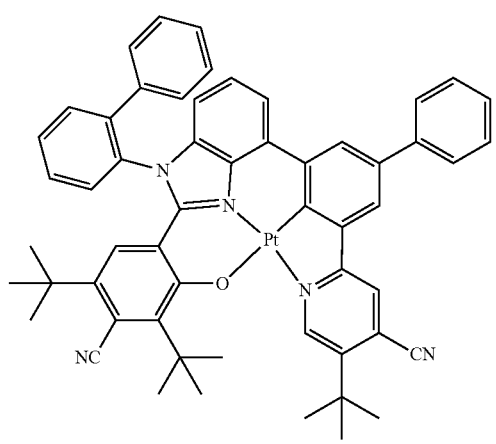
135
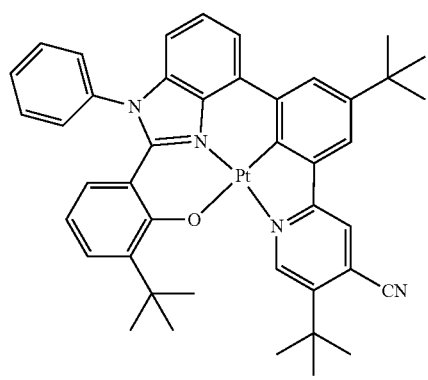
132
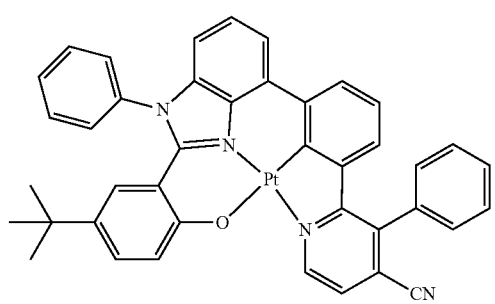
136
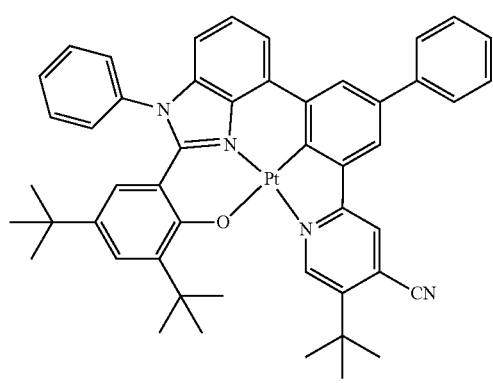
133
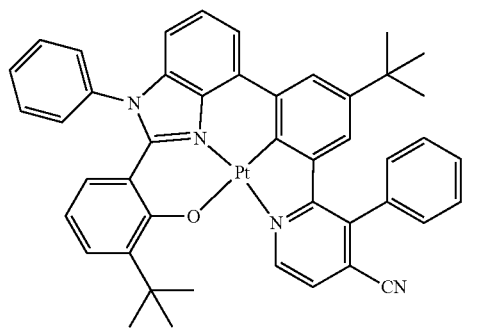
137

138
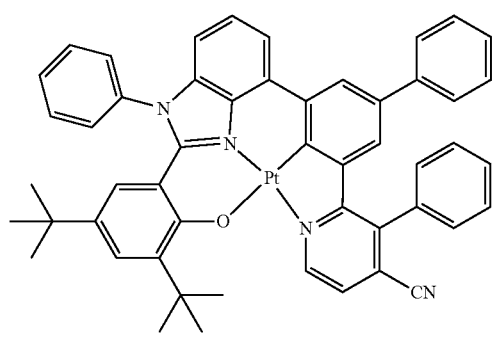
142
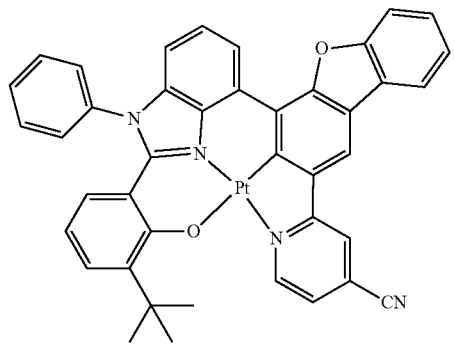
139
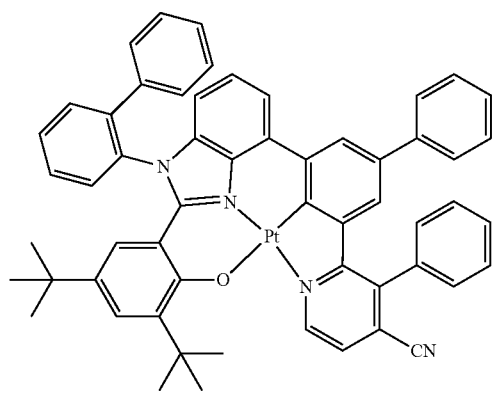
143
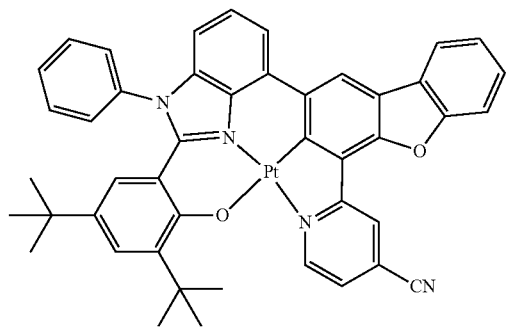
140
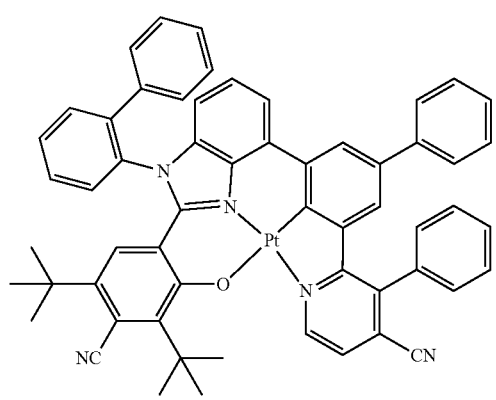
144
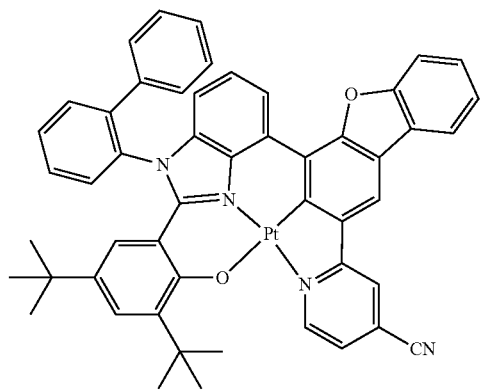
141
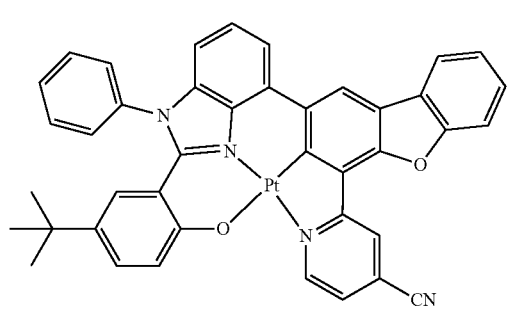
145
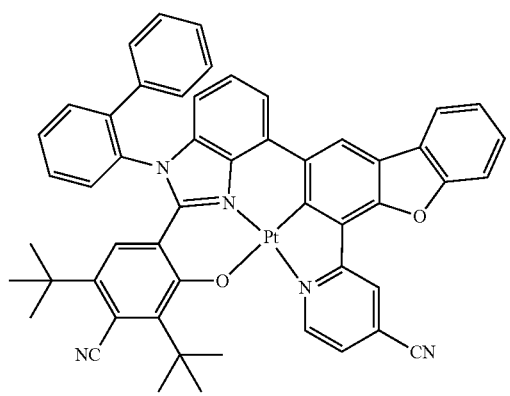

-continued
146
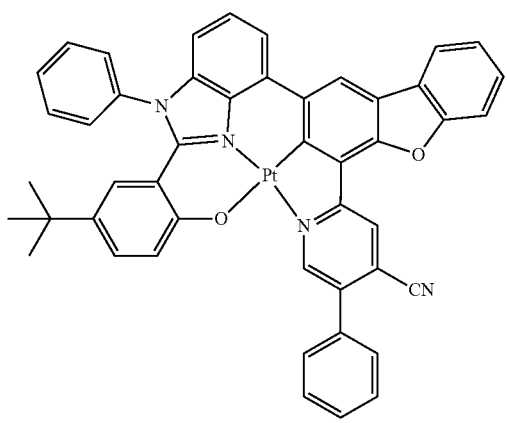
147
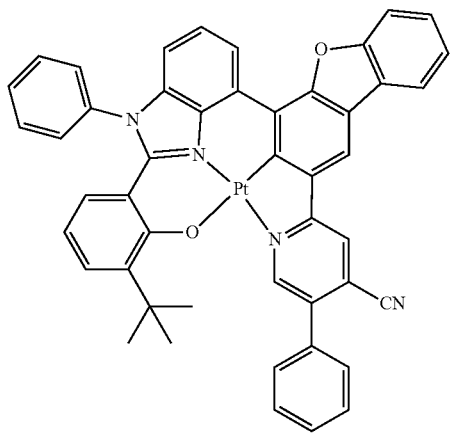
148
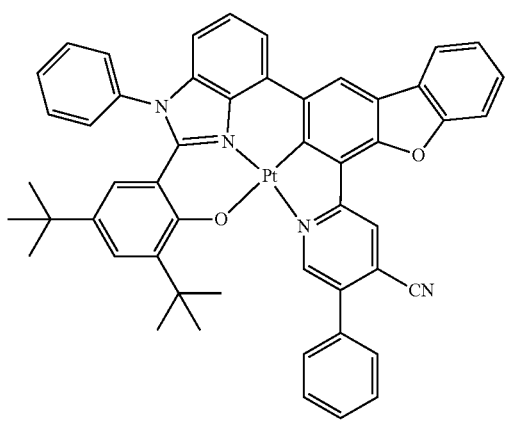
-continued
149
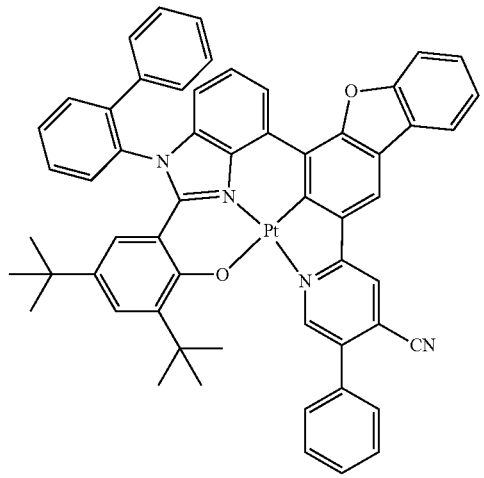
150
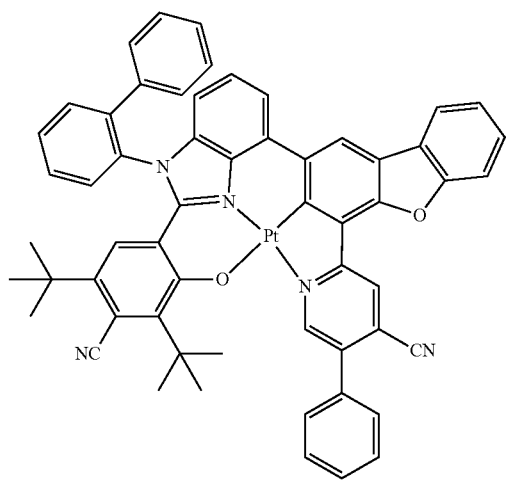
151
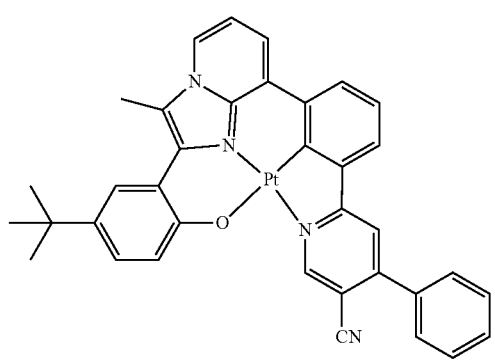

-continued
152
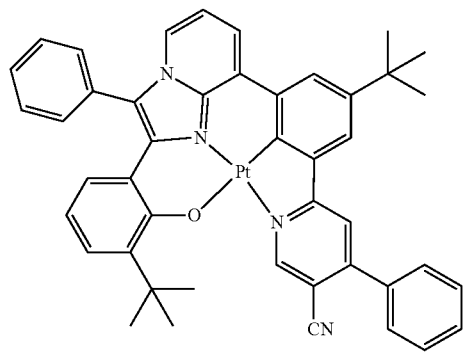
153
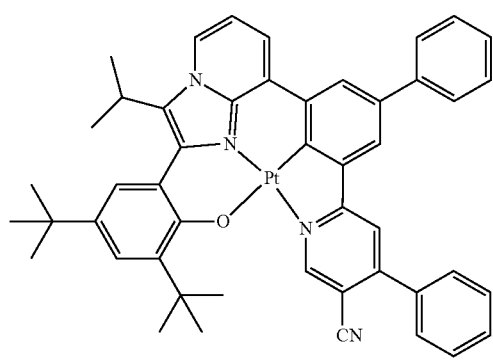
154
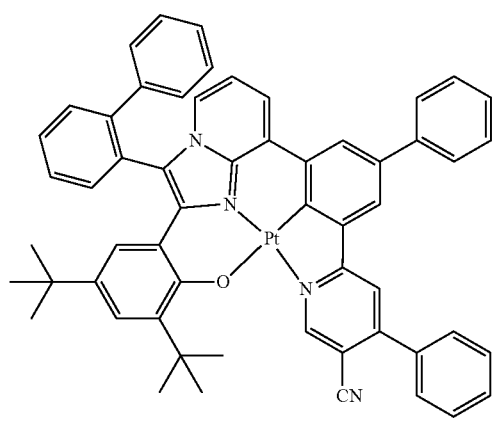
155
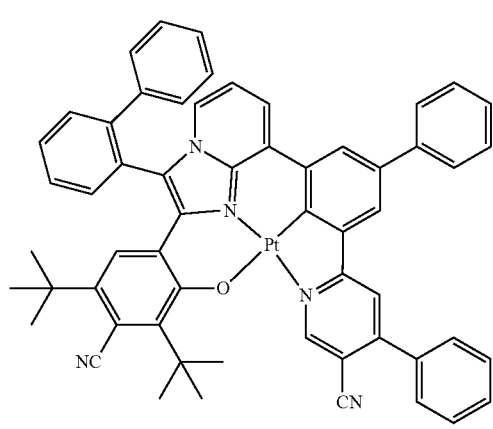
-continued
156
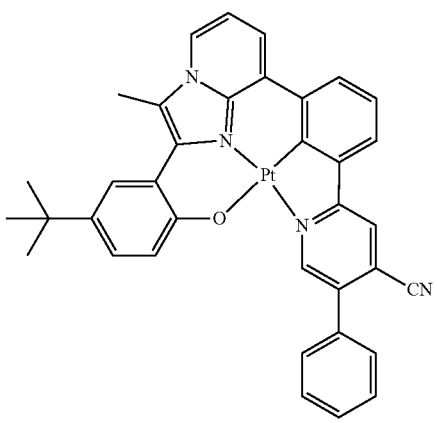
157
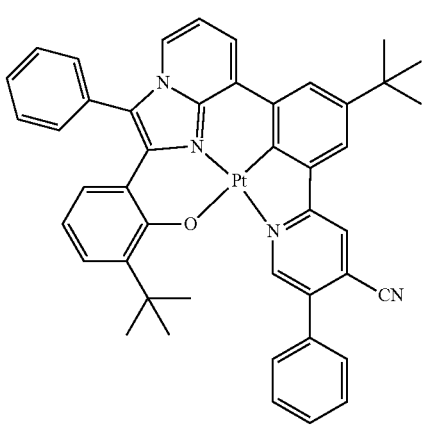
158
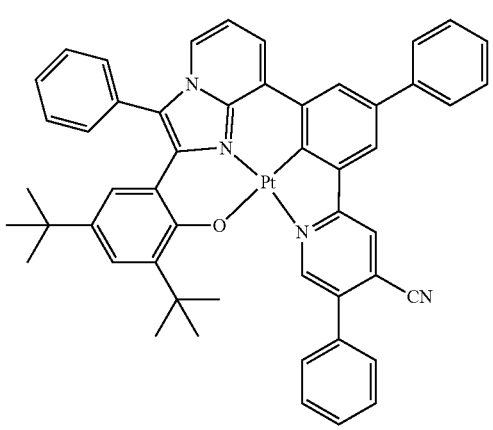

101
-continued
159
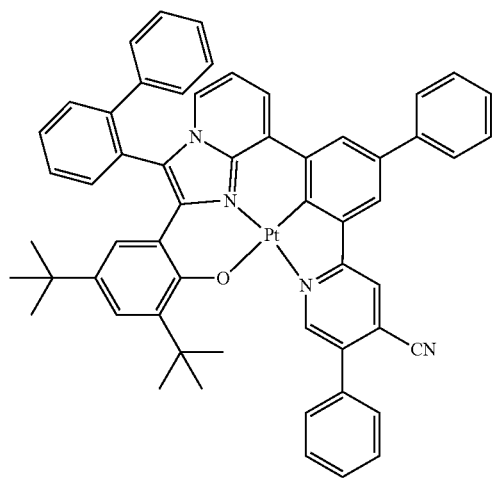
160
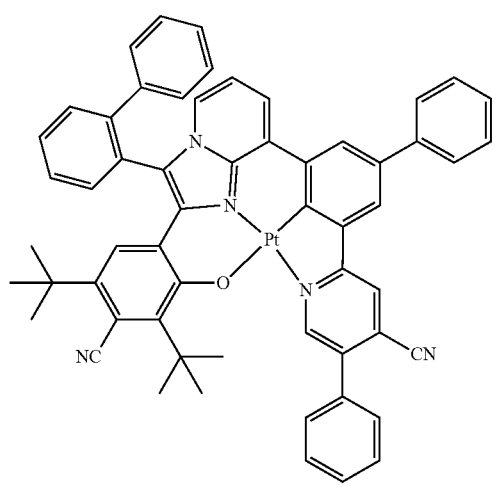
161
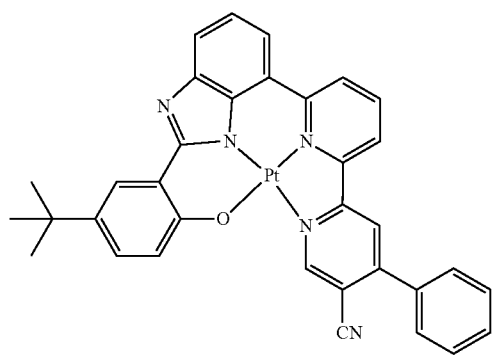
102
-continued
162
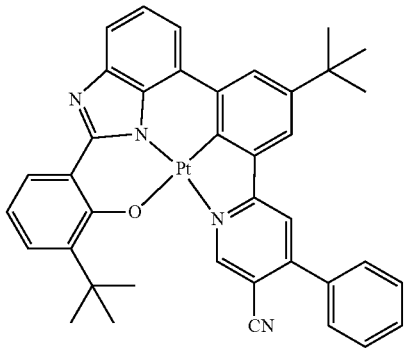
163
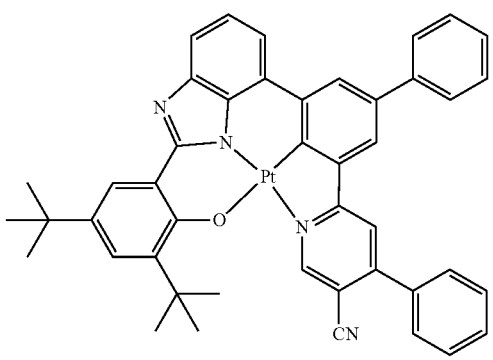
164
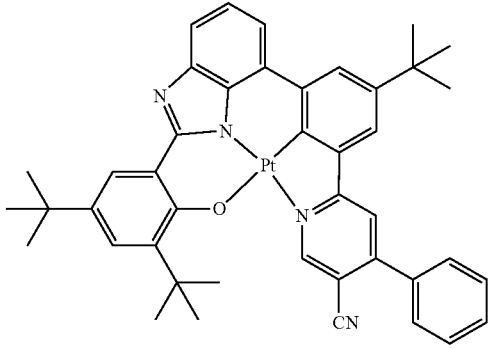
165
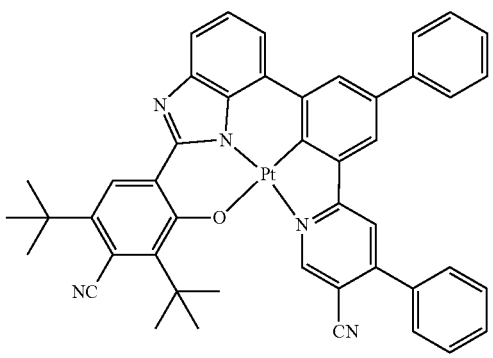

166
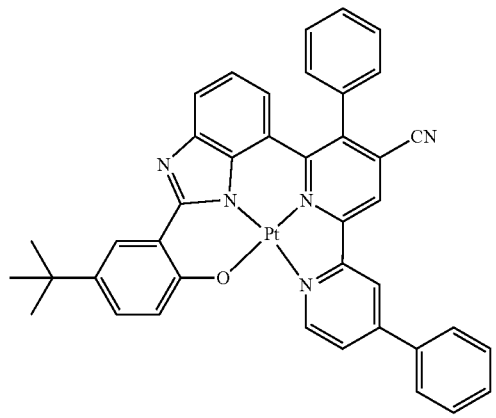
167
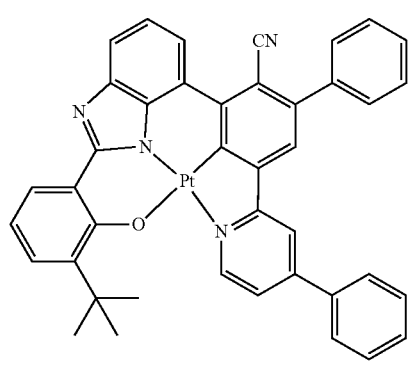
168
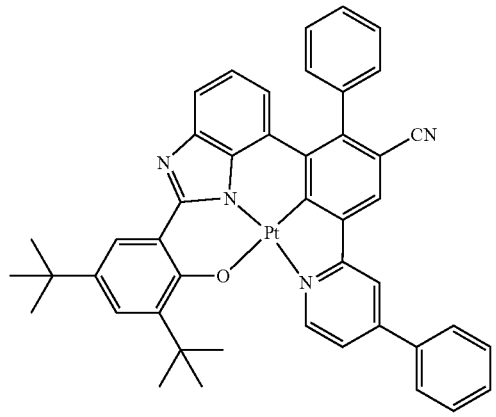
169
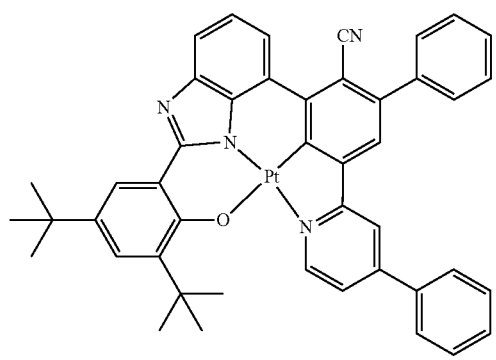
170
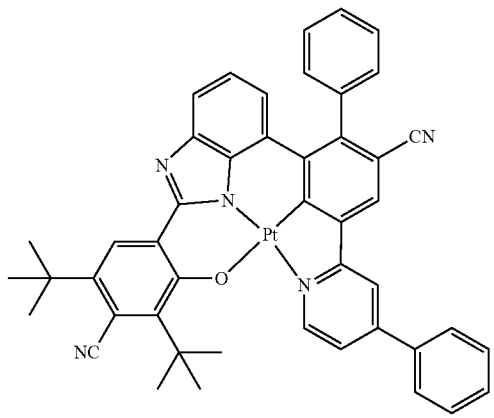
171
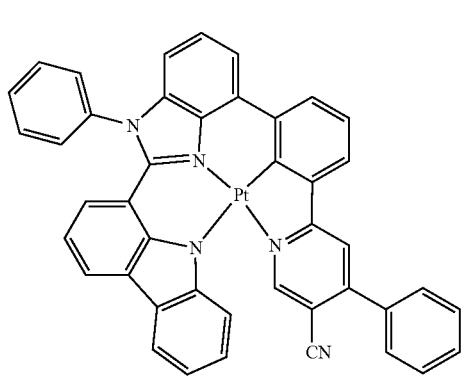
172
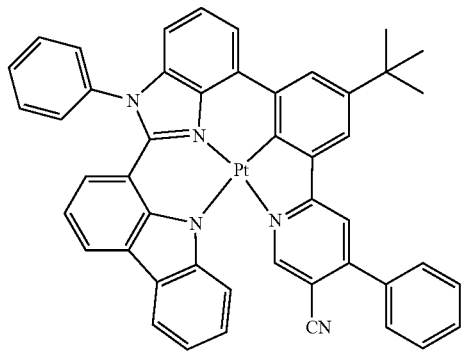
173
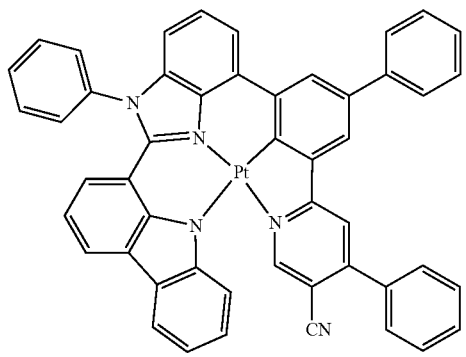

174
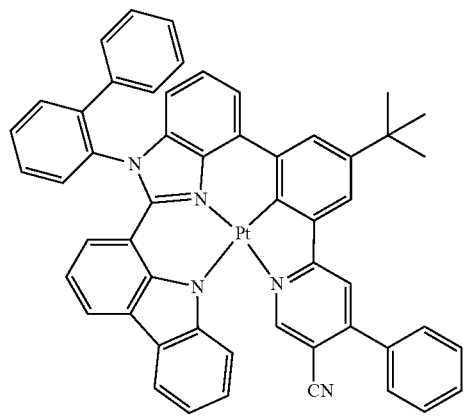
175
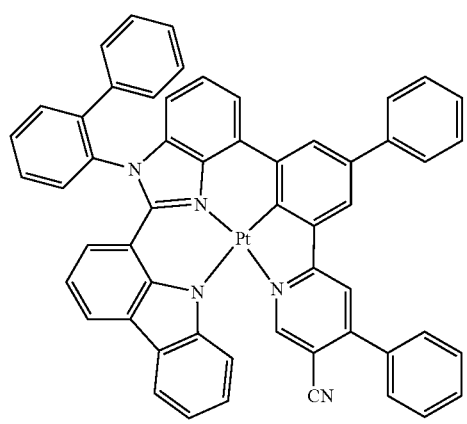
176
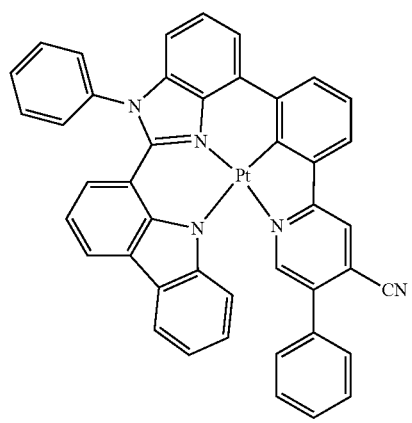
177
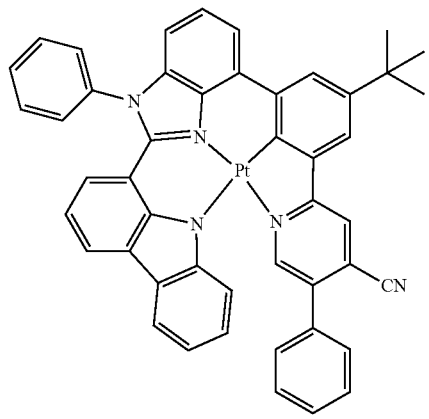
178
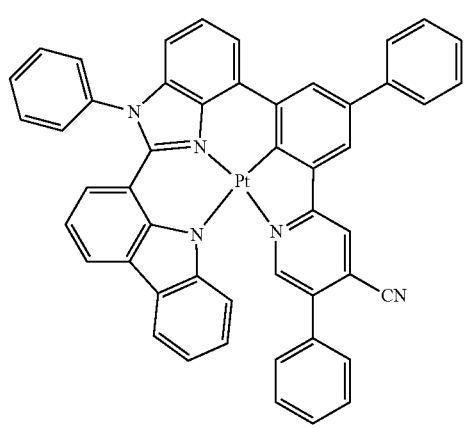
179
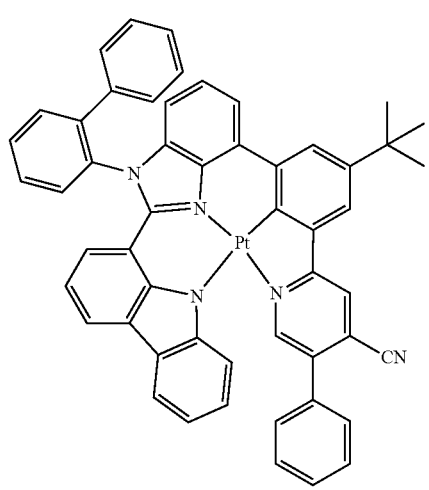

180
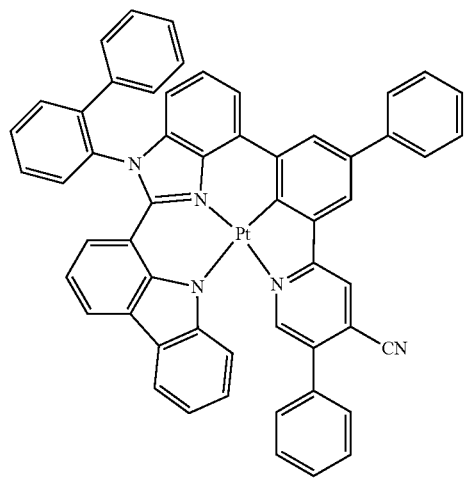
181
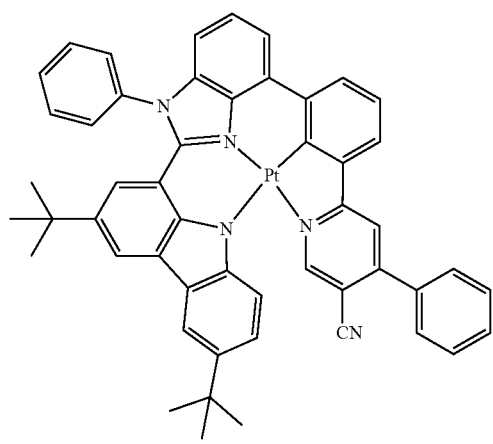
182
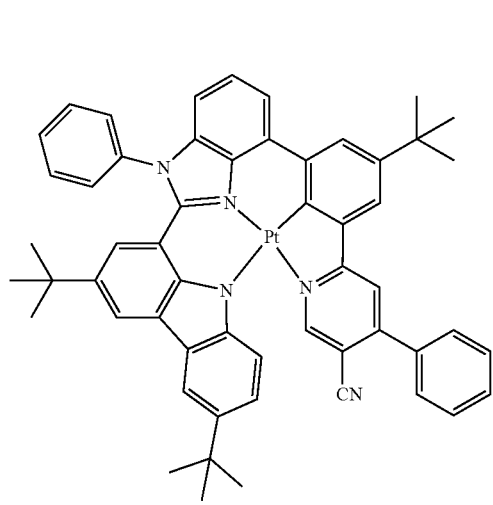
183
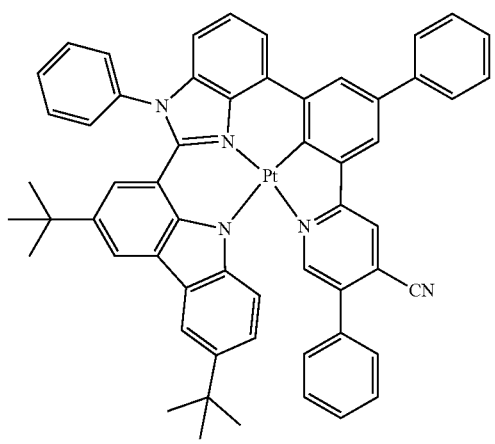
184
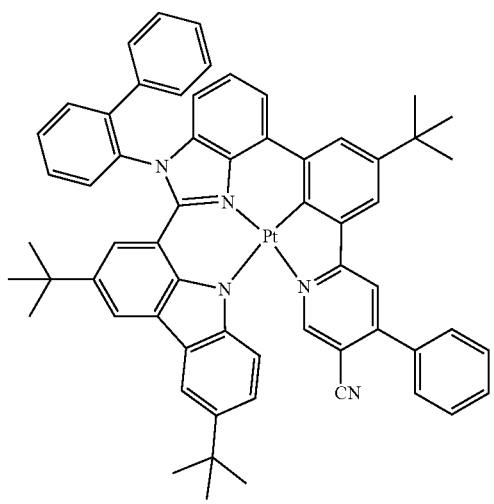
185
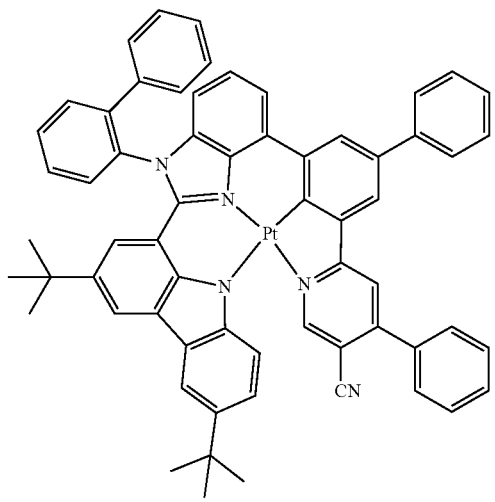

186 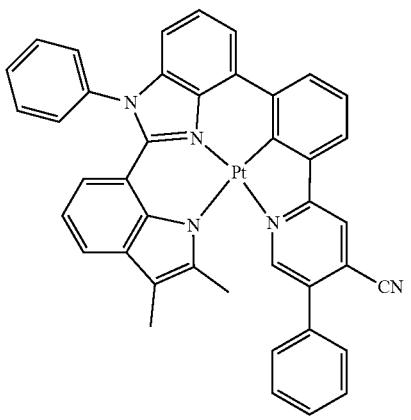

187 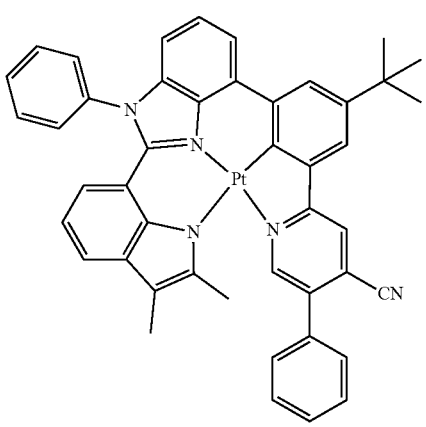

188 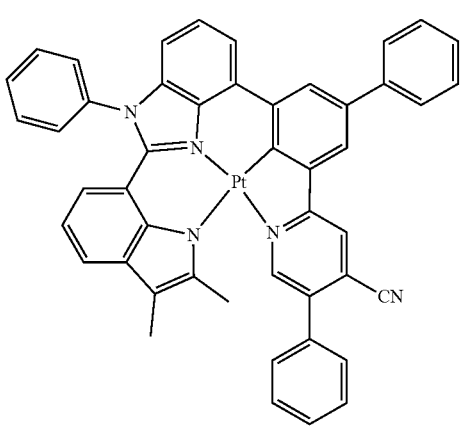

189 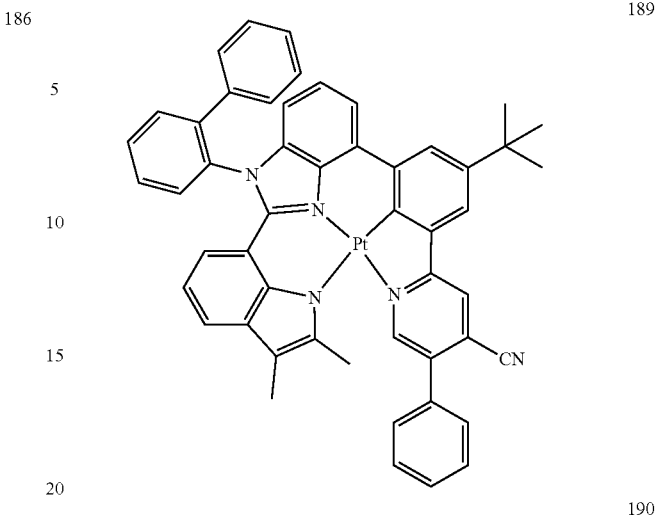

190 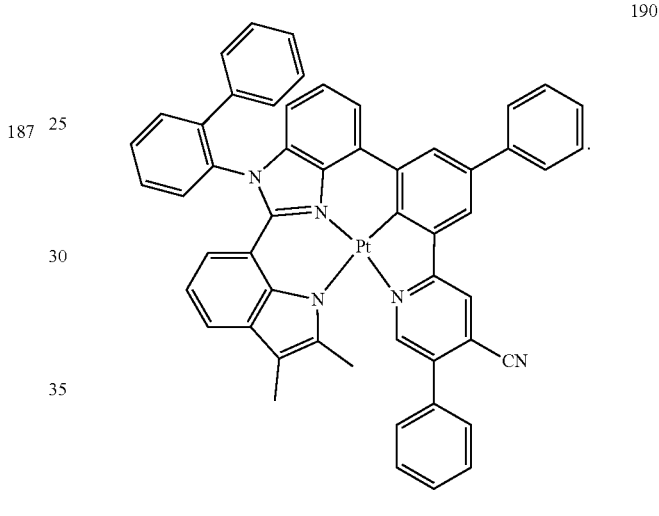

Formula 1 has a 5-membered ring represented by $CY_5$, and a cyclometalated ring formed by $CY_5$, $CY_2$, $CY_3$, and M in Formula 1 is a 6-membered ring. Due to this structure, a binding angle between tetradentate ligand and metal in Formula 1 is stable, and accordingly, the molecular stability of the organometallic compound represented by Formula 1 may be improved.

Also, in Formula 1, i) when $X_{51}$ is O, S, C(=O), or N, the sum of n1, n2, n3, and 4 is 1 or more, ii) when $X_{51}$ is $N[(L_7)_{b7}-(R_7)C_7]$, $C(R_7)$, $Si(R_7)$, or $Ge(R_7)$, $R_7$ is a cyano group-containing group or the sum of n1, n2, n3, and 4 is 1 or more, and iii) when $X_{51}$ is $C(R_7)(R_8)$, $Si(R_7)(R_8)$, or $Ge(R_7)(R_8)$, at least one selected from $R_7$ and $R_8$ is a cyano group-containing group or the sum of n1, n2, n3, and n4 is 1 or more. That is, the organometallic compound represented by Formula 1 essentially includes at least one cyano group-containing group as defined herein. Accordingly, charge-transfer characteristics of the organometallic compound are improved, and thus, an electronic device, for example, an organic light-emitting device, in which the organometallic compound is used, may have an improved luminescent efficiency and an easily controllable-emission wavelength band.

For example, the highest occupied molecular orbital (HOMO), lowest unoccupied molecular orbital (LUMO), singlet (Si), and triplet (Ti) energy levels of Compounds 61, 123, 124, 128, and 158 were calculated by using a DFT method of the Gaussian program [structurally optimized at the level of B3LYP, 6-31G(d,p)]. The evaluation results are shown in Table 1 below.

TABLE 1

| Compound No. | HOMO (eV) | LUMO (eV) | $T_1$ energy level (eV) |
|---|---|---|---|
| 61 | −5.014 | −2.453 | 1.961 |
| 123 | −4.920 | −2.419 | 1.906 |
| 124 | −4.866 | −2.396 | 1.878 |
| 128 | −4.866 | −2.318 | 1.977 |
| 158 | −4.617 | −2.438 | 1.639 |

From the data in Table 1, it is confirmed that the organometallic compound represented by Formula 1 has such electric characteristics that are suitable for use in an electric device, for example, for use as a dopant for an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer.

Thus, another aspect of the present disclosure provides an organic light-emitting device that includes:
a first electrode;
a second electrode; and
an organic layer that is disposed between the first electrode and the second electrode,
wherein the organic layer includes an emission layer and at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one of organometallic compounds" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 all may be included in an emission layer).

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode.

The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide (SnO2), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is located on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, and a compound represented by Formula 202 below:

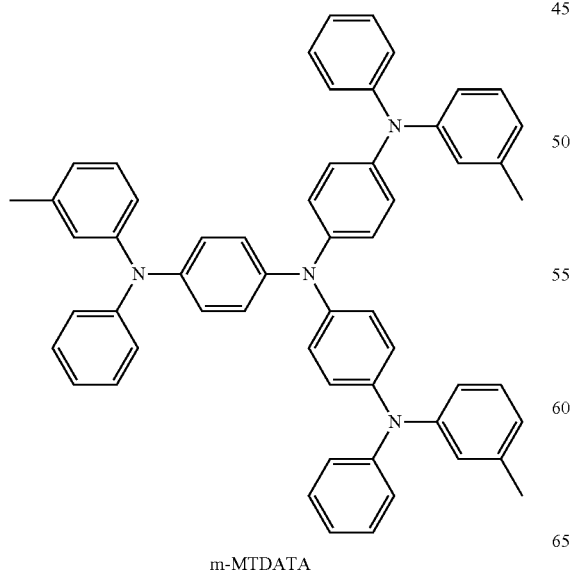

m-MTDATA

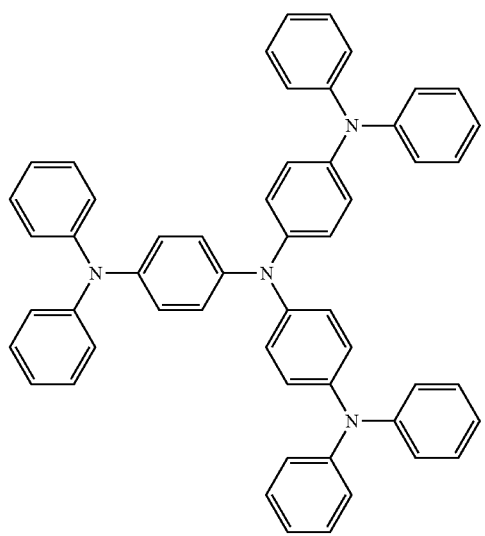

TDATA

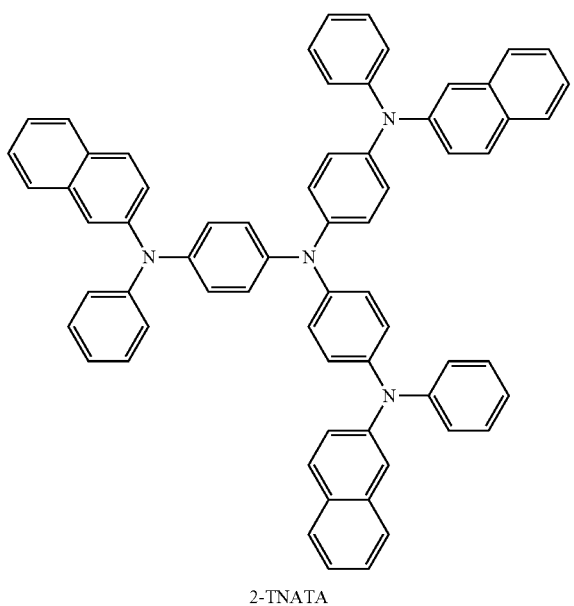

2-TNATA

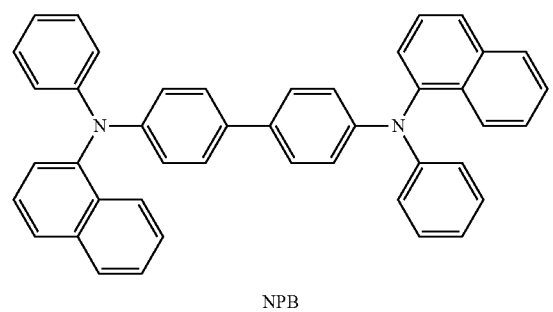

NPB

-continued

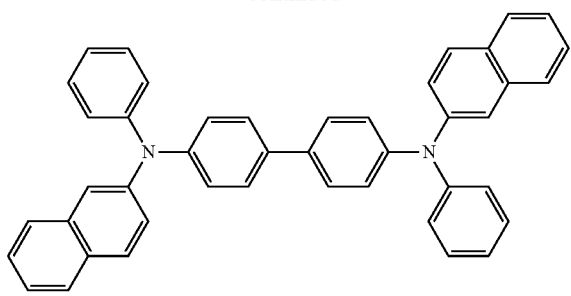

β-NPB

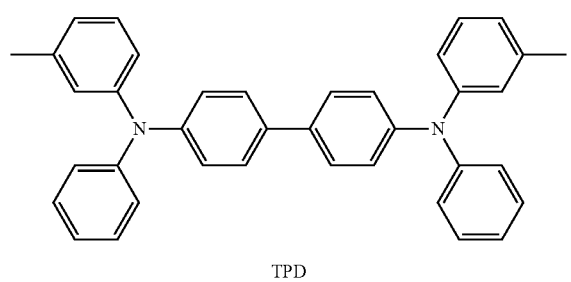

TPD

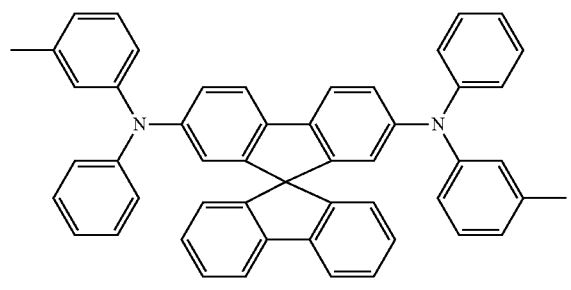

Spiro-TPD

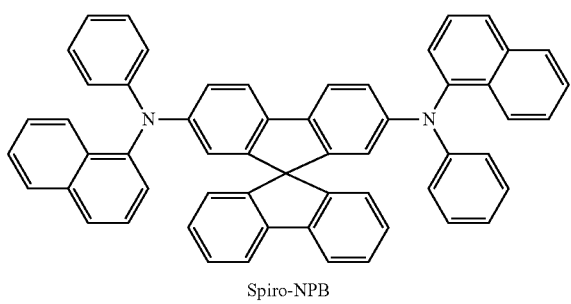

Spiro-NPB

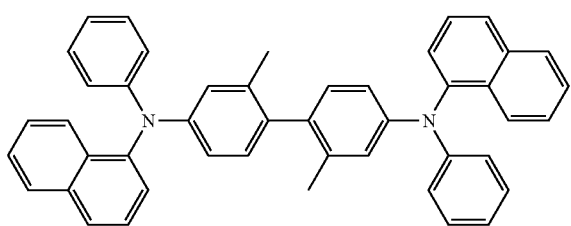

methylated NPB

-continued

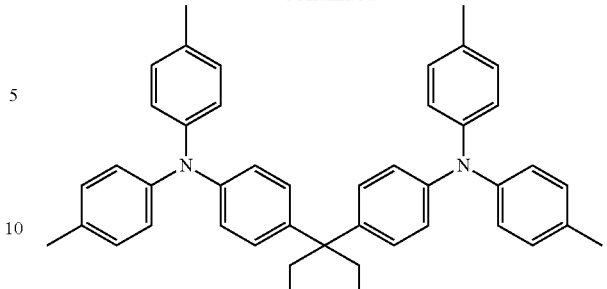

TAPC

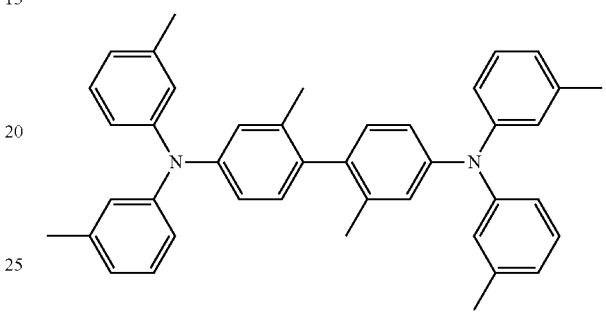

HMTPD

Formula 201

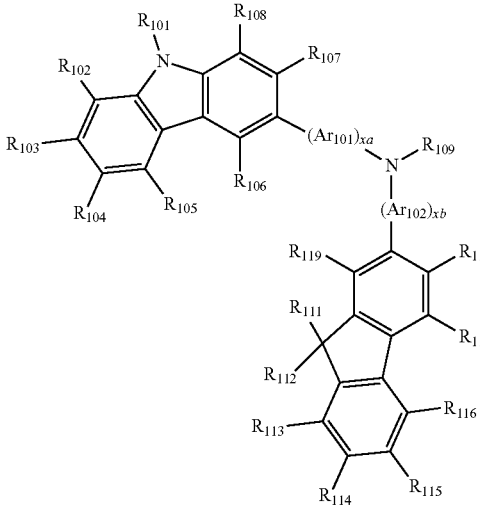

Formula 202

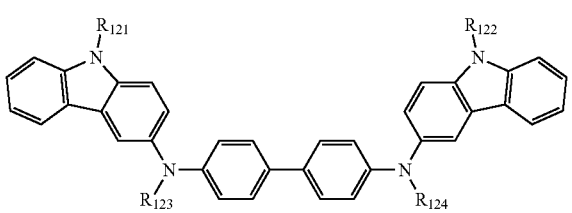

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), and a $C_1$-$C_{10}$ alkoxy group (for example, a methoxy group, an ethoxy group, a propoxy group, a butoxy group, a pentoxy group, and so on);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but they are not limited thereto.

but embodiments of the present disclosure are not limited thereto.

$R_{109}$ in Formula 201 may be selected from:
a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

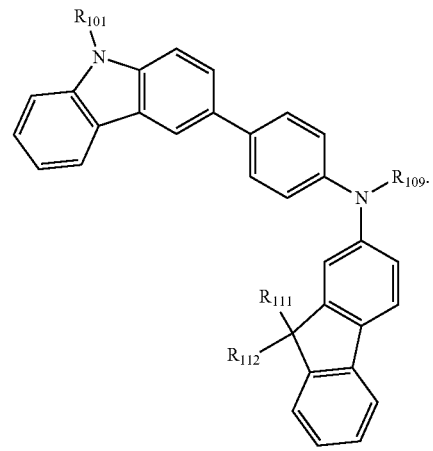

Formula 201A $R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

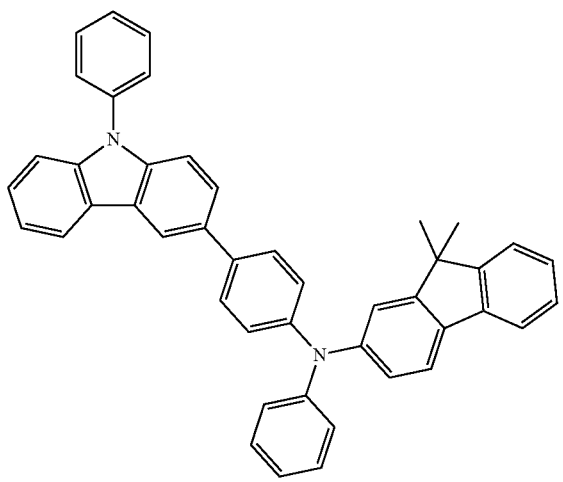

HT1

HT2
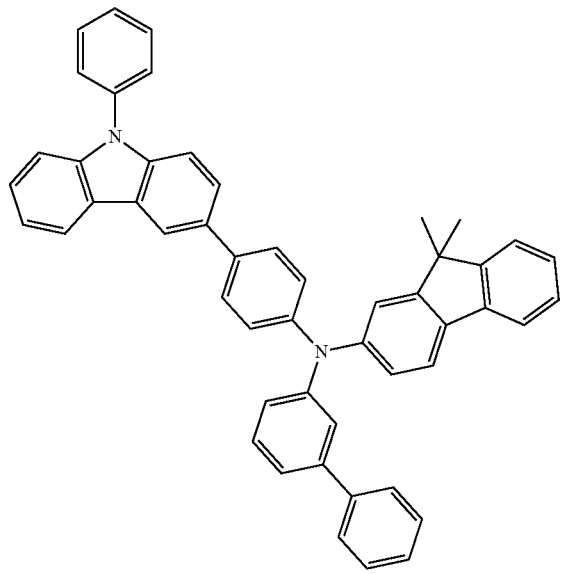
HT4
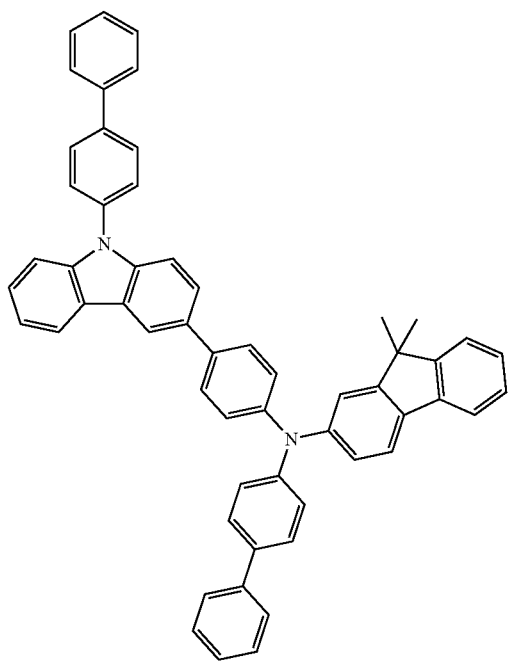
HT3
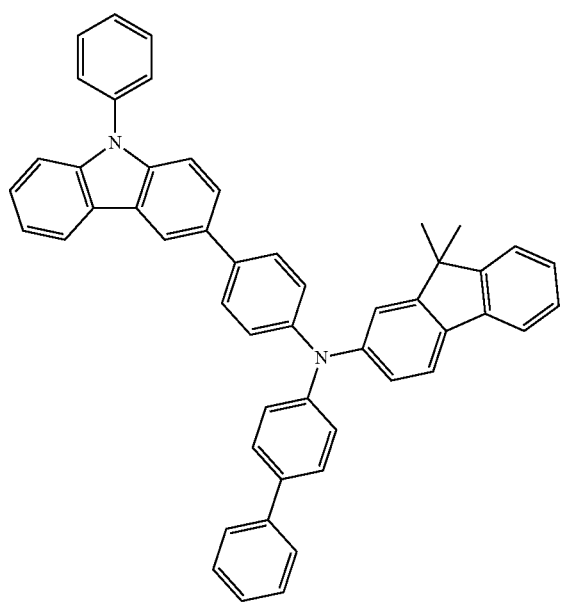
HT5
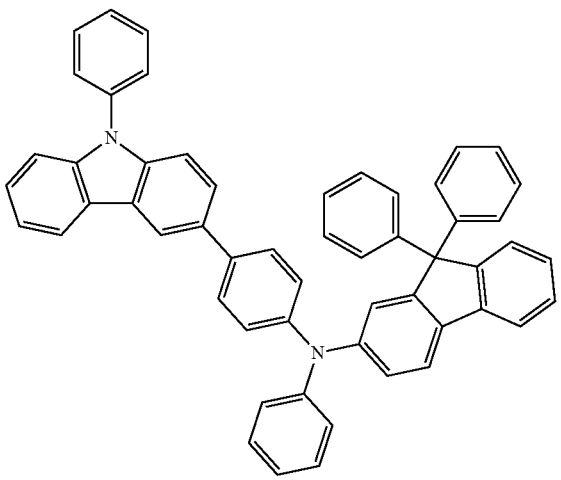

HT6
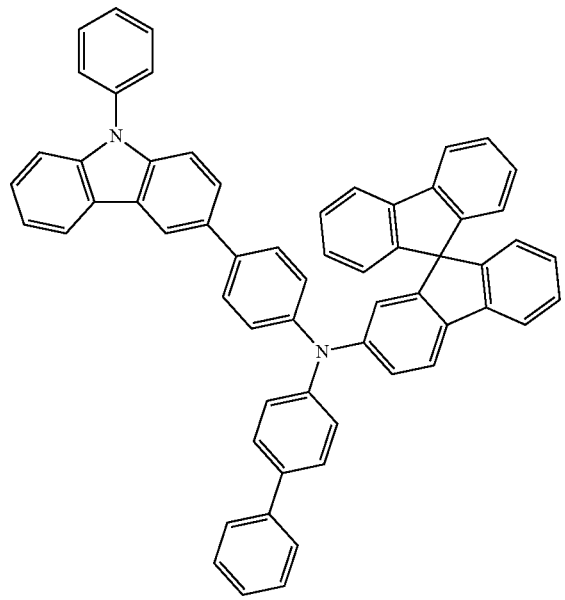
HT7
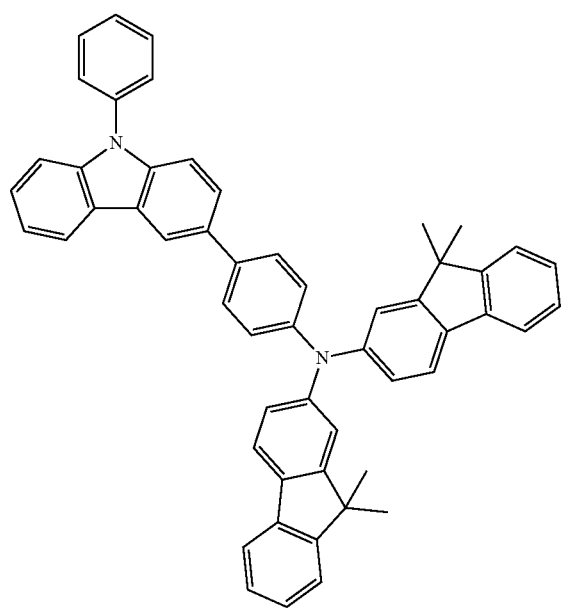
HT8
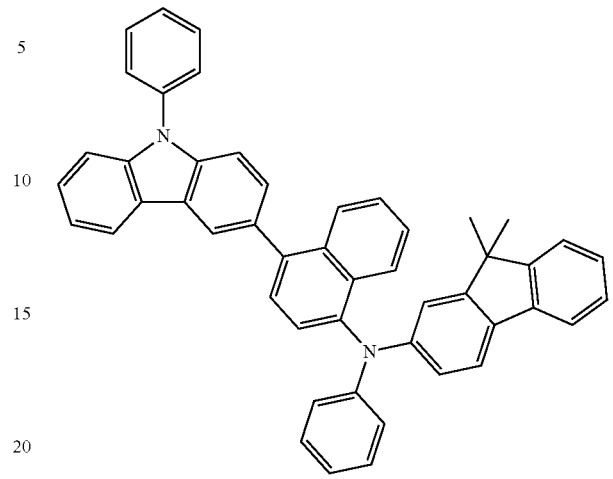
HT9
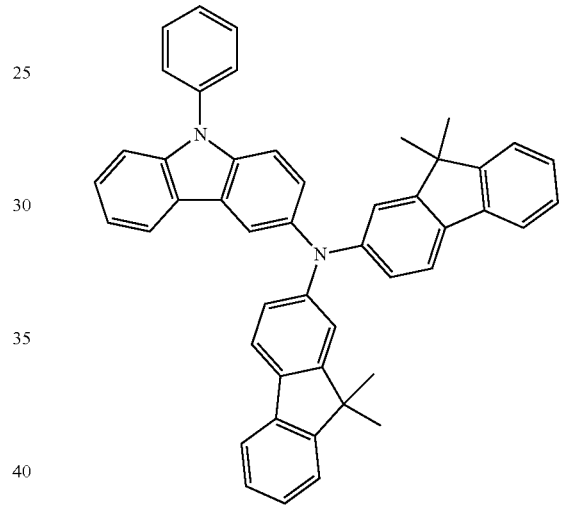
HT10
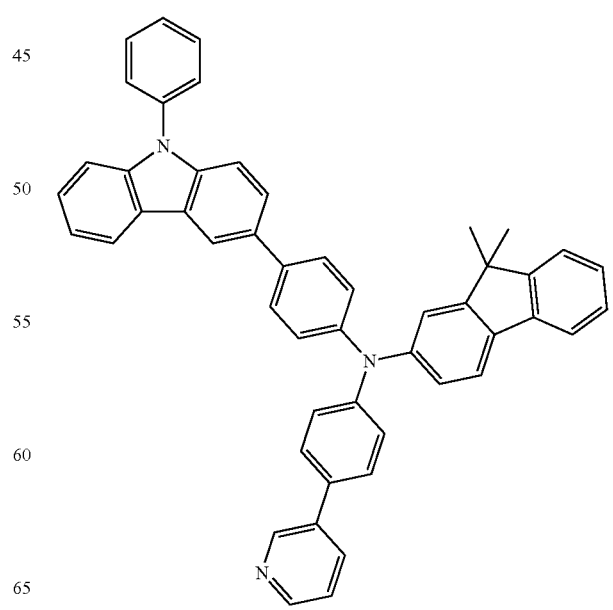

HT11
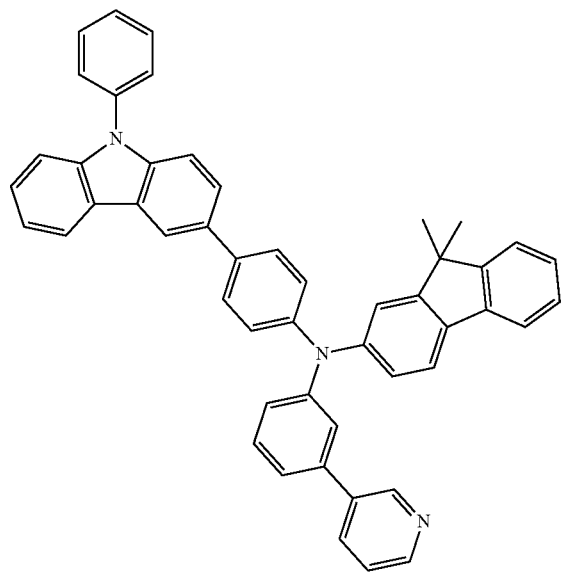
HT12
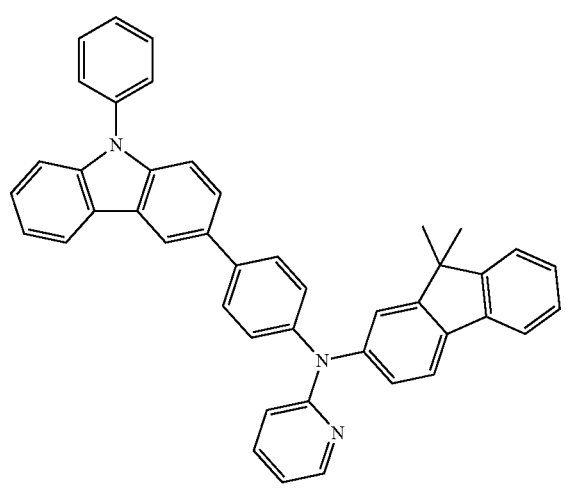
HT13
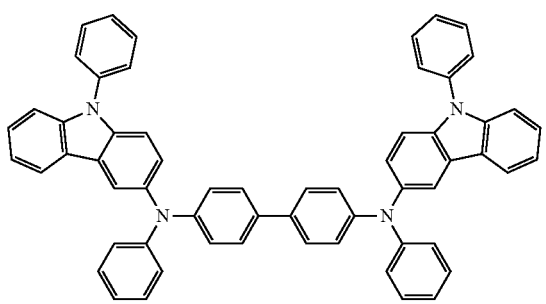
HT14
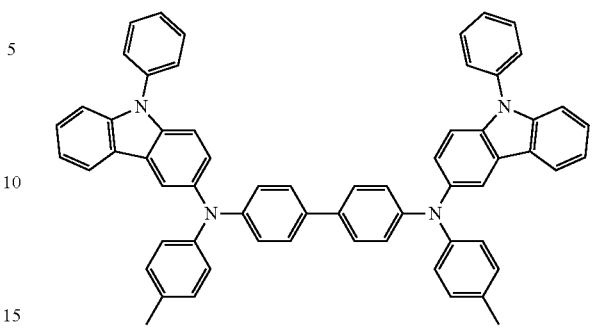
HT15
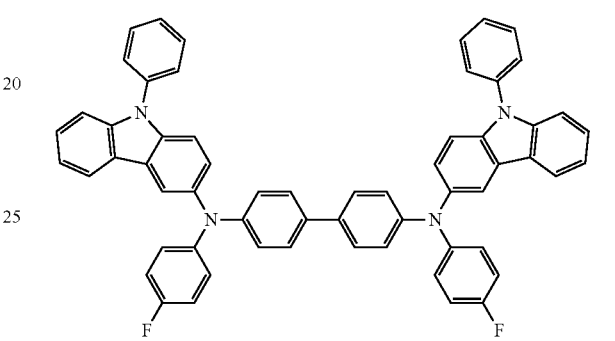
HT16
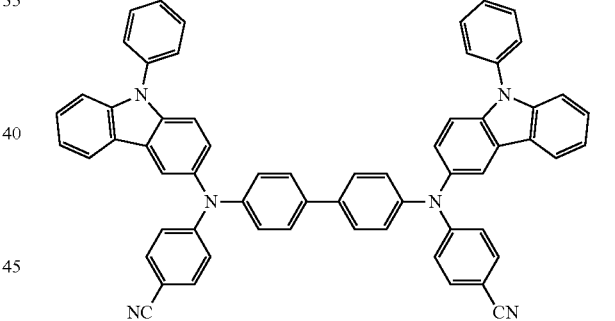
HT17
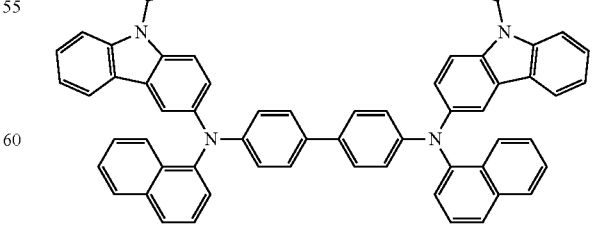

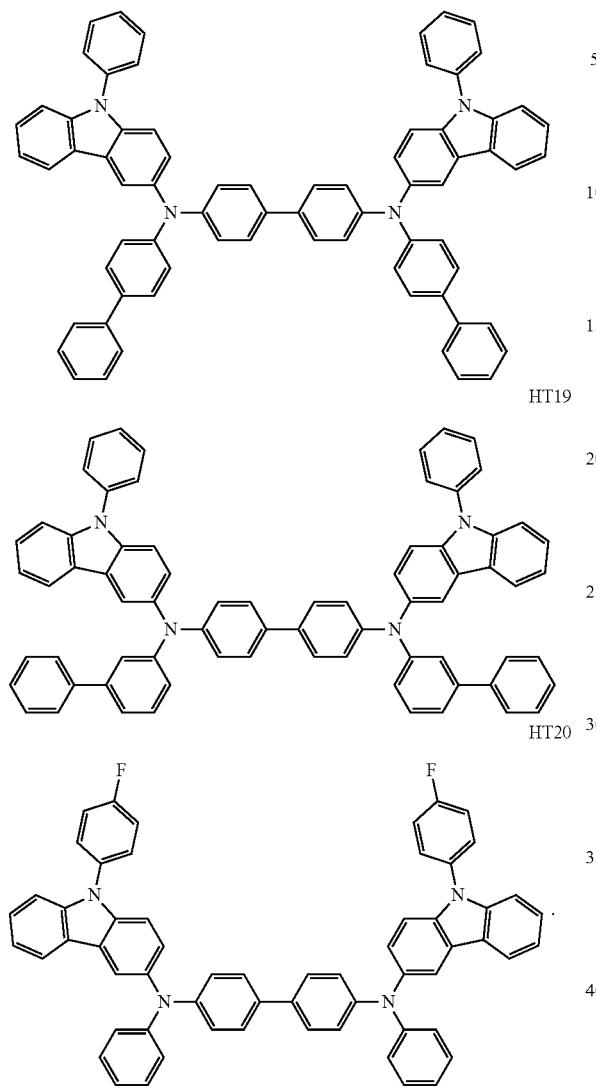

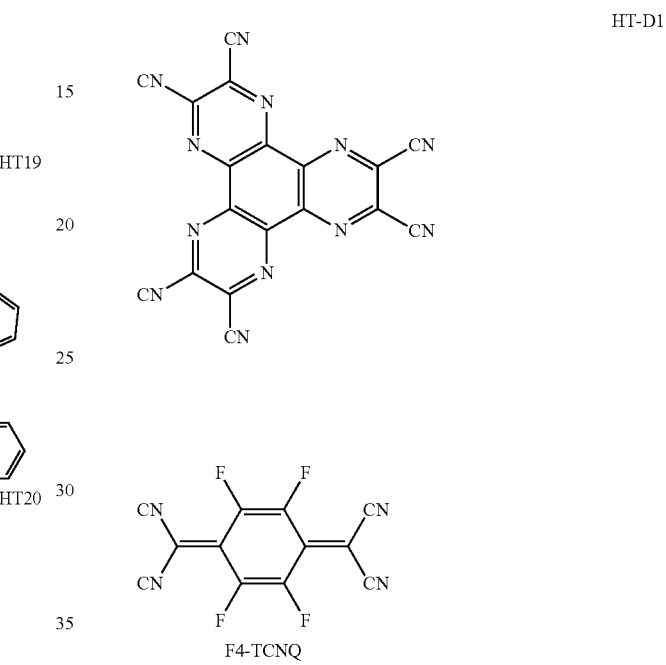

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto.

The hole transport region may include a buffer layer.

Also, the buffer layer may compensate for an optical resonance distance depending on a wavelength of light emitted from the emission layer, and thus, efficiency of a formed organic light-emitting device may be improved.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

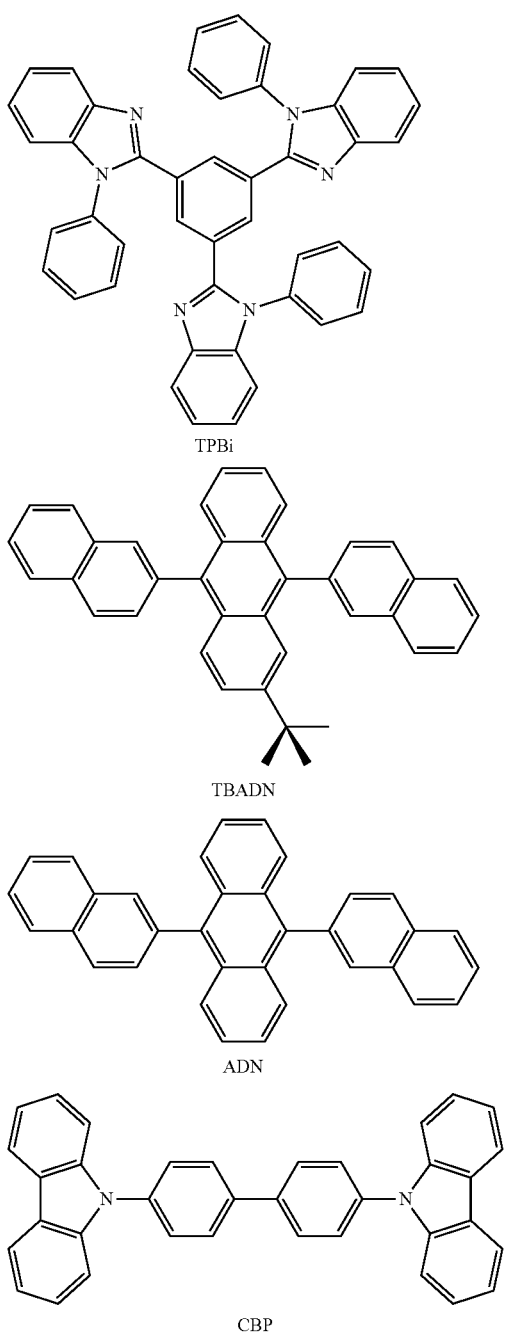
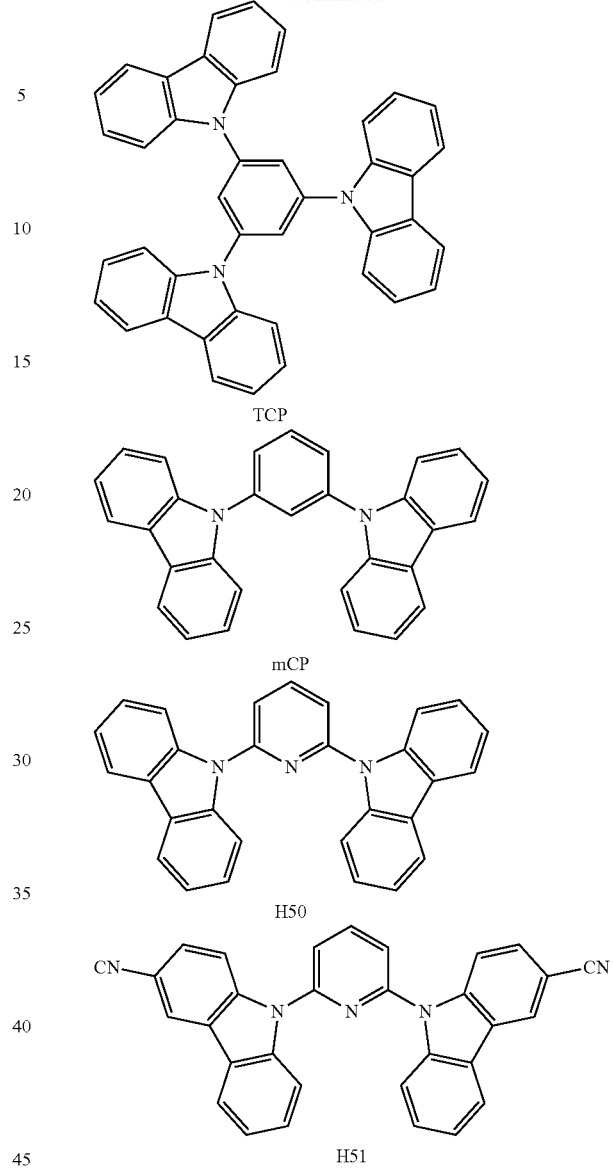
In one or more embodiments, the host may further include a compound represented by Formula 301 below.
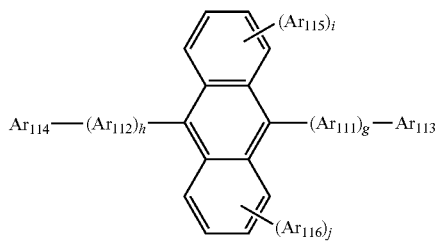
Formula 301
$Ar_{111}$ and $Ar_{112}$ in Formula 301 may each independently be selected from:
 a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group;

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ to $Ar_{116}$ in Formula 301 may each independently be selected from:

a $C_1$-$C_{10}$ alkyl group, substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

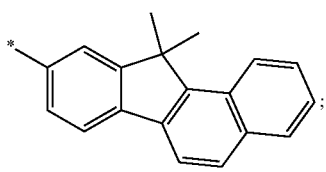 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

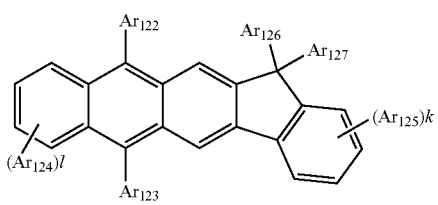

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

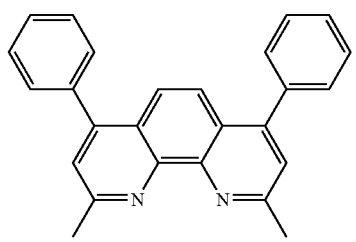

BCP

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, Alq3, BAlq, TAZ, and NTAZ.

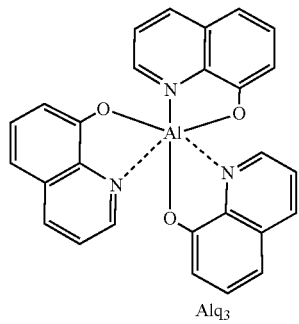
Alq₃

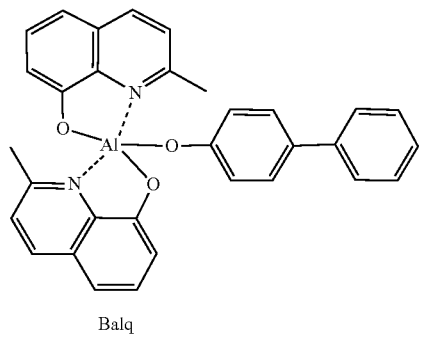
Balq

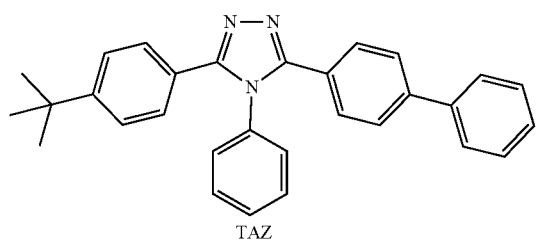
TAZ

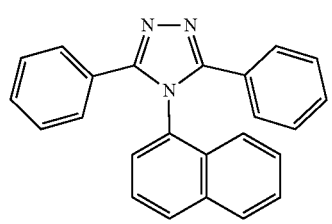
NTAZ

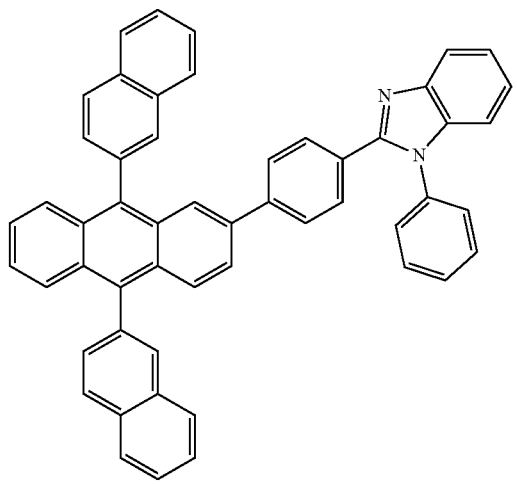
ET1

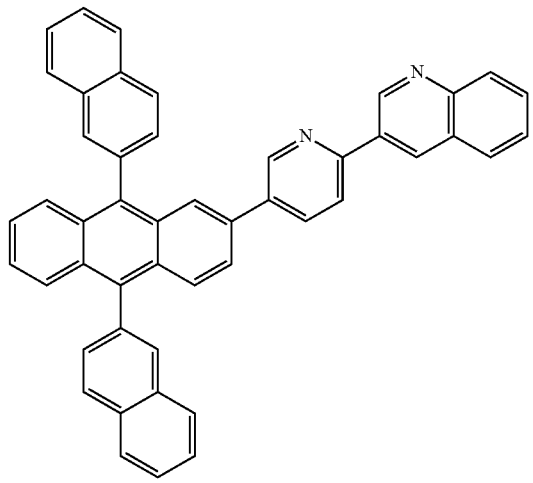
ET2

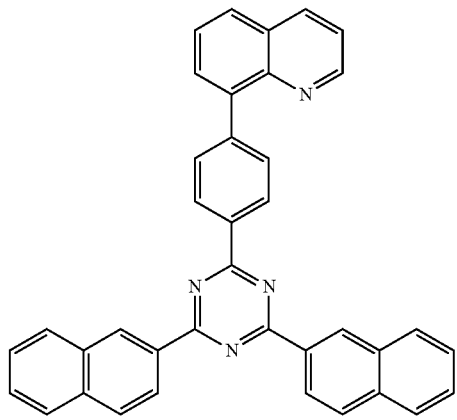
ET3

In one or more embodiments, the electron transport layer may include at least one of ET1 and ET25, but are not limited thereto:

-continued
ET4
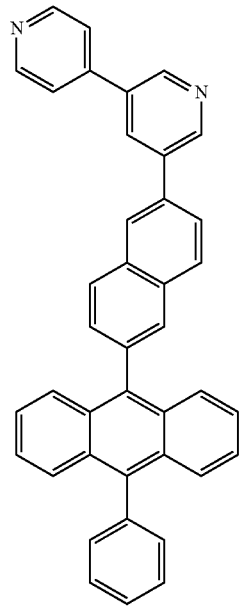
ET7
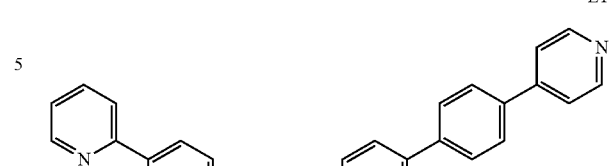
ET5
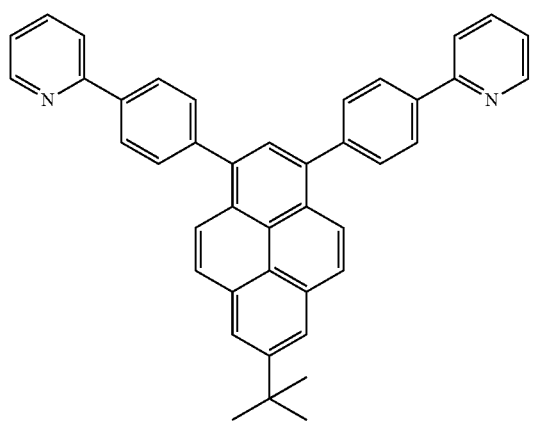
ET8
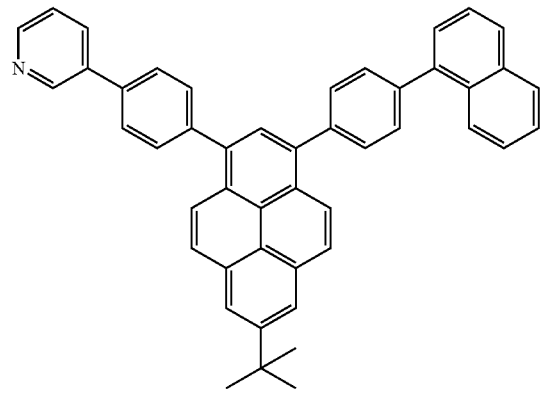
ET6
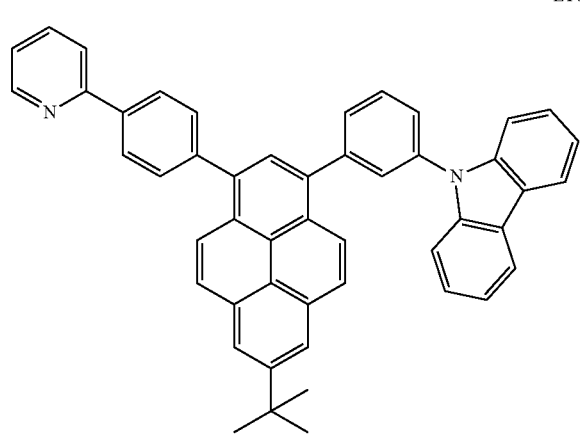
ET9
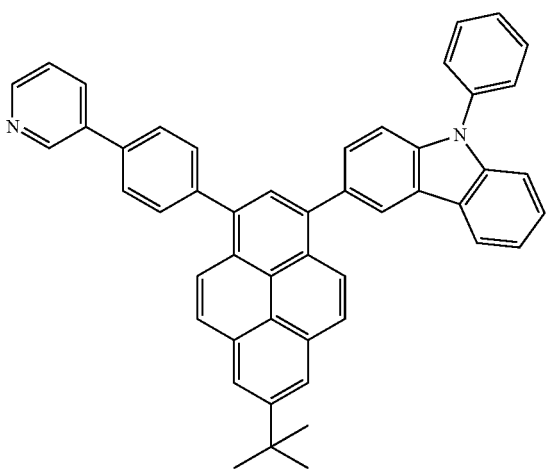

-continued
ET10
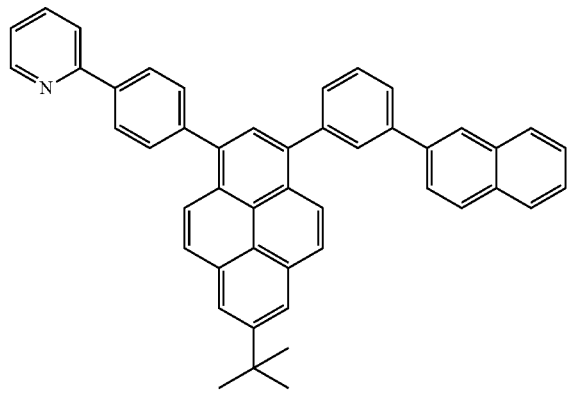
ET11
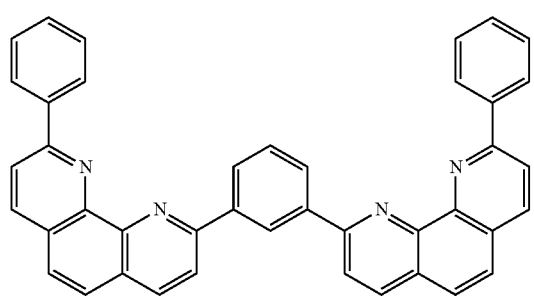
ET12
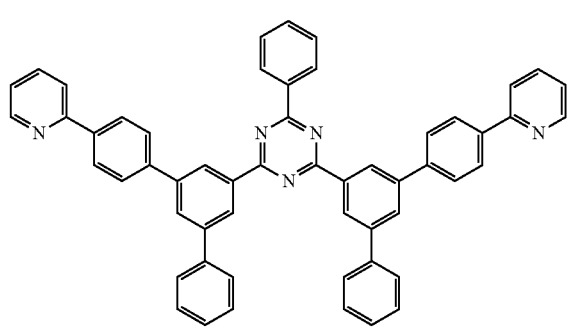
ET13
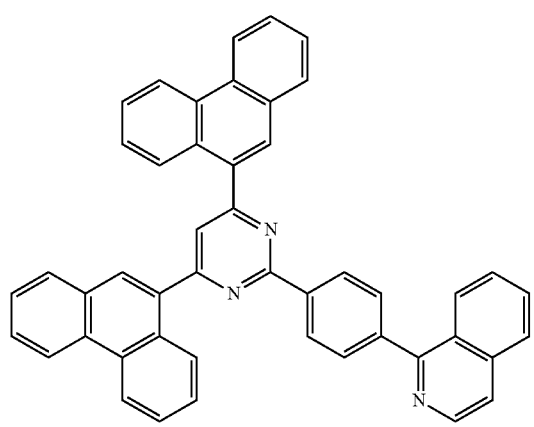
-continued
ET14
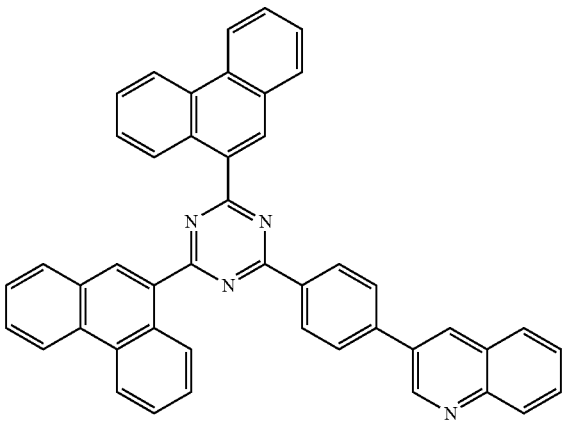
ET15
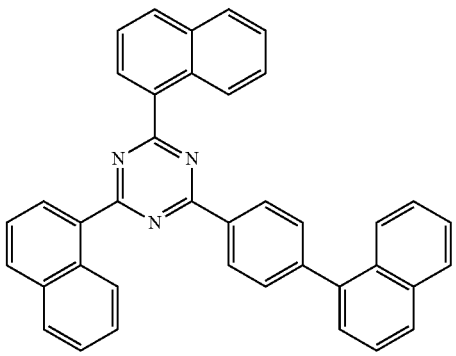
ET16
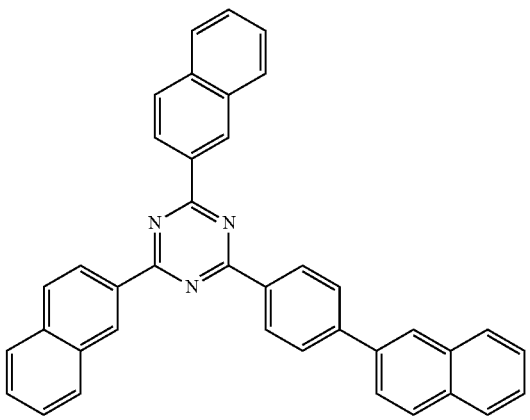

-continued
ET17
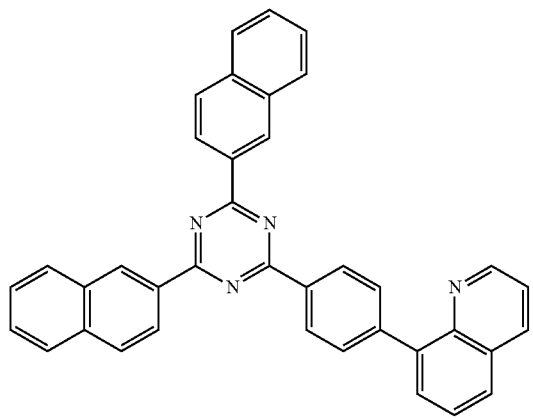
ET18
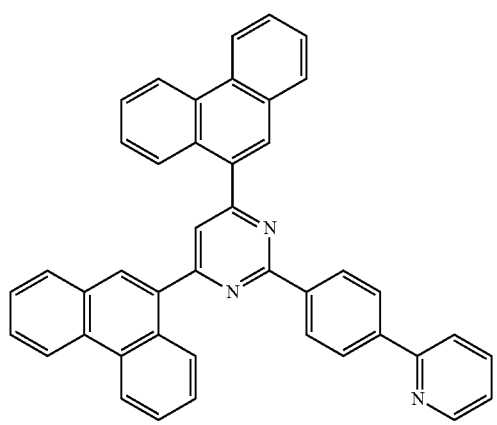
ET19
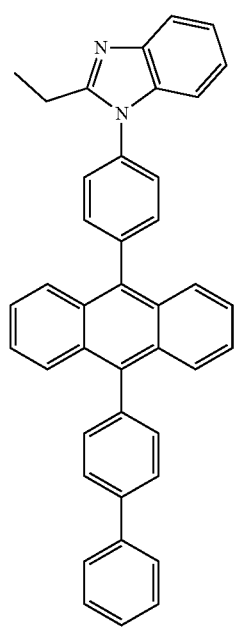
-continued
ET20
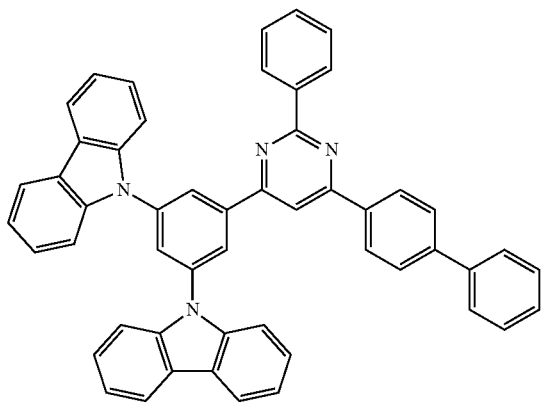
ET21
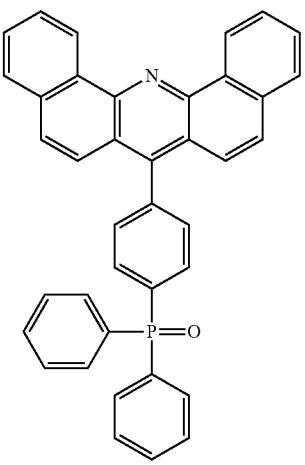
ET22
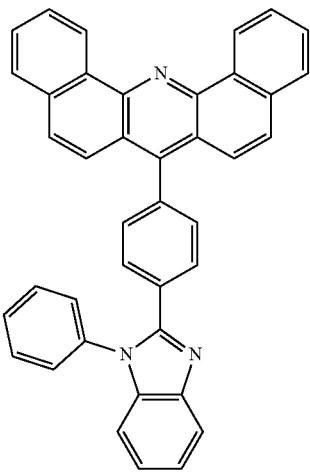

ET23

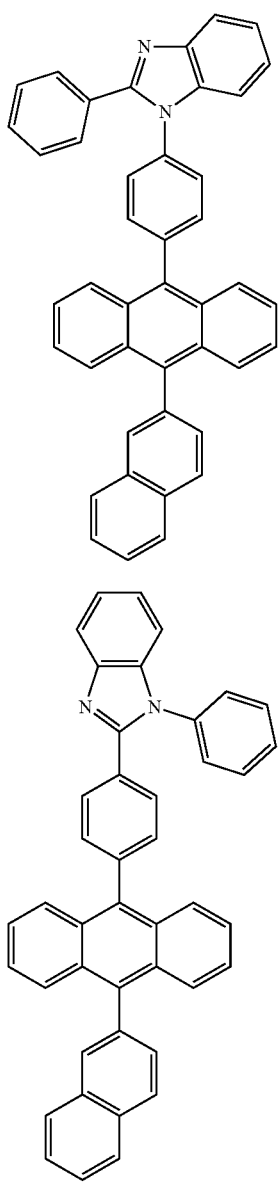

ET24

ET25

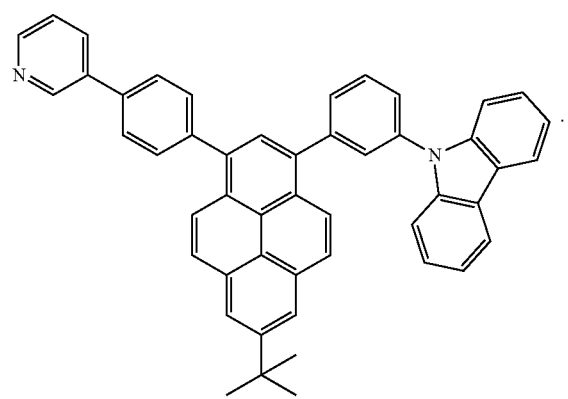

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

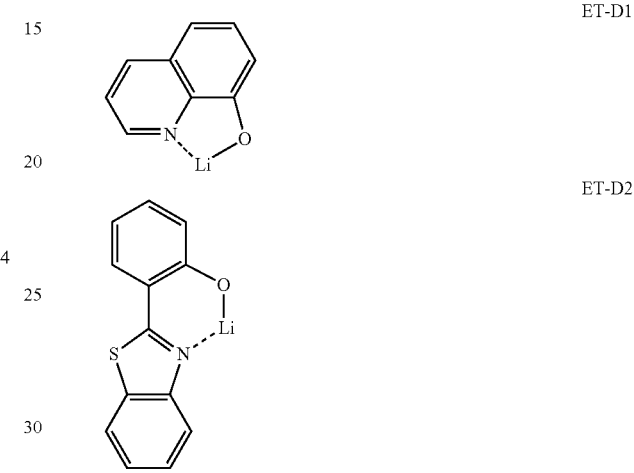

ET-D1

ET-D2

The electron transport region may include an electron injection layer (EIL) that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is located on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by -$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms, that has at least one carbon-carbon double bond in the ring thereof, and that is not aromatic. Non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and that has at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, P, Si, and S as a ring-forming atom, and 1 to 60 carbon atoms. The term "$C_1$-$C_6$ heteroarylene group" as used herein refers to a divalent group having a carbocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" used herein indicates —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, having only carbon atoms as ring-forming atoms, and that is not aromatic in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, having a heteroatom selected from N, O, P, Si, and S, other than carbon atoms, as a ring-forming atom, and that is not aromatic in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one of substituents of the substituted $C_5$-$C_{30}$ carbocyclic group, substituted $C_2$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1-C30 alkyl" refers to a C1-C30 alkyl group substituted with C6-C30 aryl group, the total number of carbon atoms in the resulting aryl substituted alkyl group is C7-C60.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples refers to that an identical molar equivalent of B was used in place of A.

EXAMPLE

Synthesis Example 1: Synthesis of Compound 123

Synthesis of Intermediate P2

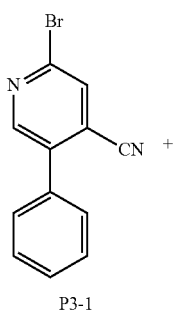

P3-1

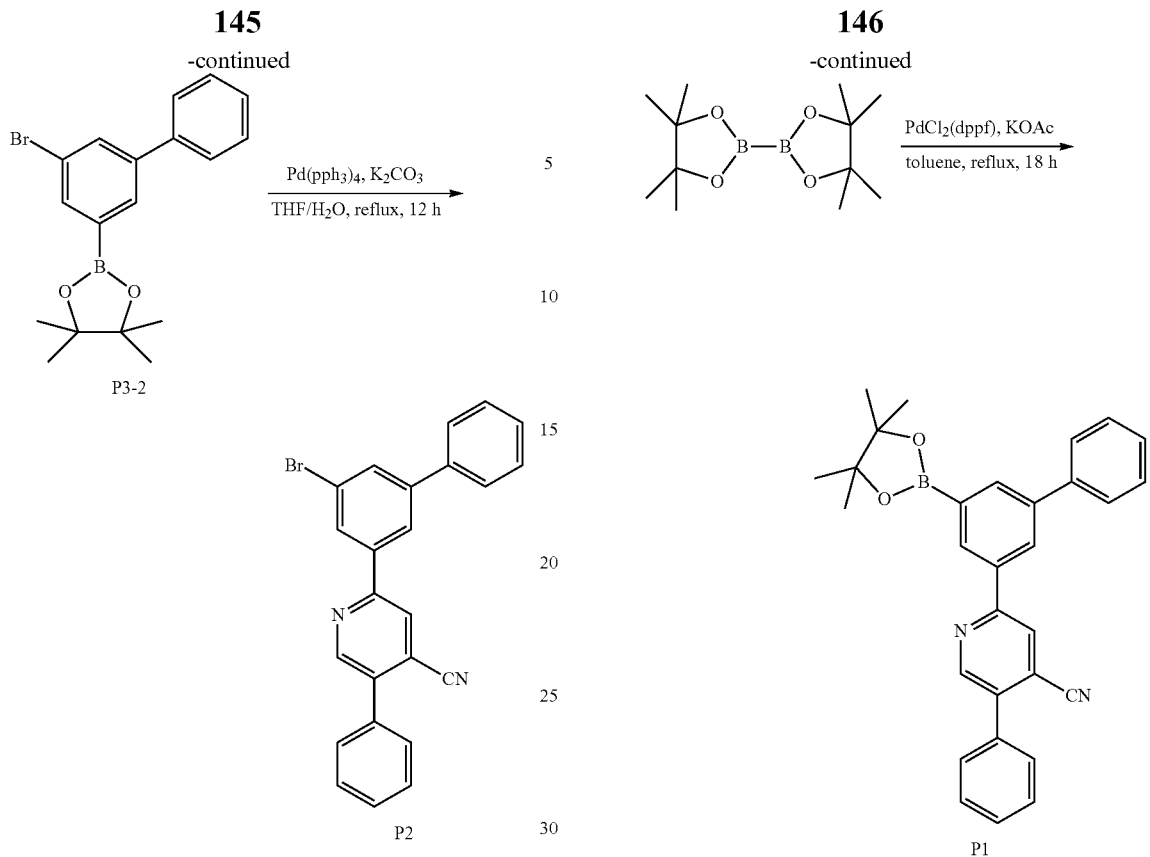

120 milliliters (mL) of tetrahydrofuran (THF) and 40 mL of distilled water were mixed with Compound P3-1 (5.3 grams (g), 20.5 millimoles, mmol), Compound P3-2 (7 g, 19.5 mmol), Pd(PPh$_3$)$_4$ (1.6 g, 1.4 mmol), and K$_2$CO$_3$ (8.1 g, 58.6 mmol), and the mixture was stirred under reflux for 12 hours. Once the reaction was completed, the temperature was lowered to room temperature, and the organic layer was extracted therefrom with methylene chloride (MC). The combined organic extracts were dried over anhydrous magnesium sulfate (MgSO$_4$) and filtered. The obtained filtrate was concentrated under reduced pressure, and the residue was purified by column chromatography using MC and hexane, thereby completing the preparation of 5.8 g (73%) of Intermediate P2.

Synthesis of Intermediate P1

Intermediate P2 (5.8 g, 14.18 mmol), 4,4,4',4',5,5,5',5'-octamethyl-2,2'-bi(1,3,2-dioxaborolane) (7.2 g, 28.36 mmol), PdCl$_2$(dppf) (0.83 g, 1.1 mmol), and potassium acetate (4.2 g, 42.5 mmol) were mixed with 300 mL of toluene, and the mixture was stirred under reflux for 18 hours. The temperature was lowered down to room temperature. The organic layer was extracted therefrom with MC, and the combined organic extracts were dried over anhydrous magnesium sulfate (MgSO$_4$) and filtered. The obtained filtrate was subjected to reduced pressure and the residue was purified by column chromatography using EA and hexane, thereby completing the preparation of 5.4 g (83%) of Intermediate P1.

Synthesis of Ligand 123L

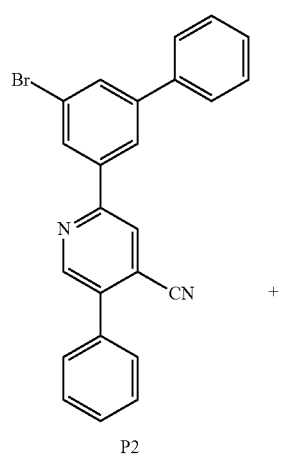

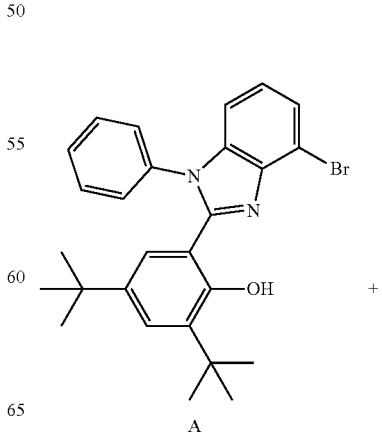

Synthesis of Compound 123

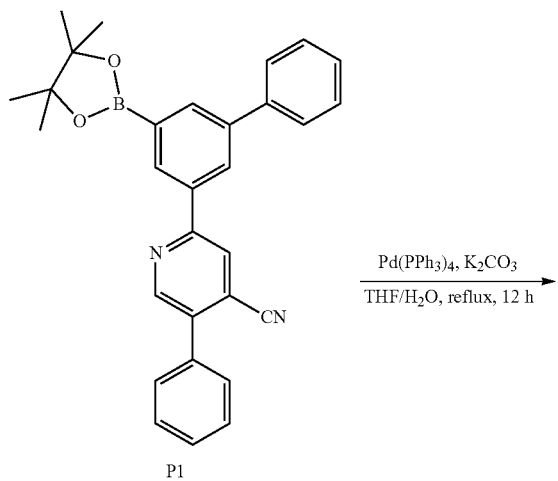

P1

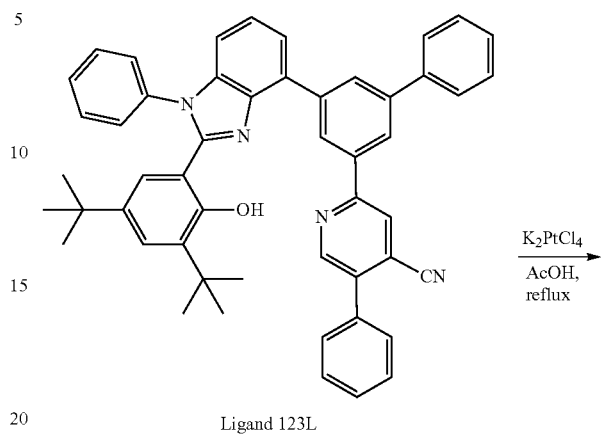

Ligand 123L

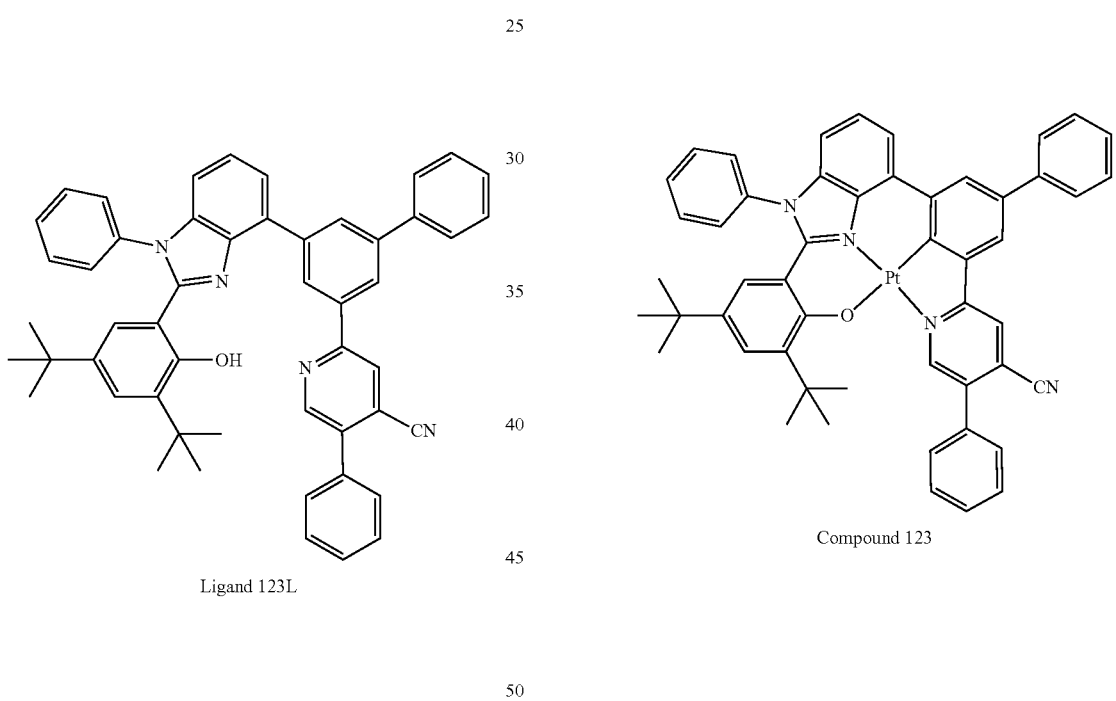

Ligand 123L

Compound 123

Compound A (1.4 g, 2.9 mmol), Intermediate P1 (1.3 g, 2.9 mmol), Pd(PPh$_3$)$_4$ (0.24 g, 0.2 mmol), and K$_2$CO$_3$ (1.2 g, 8.7 mmol) were mixed with 60 mL of THF and 20 mL of distilled water, and the mixture was stirred under reflux for 12 hours. After the temperature was lowered down to room temperature, the organic layer was extracted therefrom with MC. The combined organic extracts were dried over anhydrous magnesium sulfate (MgSO$_4$) and filtered. The obtained filtrate was concentrated under reduced pressure and the residue was purified by column chromatography using MC and hexane, thereby completing the preparation of 1.2 g (56%) of Ligand 123L.

Ligand 123L (1.2 g, 1.6 mmol) and K$_2$PtCl$_4$ (0.7 g, 1.8 mmol) were mixed with 50 mL of acetic acid, and the mixture was stirred under reflux for 18 hours to complete the reaction. Then, the temperature was lowered. The obtained solid was filtered, and the residue was purified by column chromatography using MC and hexane, thereby obtaining 0.56 g (37%) of Compound 123. The obtained product was confirmed by Mass and HPLC analysis.

HRMS (MALDI) calcd for C$_{51}$H$_{42}$N$_4$OPt: m/z 921.3006, Found: 921.3001

Synthesis Example 2: Compound 128

Synthesis of Ligand 128L

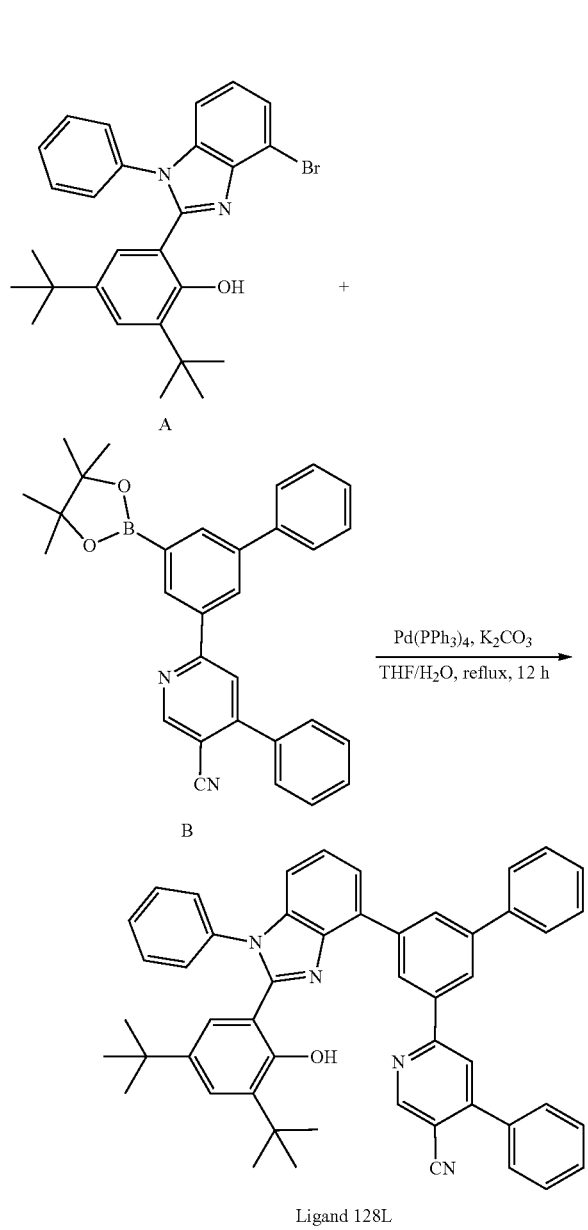

Compound A (2.1 g, 4.3 mmol), Compound B (2.0 g, 4.3 mmol), Pd(PPh$_3$)$_4$ (0.35 g, 0.3 mmol), and K$_2$CO$_3$ (1.8 g, 13.0 mmol) were mixed with 60 mL of THF and 20 mL of distilled water, and the mixture was stirred under reflux for 12 hours. After the temperature was lowered to room temperature, the organic layer was extracted therefrom with MC. The combined organic extracts were dried over anhydrous magnesium sulfate (MgSO$_4$) and filtered. The obtained filtrate was subjected to reduced pressure and the residue was purified by column chromatography using MC and hexane, thereby completing the preparation of 1.5 g (48%) of Ligand 128L.

Synthesis of Compound 128

Ligand 128L (1.5 g, 2.1 mmol) and K$_2$PtCl$_4$ (1.1 g, 2.3 mmol) were mixed with 60 mL of acetic acid, and the mixture was stirred under reflux for 18 hours to complete a reaction. Then, the temperature was lowered. The obtained solid was filtered, and the residue was purified by column chromatography using MC and hexane, thereby obtaining 1.0 g (53%) of Compound 128. The obtained product was confirmed by Mass and HPLC analysis.

HRMS (MALDI) calcd for C$_{51}$H$_{42}$N$_4$OPt: m/z 921.3006, Found: 921.2997

Example 1

A glass substrate with an ITO electrode thereon was cut to a size of 50 mm×50 mm×0.5 mm (mm=millimeter), sonicated in acetone, iso-propyl alcohol and pure water, each for 15 minutes, and washed by exposure to UV ozone for 30 minutes, thereby preparing an ITO electrode on the glass substrate.

Then, m-MTDATA was deposited on the ITO electrode on the glass substrate at a deposition rate of 1 Angstrom per second (Å/sec) to form a hole injection layer having a thickness of 600 Angstroms (Å), and α-NPD (NPB) was deposited on the hole injection layer at a deposition rate of 1 Å/sec to form a hole transport layer having a thickness of 250 Å.

Compound 123 (dopant) and CBP (host) were co-deposited on the hole transport layer at deposition rates of 0.1 Å/sec and 1 Å/sec, respectively, to form an emission layer having a thickness of 400 Å.

BAlq was deposited on the emission layer at a deposition rate of 1 Å/sec to form a hole blocking layer having a thickness of 50 Å, Alq$_3$ was deposited on the hole blocking layer to form an electron transport layer having a thickness of 300 Å, LiF was deposited on the electron transport layer to form an electron injection layer having a thickness of 10 Å, and Al was vacuum-deposited on the electron injection layer to form a second electrode (cathode) having a thickness of 1,200 Å, thereby completing the manufacture of an organic light-emitting device having the structure of ITO/m-MTDATA (600 Å)/α-NPD (250 Å)/CBP+Compound 123 (10%) (400 Å)/Balq(50 Å)/Alq$_3$(300 Å)/LiF(10 Å)/Al(1,200 Å).

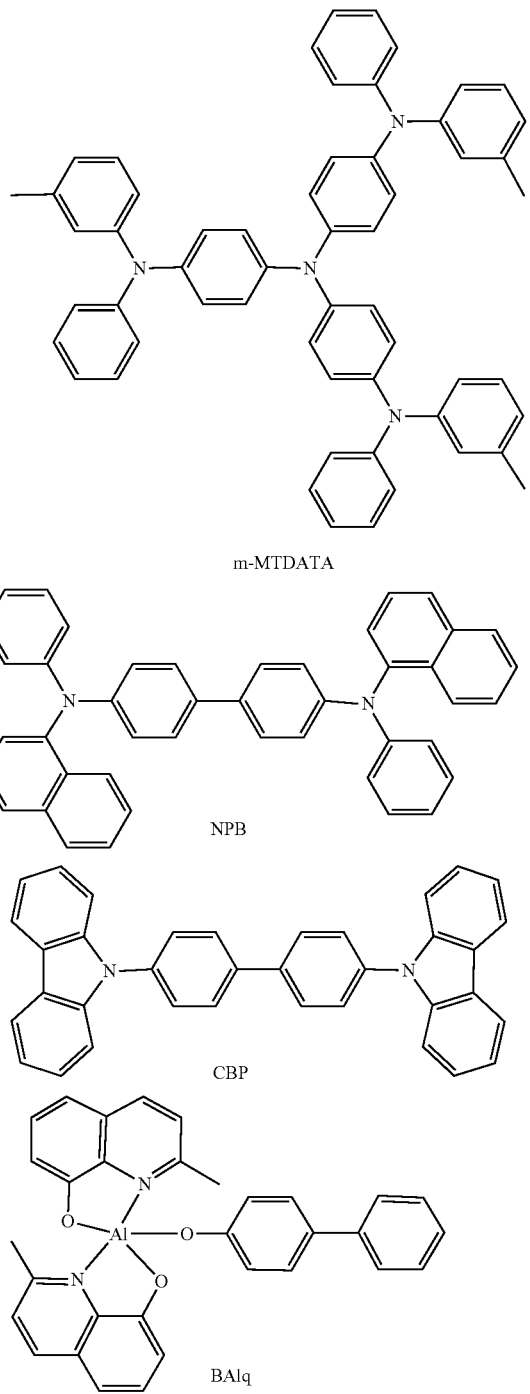

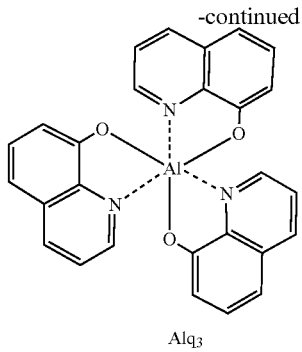

Alq$_3$

Example 2 and Comparative Example 1

Organic light-emitting devices were manufactured in the same manner as in Example 1, except that in forming an emission layer, for use as a dopant, corresponding compounds shown in Table 2 were used instead of Compound 123.

Evaluation Example 1: Evaluation on Characteristics of Organic Light-Emitting Devices The driving voltage, the luminescent quantum efficiency, the roll-off ratio, and the lifespan ($T_{95}$) of each of the organic light-emitting devices manufactured according to Examples 1 and 2 and Comparative Example 1 were evaluated and the results are shown in Table 2. As evaluation devices, a current-voltage meter (Keithley 2400) and a luminance meter (Minolta Cs-1000A) were used, and the lifetime ($T_{95}$) (at 6000 nit) was a relative value of the time taken when the luminance becomes 95% of the initial luminance 100% with respect to the lifespan ($T_{95}$) of Example 1. The roll-off ratio was calculated by the following equation:

Roll off={1−(efficiency(at 9000 nit)/maximum luminescent efficiency)}×100%   Equation 20

TABLE 2

| Dopant | Driving voltage Voltage (V) | Luminescent quantum Efficiency (%) | Roll-off ratio (%) | Lifespan (relative value) ($T_{95}$) |
|---|---|---|---|---|
| Example 1 | Compound 123 | 4.26 | 22.6 | 10% | 100% |
| Example 2 | Compound 128 | 4.21 | 25.2 | 13% | 112% |
| Comparative Example 1 | Compound A | 4.57 | 18.7 | 11% | 17% |

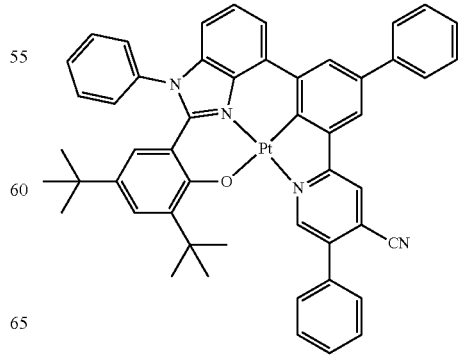

TABLE 2-continued

| Dopant | Driving voltage Voltage (V) | Luminescent quantum Efficiency (%) | Roll-off ratio (%) | Lifespan (relative value) (T$_{95}$) |
|---|---|---|---|---|

123

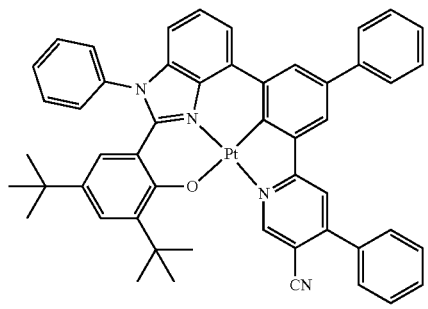

128

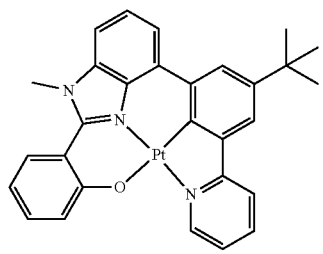

A

From Table 2, it can be seen that the organic light-emitting devices of Examples 1 and 2 have better characteristics than the organic light-emitting device of Comparative Example 1 in terms of driving voltage, luminescent quantum efficiency, roll-off ratio, and lifespan.

The organometallic compound according to embodiments has excellent electric characteristics and thermal stability. Accordingly, an organic light-emitting device including the organometallic compound may have excellent characteristics in terms of driving voltage, efficiency, power, color purity, and lifespan. The organometallic compound has excellent phosphorescent luminescent characteristics. Accordingly, the organometallic compound can provide a diagnostic composition having high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. An organometallic compound represented by Formula 1

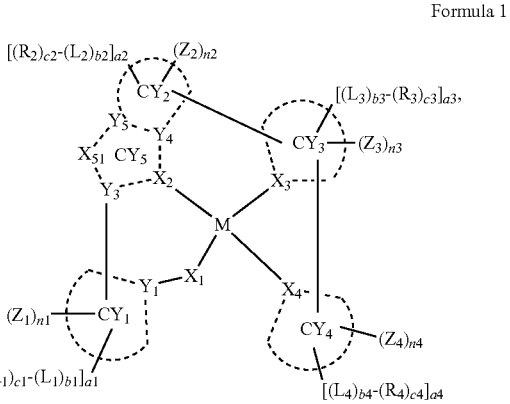

Formula 1 wherein, in Formula 1,

M is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ is a chemical bond, O, S, N(R'), P(R'), B(R'), C(R') (R''), Si(R')(R''), or N(R')(R'') and when $X_1$ is a chemical bond, $Y_1$ is directly bonded with M, a bond between $X_1$ and M is a covalent bond, $X_2$ and $X_4$ are each independently N and $X_3$ is C, a bond between $X_2$ and M and a bond between $X_4$ and M are coordinate bonds and a bond between $X_3$ and M is a covalent bond, $Y_1$ and $Y_3$ to $Y_5$ are each independently C or N, regarding a pair of $X_2$ and $Y_3$, a pair of $X_2$ and $Y_4$, a pair of $Y_4$ and $Y_5$, a pair of $X_{51}$ and $Y_3$, and a pair of $X_{51}$ and $Y_5$, components constituting each pair are connected to each other via a chemical bond, $CY_1$ to $CY_5$ are each independently selected from a $C_5$-$C_{30}$ carbocyclic group and a $C_1$-$C_{30}$ heterocyclic group, provided that $CY_4$ is not a benzimidazole group, a benzoxazole group, or a benzothiazole group, provided that when $CY_1$ and $CY_2$ are each a benzene group, then $CY_3$ and $CY_4$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, phenanthroline group, a pyrrole group, a pyrazole group, group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline, and (A) or (B) is true:

(A) the sum of a1, a2, a3, and a4 is at least 3 and the at least three of RI to R4 are not hydrogen, (B) the sum of a1, a2, a3, and a4 is at least 1 and the at least one of R1 to R4 is an unsubstituted phenyl group or a tert-butyl group, a cyclometalated ring formed by $CY_5$, $CY_2$, $CY_3$, and M is a 6-membered ring, $X_{51}$ is selected from O, S, N-$[(L_7)_{b7}$-$(R_7)_{c7}]$, $C(R_7)(R_8)$, $Si(R_7)(R_8)$, $Ge(R_7)(R_8)$, C($=$O), N, $C(R_7)$, $Si(R_7)$, and $Ge(R_7)$, $R_7$ and $R_8$ are optionally bonded to each other via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ are each independently selected from a single bond, a substituted or unsubstituted $C_5$-$C_{30}$ carbocyclic group, and a substituted or unsubstituted $C_1$-$C_{30}$ heterocyclic group, b1 to b4 and b7 are each independently an integer from 1 to 5, $R_1$ to $R_4$, $R_7$, $R_8$, R', and R" are each independently selected from hydrogen, deuterium, —F, —Cl, —Br, —I, —SF5, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q1)(Q2), —Si(Q3)(Q4)(Q5), —B(Q6)(Q7), and —P($=$O)(Q8)(Q9), c1 to c4 and c7 are each independently an integer from 1 to 5, $Z_1$ to $Z_4$ are each independently a cyano group (CN)-containing group, a1 to a4 and n1, n2, n3, and n4 are each independently an integer from 0 to 20, two of a plurality of neighboring groups $R_1$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_2$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_3$ are optionally linked to form a substituted or unsubstituted $C_5$-$C_{30}$ carbocyclic group or a substituted or unsubstituted $C_1$-$C_{30}$ heterocyclic group, two of a plurality of neighboring groups $R_4$ are optionally linked to form a substituted or unsubstituted $C_5$-$C_{30}$ carbocyclic group or a substituted or unsubstituted $C_1$-$C_{30}$ heterocyclic group, two or more neighboring substituents selected from groups $R_1$ to $R_4$, $R_7$, and $R_8$ are optionally linked to form a substituted or unsubstituted $C_5$-$C_{30}$ carbocyclic group or a substituted or unsubstituted $C_1$-$C_{30}$ heterocyclic group, i) when $X_{51}$ is O, S, C($=$O), or N, the sum of n1, n2, n3, and n4 is 1 or more, ii) when $X_{51}$ is $N[(L_7)_{b7}$-$(R_7)_{c7}]$, $C(R_7)$, $Si(R_7)$, or $Ge(R_7)$, $R_7$ is a cyano group-containing group or the sum of n1, n2, n3, and n4 is 1 or more, iii) when $X_{51}$ is $C(R_7)(R_8)$, $Si(R_7)(R_8)$, or $Ge(R_7)(R_8)$, at least one selected from $R_7$ and $R_8$ is a cyano group-containing group or the sum of n1, n2, n3, and n4 is 1 or more, at least one of substituents of the substituted $C_5$-$C_{30}$ carbocyclic group, substituted $C_1$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P($=$O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), and —P(=O)(Q$_{28}$)(Q$_{29}$); and
—N(Q$_{31}$)(Q$_{32}$), —Si(Q$_{33}$)(Q$_{34}$)(Q$_{35}$), —B(Q$_{36}$)(Q$_{37}$), and —P(=O)(Q$_{38}$)(Q$_{39}$), wherein Q$_1$ to Q$_9$, Q$_{11}$ to Q$_{19}$, Q$_{21}$ to Q$_{29}$, and Q$_{31}$ to Q$_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_1$-C$_{60}$ alkyl group substituted with at least one selected from deuterium, a C$_1$-C$_{60}$ alkyl group, and a C$_6$-C$_{60}$ aryl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_6$-C$_{60}$ aryl group substituted with at least one selected from deuterium, a C$_1$-C$_{60}$ alkyl group, and a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, and a monovalent non-aromatic condensed heteropolycyclic group.

2. The organometallic compound of claim 1, wherein CY$_1$ to CY$_4$ are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline.

3. The organometallic compound of claim 1, wherein
i) Y$_3$ to Y$_5$ are each C, a bond between X$_{51}$ and Y$_3$ and a bond between X$_{51}$ and Y$_5$ are each a single bond, and X$_{51}$ is O, S, N-[(L$_7$)$_{b7}$-(R$_7$)$_{c7}$], C(R$_7$)(R$_8$), Si(R$_7$)(R$_8$), Ge(R$_7$)(R$_8$), or C(=O),
ii) Y$_3$ and Y$_4$ are each C, Y$_5$ is N, a bond between X$_{51}$ and Y$_3$ is a double bond, a bond between X$_{51}$ and Y$_5$ is a single bond, and X$_{51}$ is N, C(R$_7$), Si(R$_7$), or Ge(R$_7$),
iii) Y$_3$ and Y$_5$ are each C, Y$_4$ is N, a bond between X$_{51}$ and Y$_3$ is a single bond, a bond between X$_{51}$ and Y$_5$ is a double bond, and X$_{51}$ is N, C(R$_7$), Si(R$_7$), or Ge(R$_7$),
iv) Y$_3$ is N, Y$_4$ and Y$_5$ are each C, a bond between X$_{51}$ and Y$_3$ is a single bond, a bond between X$_{51}$ and Y$_5$ is a double bond, and X$_{51}$ is N, C(R$_7$), Si(R$_7$), or Ge(R$_7$), or
v) Y$_3$ to Y$_5$ are each C, a bond between X$_{51}$ and Y$_3$ is a double bond, a bond between X$_{51}$ and Y$_5$ is a single bond, and X$_{51}$ is N, C(R$_7$), Si(R$_7$), or Ge(R$_7$).

4. The organometallic compound of claim 1, wherein R$_1$ to R$_4$, R$_7$, R$_8$, R', and R" are each independently selected from: hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, C$_1$-C$_{20}$ alkyl group, and a C$_1$-C$_{20}$ alkoxy group;

a C$_1$-C$_{20}$ alkyl group and a C$_1$-C$_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from; and deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —Si(Q$_{33}$)(Q$_{34}$)(Q$_{35}$), and —N(Q$_1$)(Q$_2$), —Si(Q$_3$)(Q$_4$)(Q$_5$), —B(Q$_6$)(Q$_7$) and —P(=O)(Q$_8$)(Q$_9$), wherein Q$_1$ to Q$_9$ and Q$_{33}$ to Q$_{35}$ are each independently selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a C$_1$-C$_{10}$ alkyl group, and a phenyl group.

5. The organometallic compound of claim 1, wherein R$_1$ to R$_4$, R$_7$, R$_8$, R', and R" are each independently selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, —C(CD$_3$)$_3$, groups represented by Formulae 9-1 to 9-19, groups represented by Formulae 10-1 to 10-140, —N(Q$_1$)(Q$_2$), —Si(Q$_3$)(Q$_4$)(Q$_5$), —B(Q$_6$)(Q$_7$), and —P(=O)(Q$_8$)(Q$_9$):

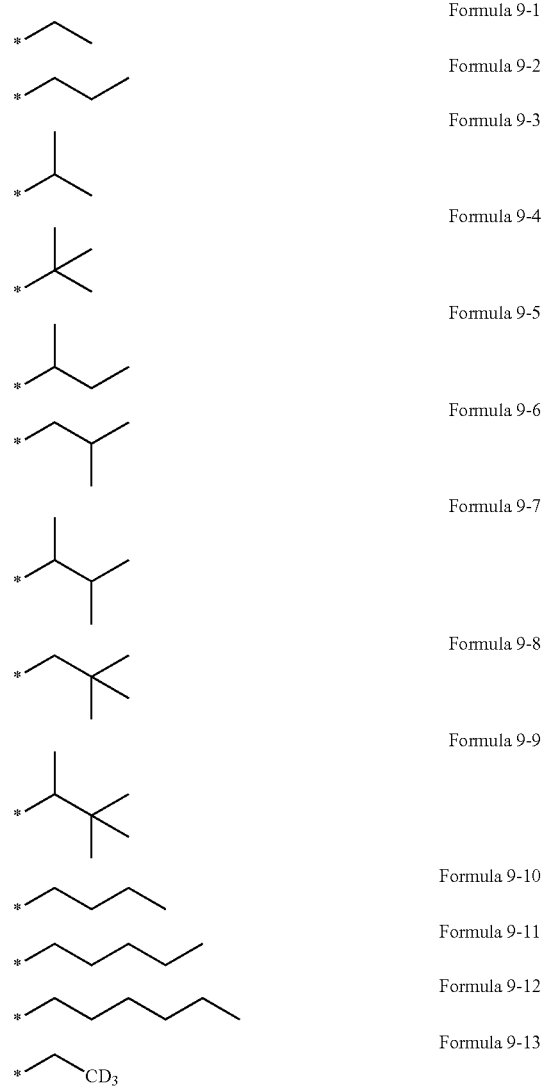

161
-continued
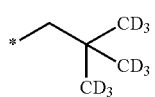
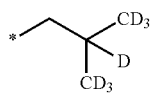
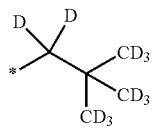
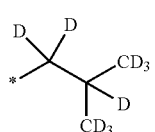
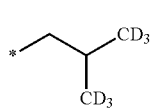
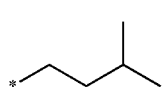
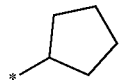
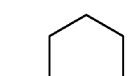
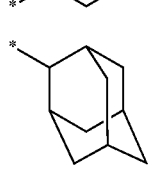
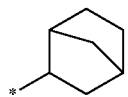
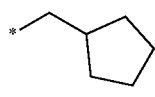
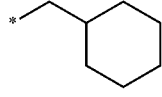
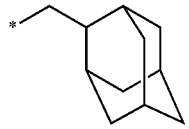
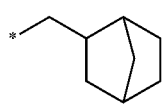
162
-continued
Formula 9-14
Formula 9-15
Formula 9-16
Formula 9-17
Formula 9-18
Formula 9-19
Formula 10-1
Formula 10-2
Formula 10-3
Formula 10-4
Formula 10-5
Formula 10-6
Formula 10-7
Formula 10-8
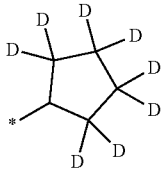
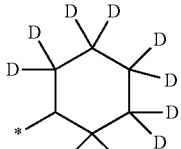
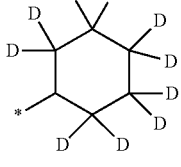
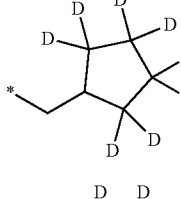
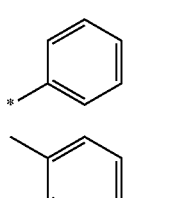
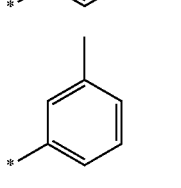
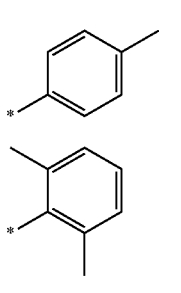
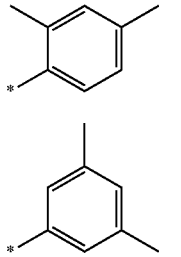
Formula 10-9
Formula 10-10
Formula 10-11
Formula 10-12
Formula 10-13
Formula 10-14
Formula 10-15
Formula 10-16
Formula 10-17
Formula 10-18
Formula 10-19

163
-continued
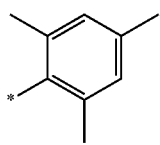
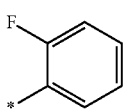
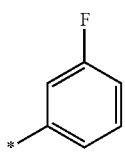
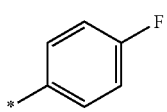
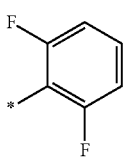
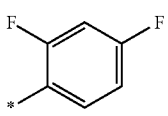
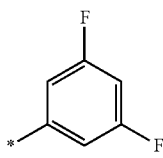
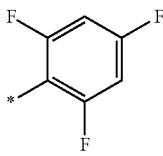
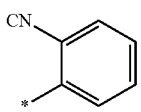
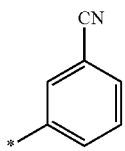
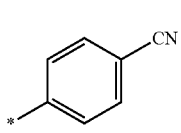
164
-continued
Formula 10-20
Formula 10-21
Formula 10-22
Formula 10-23
Formula 10-24
Formula 10-25
Formula 10-26
Formula 10-27
Formula 10-28
Formula 10-29
Formula 10-30
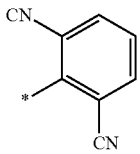
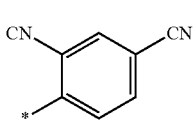
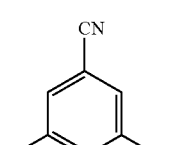
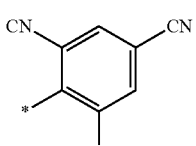
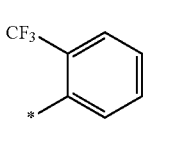
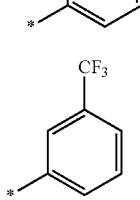
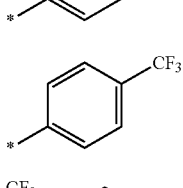
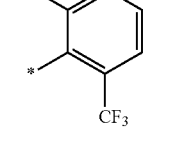
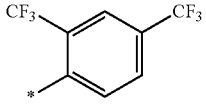
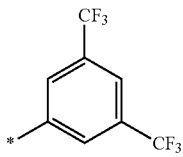
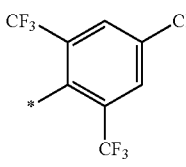
Formula 10-31
Formula 10-32
Formula 10-33
Formula 10-34
Formula 10-35
Formula 10-36
Formula 10-37
Formula 10-38
Formula 10-39
Formula 10-40
Formula 10-41

-continued
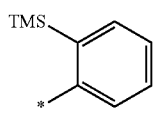
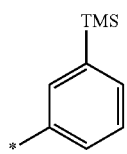
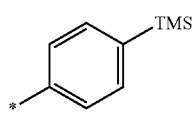
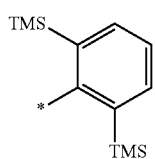
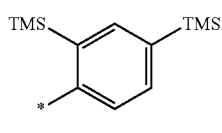
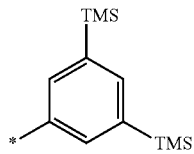
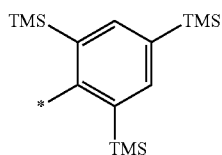
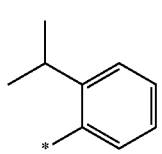
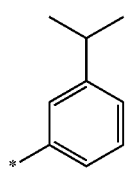
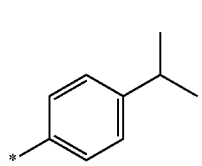
-continued
Formula 10-42
Formula 10-43
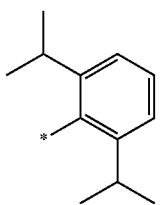
Formula 10-44
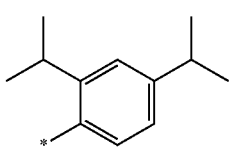
Formula 10-45
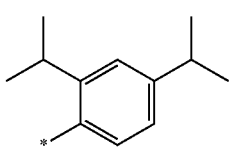
Formula 10-46
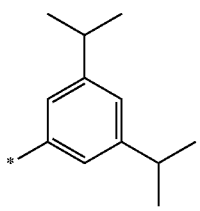
Formula 10-47
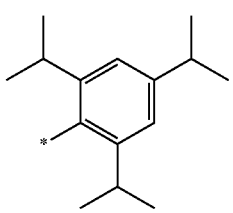
Formula 10-48
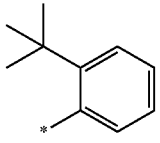
Formula 10-49
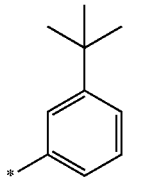
Formula 10-50
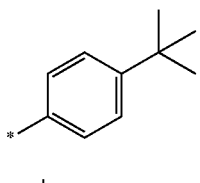
Formula 10-51
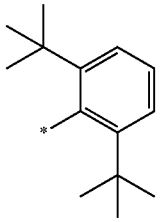
Formula 10-52
Formula 10-53
Formula 10-54
Formula 10-55
Formula 10-56
Formula 10-57
Formula 10-58
Formula 10-59

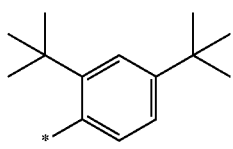
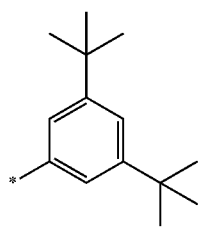
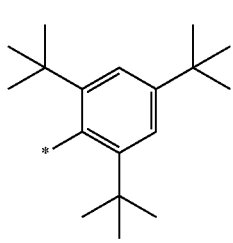
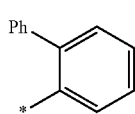
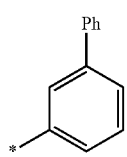
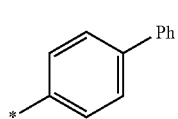
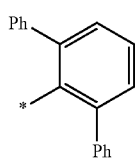
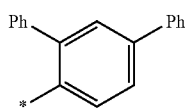
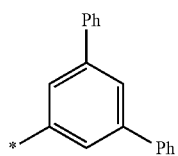
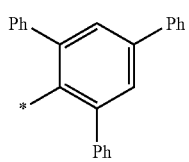
Formula 10-60
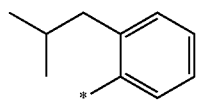
Formula 10-61
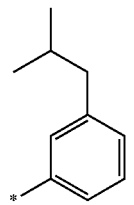
Formula 10-62
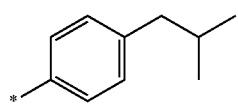
Formula 10-63
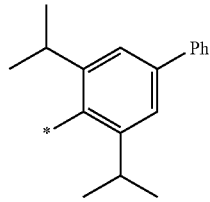
Formula 10-64
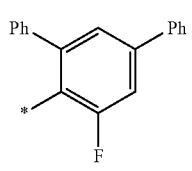
Formula 10-65
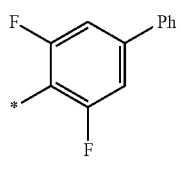
Formula 10-66
Formula 10-67
Formula 10-68
Formula 10-69
Formula 10-70
Formula 10-71
Formula 10-72
Formula 10-73
Formula 10-74
Formula 10-75
Formula 10-76
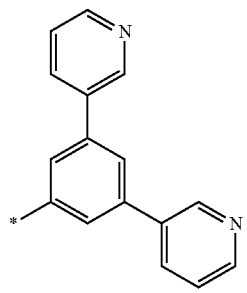
Formula 10-77
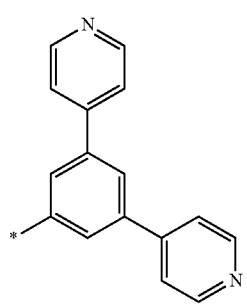

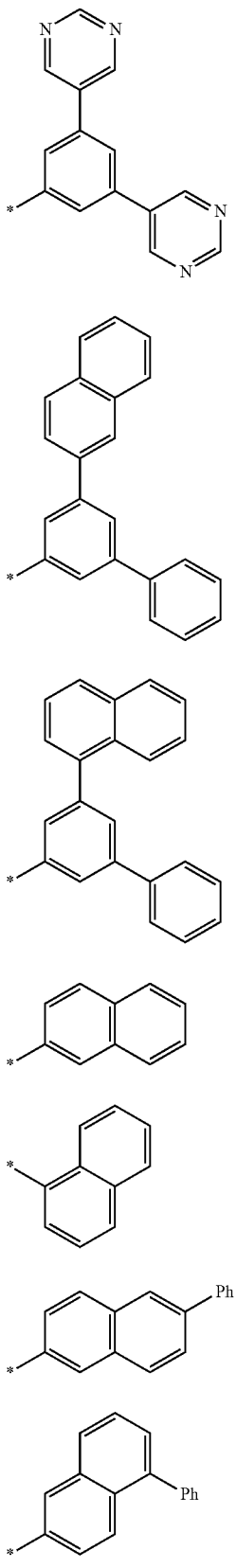
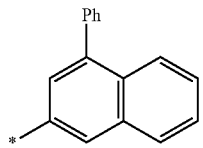
Formula 10-85
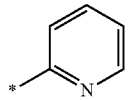
Formula 10-86
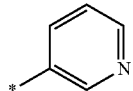
Formula 10-87
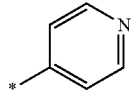
Formula 10-88
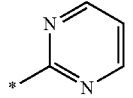
Formula 10-89
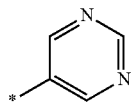
Formula 10-90
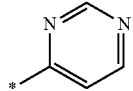
Formula 10-91
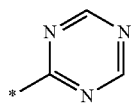
Formula 10-92
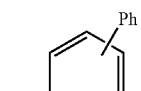
Formula 10-93
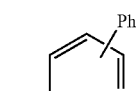
Formula 10-94
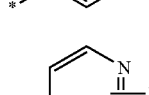
Formula 10-95
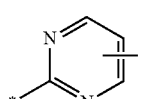
Formula 10-96
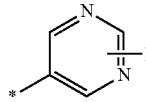
Formula 10-97
Formula 10-78
Formula 10-79
Formula 10-80
Formula 10-81
Formula 10-82
Formula 10-83
Formula 10-84

-continued
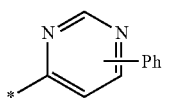
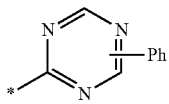
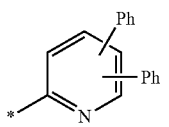
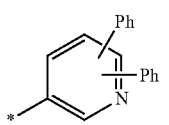
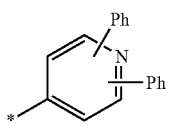
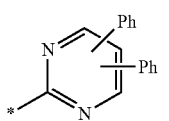
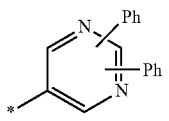
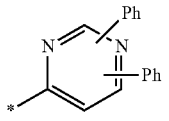
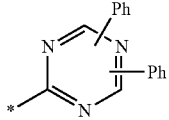
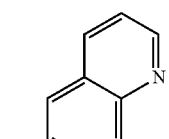
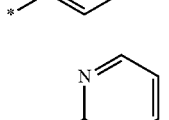
-continued
Formula 10-98
Formula 10-99
Formula 10-100
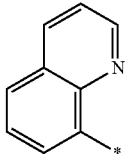
Formula 10-101
Formula 10-102
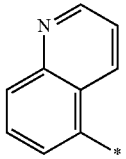
Formula 10-103
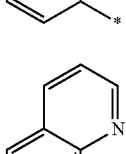
Formula 10-104
Formula 10-105
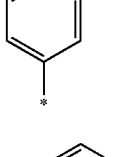
Formula 10-106
Formula 10-107
Formula 10-108
Formula 10-109
Formula 10-110
Formula 10-111
Formula 10-112
Formula 10-113
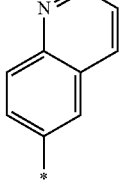
Formula 10-114
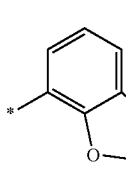
Formula 10-115
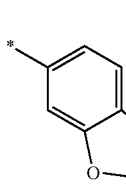
Formula 10-116
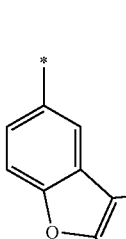

-continued
Formula 10-117
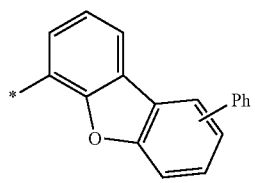
Formula 10-118
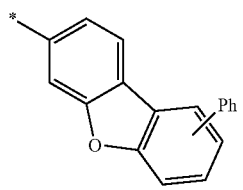
Formula 10-119
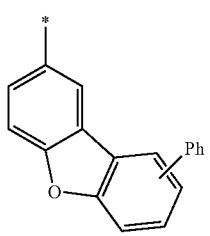
Formula 10-120
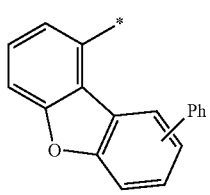
Formula 10-121
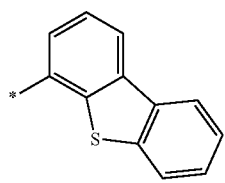
Formula 10-122
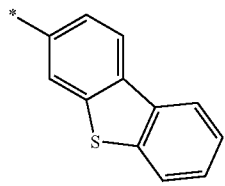
Formula 10-123
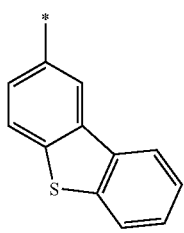
Formula 10-124
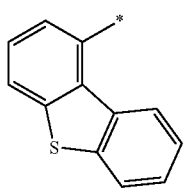
-continued
Formula 10-125
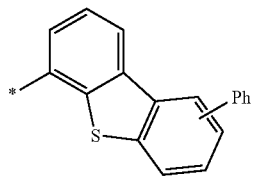
Formula 10-126
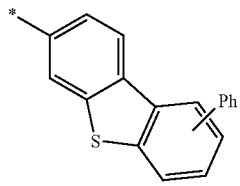
Formula 10-127
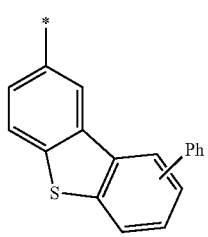
Formula 10-128
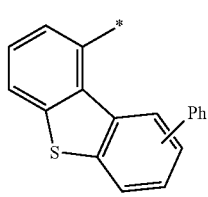
Formula 10-129
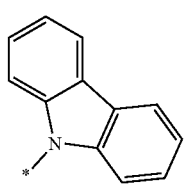
Formula 10-130
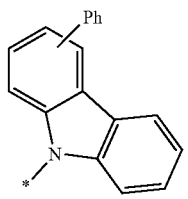
Formula 10-131
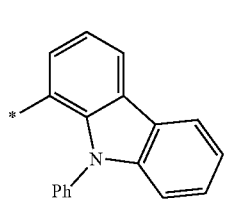
Formula 10-132
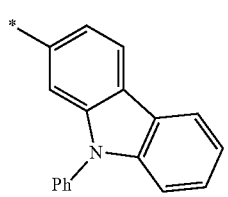

-continued

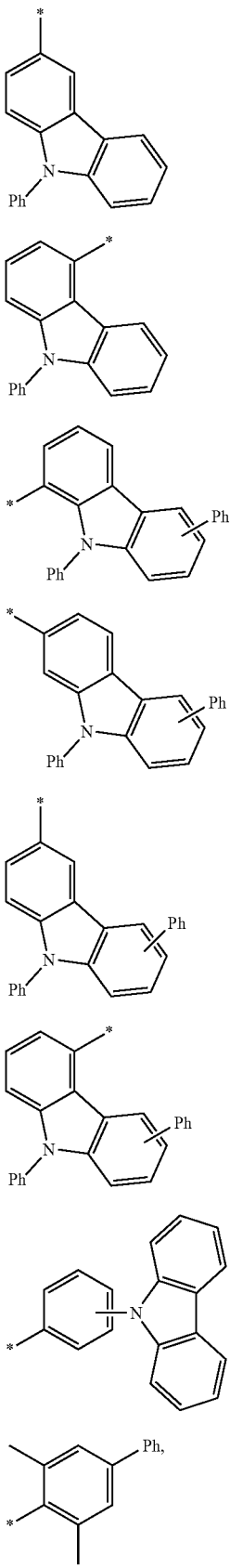

Formula 10-133

Formula 10-134

Formula 10-135

Formula 10-136

Formula 10-137

Formula 10-138

Formula 10-139

Formula 10-140 wherein, in Formulae 9-1 to 9-19 and 10-1 to 10-140,
* indicates a binding site to a neighboring atom,
"Ph" indicates a phenyl group, and
"TMS" indicates a trimethylsilyl group.

6. The organometallic compound of claim 1, wherein the cyano group-containing group is a cyano group or a first group substituted with at least one cyano group, wherein the first group is selected from a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

7. The organometallic compound of claim 1, wherein the sum of n1, n2, n3, and n4 is 1, 2, 3, or 4.

8. The organometallic compound of claim 1, wherein
i) n1=n2=n3=0, and n4=1,
ii) n1=n2=n4=0, and n3=1,
iii) n1=n3=n4=0, and n2=1,
iv) n2=n3=n4=0, and n1=1,
v) n1=n2=0, and n3=n4=1,
vi) n2=n3=0, and n1=n4=1,
vii) n2=n4=0, and n1=n3=1, or
viii) n1=n3=0, and n2=n4=1.

9. The organometallic compound of claim 1, wherein
i) $X_1$ is a chemical bond, and a moiety represented by

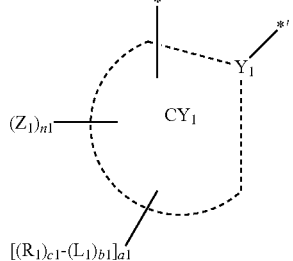

is a group represented by Formula CY1-B, or
ii) $X_1$ is O, S, N(R'), P(R'), B(R'), C(R')(R"), Si(R')(R"), or N(R')(R"), and a moiety represented by

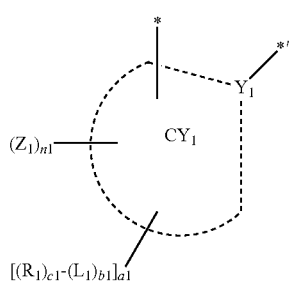

is a group represented by Formula CY1-A:

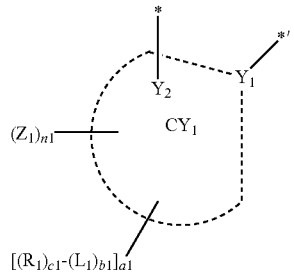

Formula CY1-A

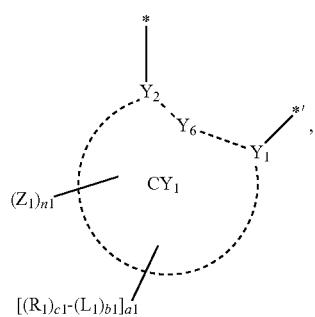

Formula CY1-B wherein, in Formulae CY1-A and CY1-B, $Y_1$, $CY_1$, $L_1$, b1, $R_1$, c1, a1, $Z_1$, and n1 are the same as described in connection with claim 1, $Y_2$ and $Y_6$ are each independently N or C, and a bond between $Y_1$ and $Y_2$, a bond between $Y_1$ and $Y_6$, and a bond between $Y_6$ and $Y_2$ are each a chemical bond.

10. The organometallic compound of claim 1, wherein a moiety represented by

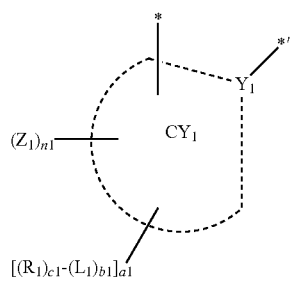

in Formula 1 is a group represented by one of Formulae CY1-1 to CY1-40:

Formula CY1-1

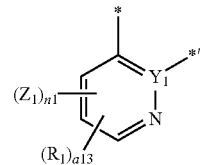

Formula CY1-2

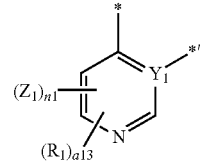

Formula CY1-3

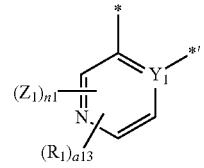

Formula CY1-4

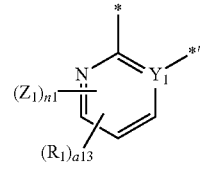

Formula CY1-5

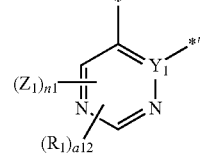

Formula CY1-6

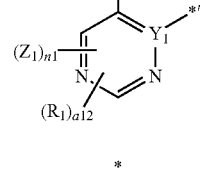

Formula CY1-7

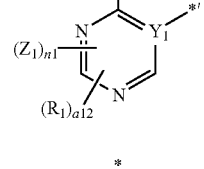

Formula CY1-8

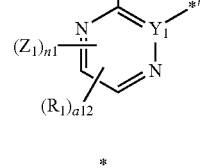

Formula CY1-9

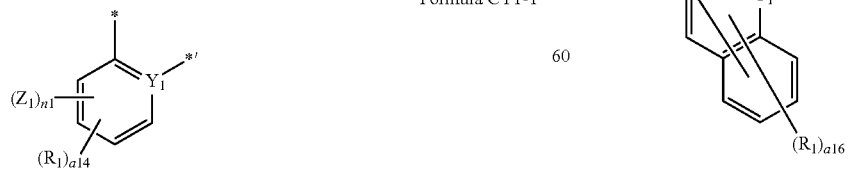

Formula CY1-10
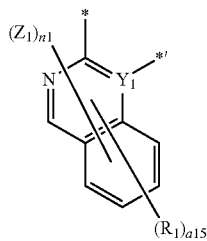
Formula CY1-11
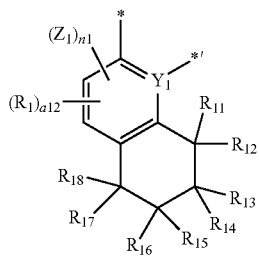
Formula CY1-12
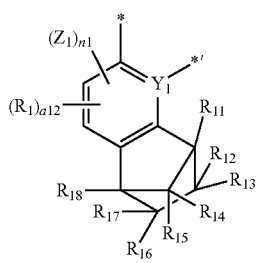
Formula CY1-13
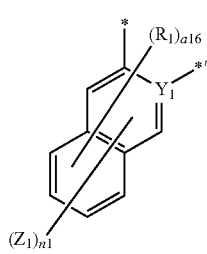
Formula CY1-14
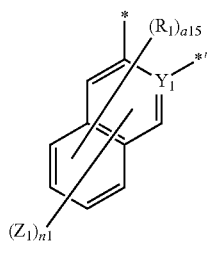
Formula CY1-15
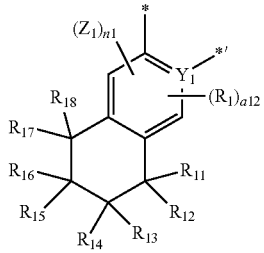
Formula CY1-16
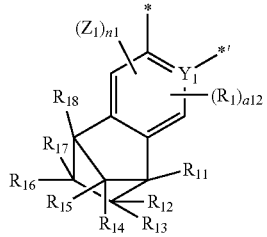
Formula CY1-17
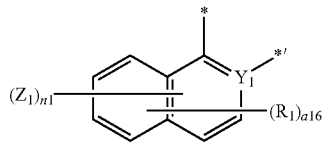
Formula CY1-18
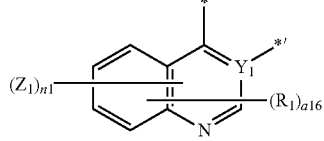
Formula CY1-19
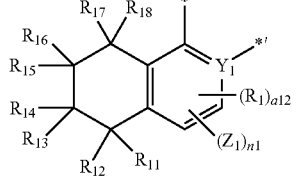
Formula CY1-20
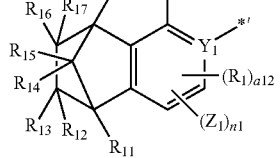
Formula CY1-21
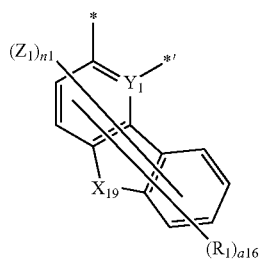
Formula CY1-22
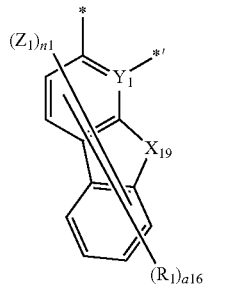

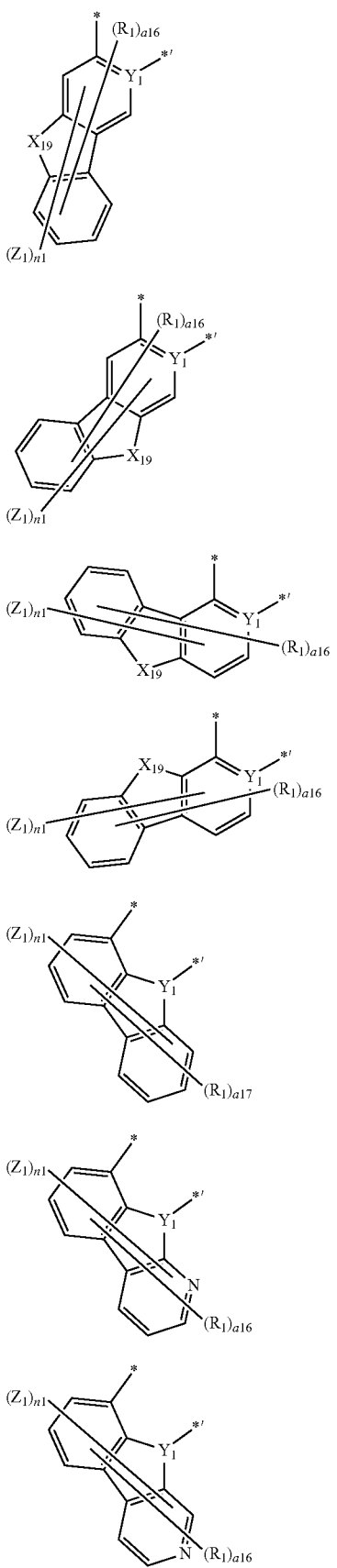
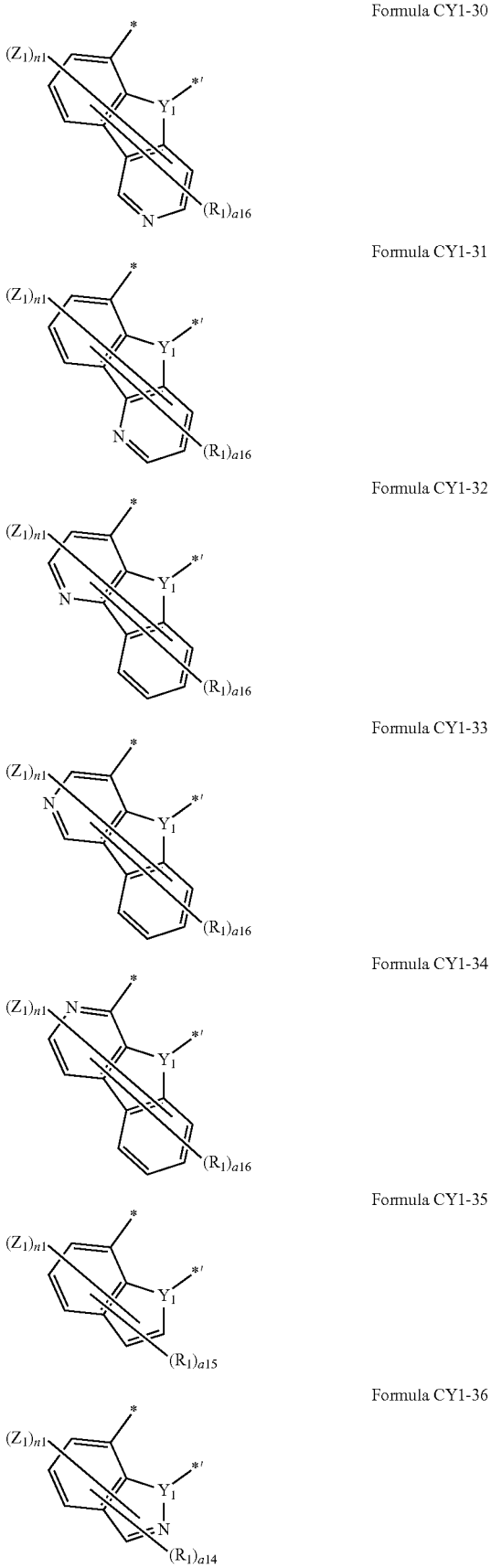

-continued

Formula CY1-37

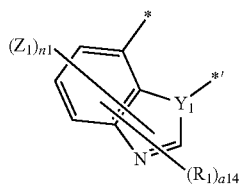

Formula CY1-38

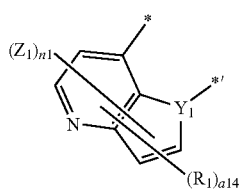

Formula CY1-39

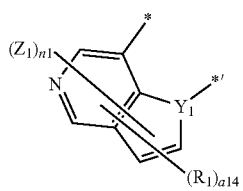

Formula CY1-40

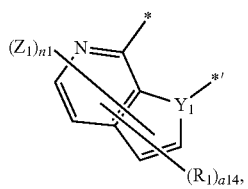

wherein, in Formulae CY1-1 to CY1-40,
$Y_1$, $R_1$, $Z_1$, and n1 are the same as described in connection with claim 1, n1 is 0, 1, or 2,
$X_{19}$ is $C(R_{19a})(R_{19b})$, $N[(L_{19})_{b19}-(R_{19})_{c19}]$, O, S, or $Si(R_{19a})(R_{19b})$,
$L_{19}$ is the same as described in connection with $L_1$ in claim 1,
b19 and c19 are the same as described in connection with b1 and c1 in claim 1, respectively,
$R_{11}$ to $R_{19}$, $R_{19a}$, and $R_{19b}$ are the same as described in connection with $R_1$ in claim 1,
a12 is an integer from 0 to 2,
a13 is an integer from 0 to 3,
a14 is an integer from 0 to 4,
a15 is an integer from 0 to 5,
a16 is an integer from 0 to 6,
a17 is an integer from 0 to 7,
*' indicates a binding site to M in Formula 1, and
* indicates a binding site to $CY_5$ in Formula 1.

11. The organometallic compound of claim 1, wherein a moiety represented by

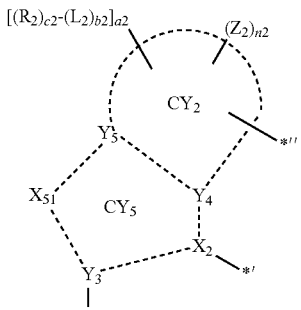

in Formula 1 is a group represented by one of Formulae CY2-1 to CY2-20:

Formula CY2-1

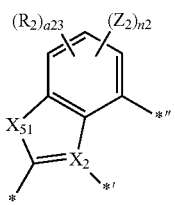

Formula CY2-2

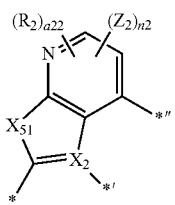

Formula CY2-3

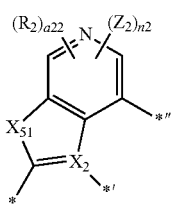

Formula CY2-4

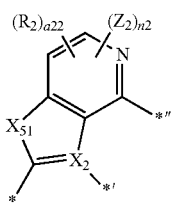

Formula CY2-5

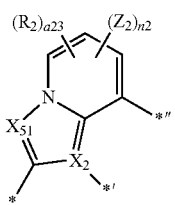

-continued
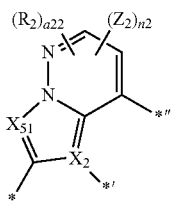
Formula CY2-6
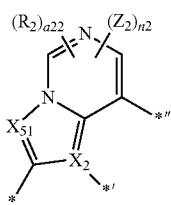
Formula CY2-7
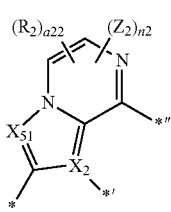
Formula CY2-8
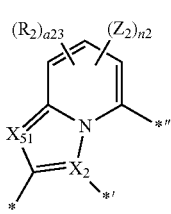
Formula CY2-9
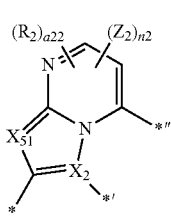
Formula CY2-10
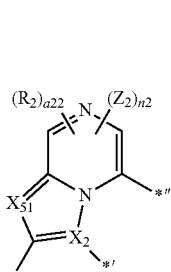
Formula CY2-11
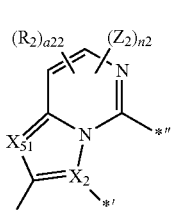
Formula CY2-12
-continued
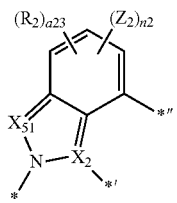
Formula CY2-13
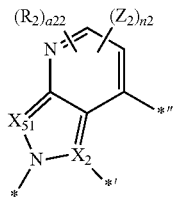
Formula CY2-14
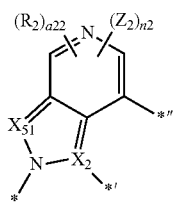
Formula CY2-15
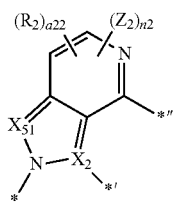
Formula CY2-16
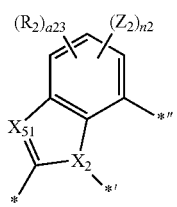
Formula CY2-17
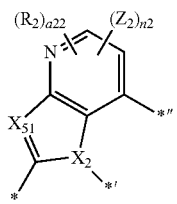
Formula CY2-18
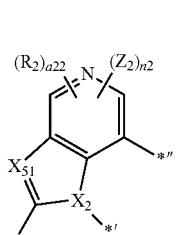
Formula CY2-19

-continued

Formula CY2-20

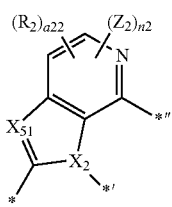

wherein, in Formulae CY2-1 to CY2-20, $R_2$, $Z_2$, and n2 are the same as described in connection with claim 1, n2 is 0, 1, or 2, $X_{51}$ in Formulae CY2-1 to CY2-4 is O, S, N-[$(L_7)_{b7}$-$(R_7)_{c7}$], $C(R_7)(R_8)$, $Si(R_7)(R_8)$, $Ge(R_7)(R_8)$, or $C(=O)$, $X_{51}$ in Formulae CY2-5 to CY2-20 is N, $C(R_7)$, $Si(R_7)$, or $Ge(R_7)$, $L_7$, b7, $R_7$, and c7 are the same as described in connection with claim 1, a22 is an integer from 0 to 2, a23 is an integer from 0 to 3, \* indicates a binding site to $CY_1$ in Formula 1, \*' indicates a binding site to M in Formula 1, and \*'' indicates a binding site to $CY_3$ in Formula 1.

12. The organometallic compound of claim 1, wherein a moiety represented by

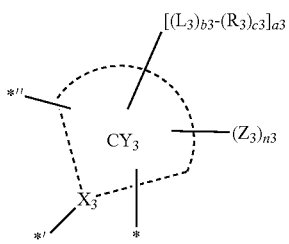

in Formula 1 is a group represented by one of Formulae CY3-1 to CY3-12:

Formula CY3-1

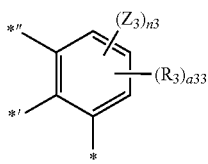

Formula CY3-2

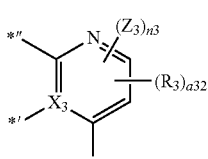

Formula CY3-3

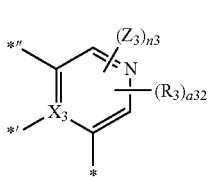

Formula CY3-4

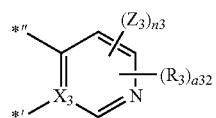

Formula CY3-5

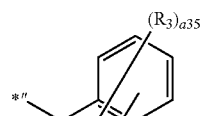

Formula CY3-6

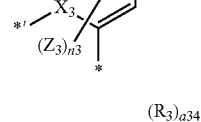

Formula CY3-7

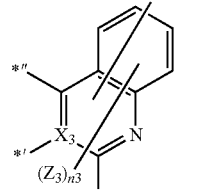

Formula CY3-8

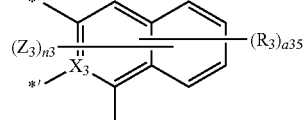

Formula CY3-9

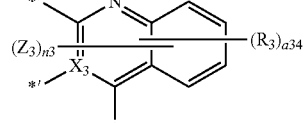

Formula CY3-10

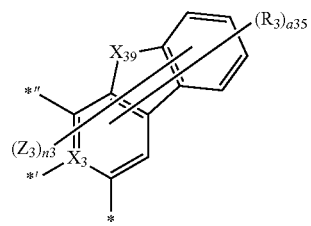

Formula CY3-11

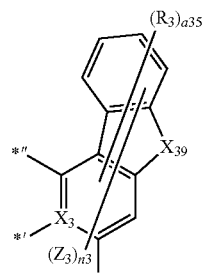

-continued

Formula CY3-12

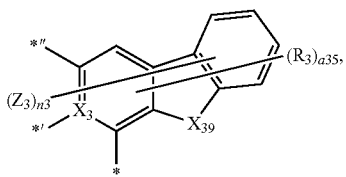

wherein, in Formulae CY3-1 to CY3-12,
$X_3$, $R_3$, $Z_3$, and n3 are the same as described in connection with claim 1, n3 is 0, 1 or 2,
$X_{39}$ is $C(R_{39a})(R_{39b})$, $N[(L_{39})_{b39}\text{-}(R_{39})_{c39}]$, O, S, or $Si(R_{39a})(R_{39b})$,
$L_{39}$ is the same as described in connection with $L_3$ in claim 1,
b39 and c39 are the same as described in connection with b3 and c3 recited in claim 1, respectively,
$R_{39a}$ and $R_{39b}$ are the same as described in connection with $R_3$ in claim 1,
a32 is an integer from 0 to 2,
a33 is an integer from 0 to 3,
a34 is an integer from 0 to 4,
a35 is an integer from 0 to 5,
\* indicates a binding site to $CY_4$ in Formula 1,
\*' indicates a binding site to M in Formula 1, and
\*'' indicates a binding site to $CY_2$ in Formula 1.

13. The organometallic compound of claim 1, wherein a moiety represented by

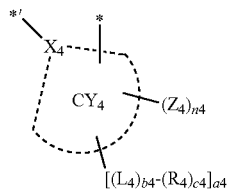

in Formula 1 is a group represented by one of Formulae CY4-1 to CY4-26:

Formula CY4-1

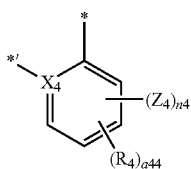

Formula CY4-2

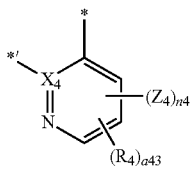

Formula CY4-3

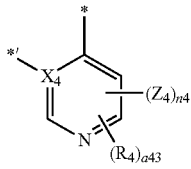

Formula CY4-4

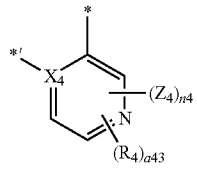

Formula CY4-5

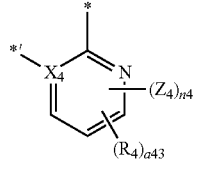

Formula CY4-6

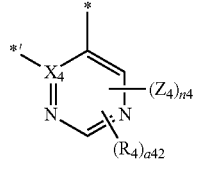

Formula CY4-7

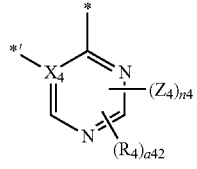

Formula CY4-8

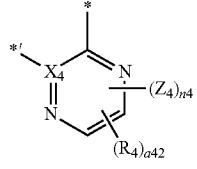

Formula CY4-9

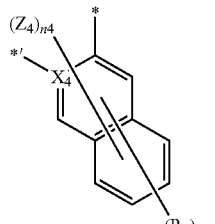

Formula CY4-10

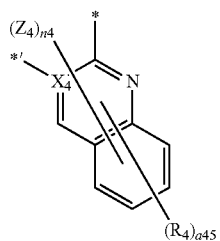

-continued
Formula CY4-11
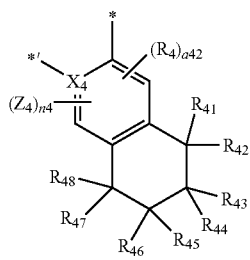
Formula CY4-12
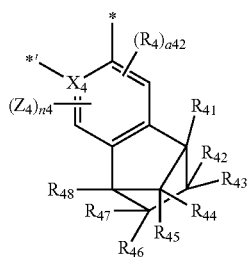
Formula CY4-13
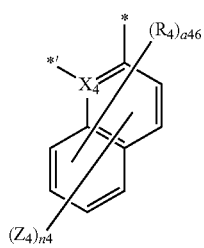
Formula CY4-14
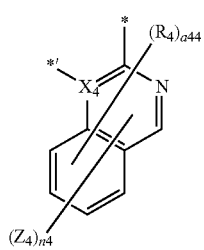
Formula CY4-15
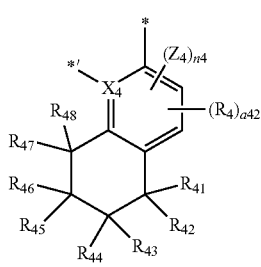
Formula CY4-16
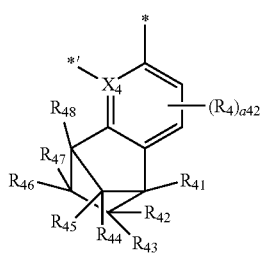
-continued
Formula CY4-17
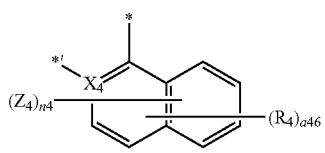
Formula CY4-18
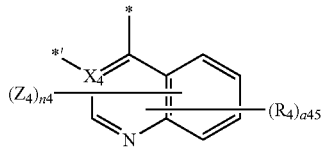
Formula CY4-19
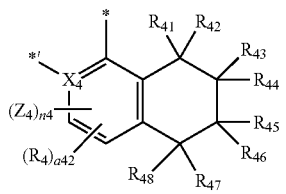
Formula CY4-20
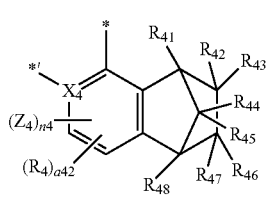
Formula CY4-21
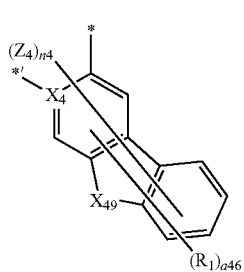
Formula CY4-22
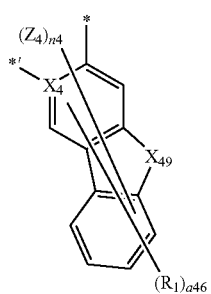
Formula CY4-23

193
-continued

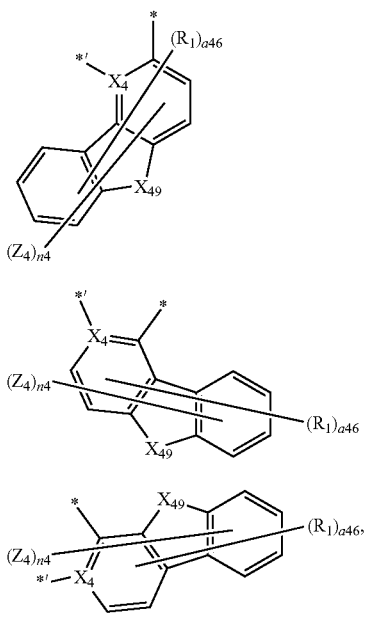

Formula CY4-24

Formula CY4-25

Formula CY4-26 wherein, in Formulae CY4-1 to CY4-26,
$X_4$, $R_4$, $Z_4$, and n4 are the same as described in connection with claim 1, n4 is 0, 1, or 2,
$X_{49}$ is $C(R_{49a})(R_{49b})$, $N[(L_{49})_{b49}-(R_{49})_{c49}]$, O, S, or $Si(R_{49a})(R_{49b})$,
$L_{49}$ is the same as described in connection with $L_4$ in claim 1,
b49 and c49 are the same as described in connection with b4 and c4 in claim 1, respectively,
$R_{41}$ to $R_{49}$, $R_{49a}$ and $R_{49b}$ are the same as described in connection with $R_4$ in claim 1,
a42 is an integer from 0 to 2,
a43 is an integer from 0 to 3,
a44 is an integer from 0 to 4,
a45 is an integer from 0 to 5,
a46 is an integer from 0 to 6,
\* indicates a binding site to $CY_3$ in Formula 1, and
\*' indicates a binding site to M in Formula 1.
14. The organometallic compound of claim 1, wherein the organometallic compound is one of Compounds 121 to 130, 136 to 140 and 146 to 190 below:

121

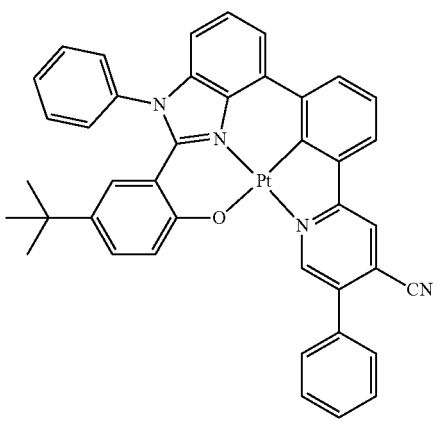

194
-continued

122

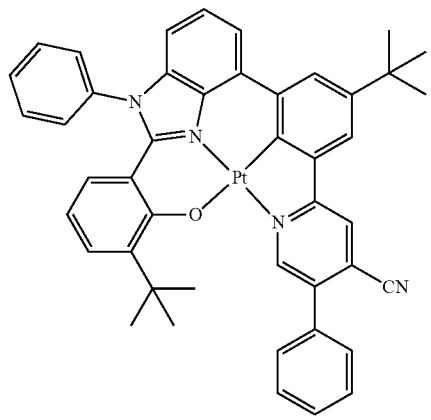

123

124

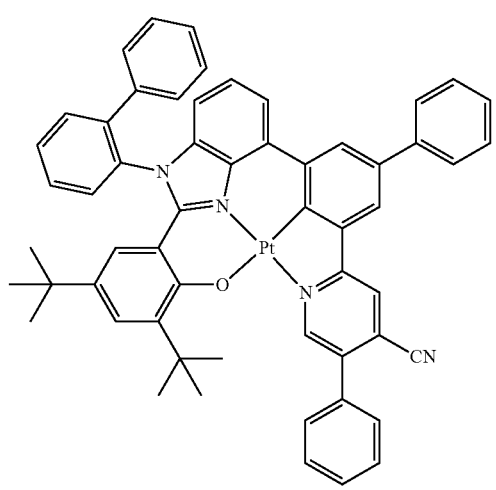

-continued
125
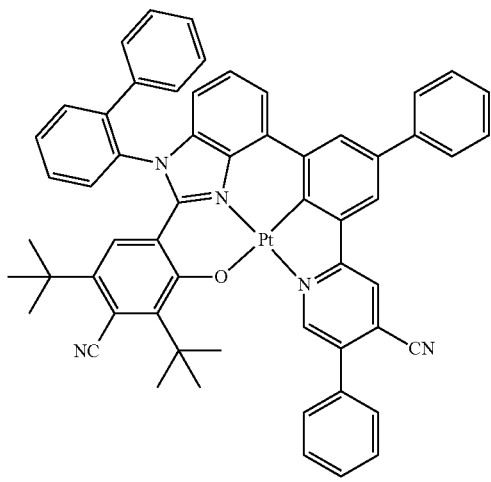
126
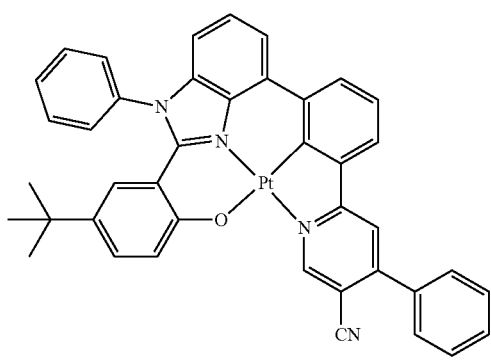
127
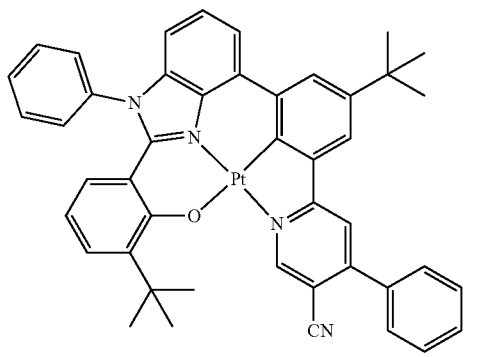
128
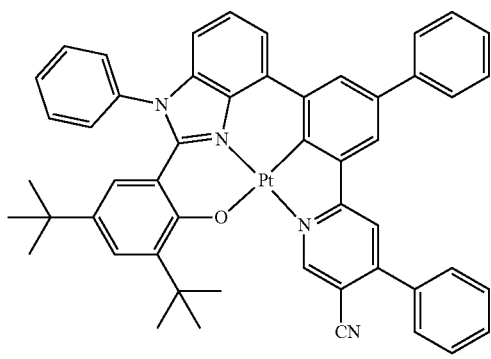
-continued
129
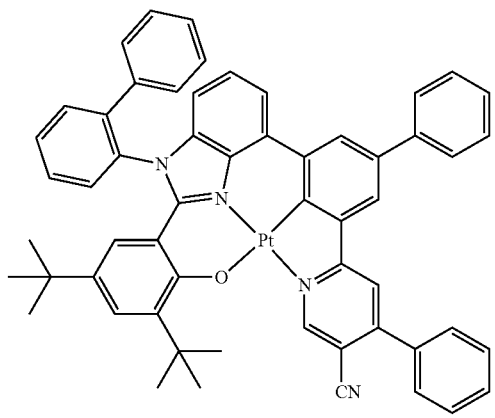
130
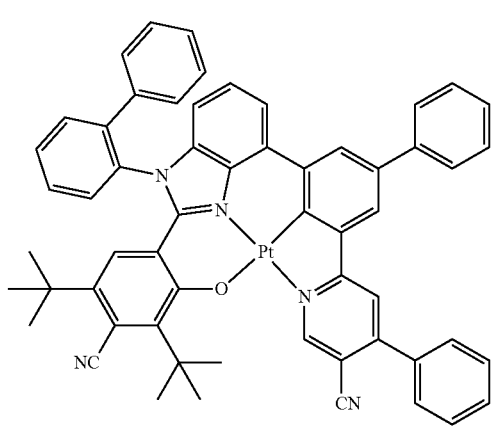
136
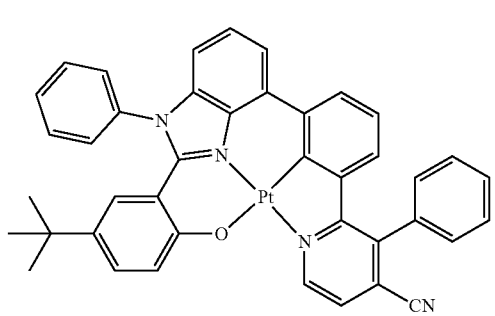
137
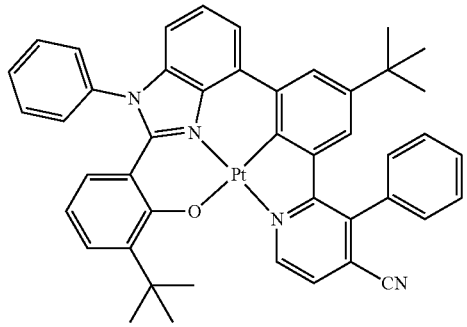

-continued
138
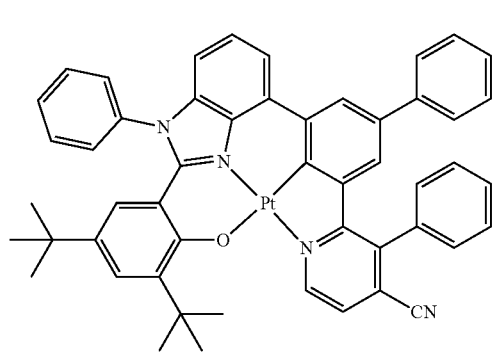
139
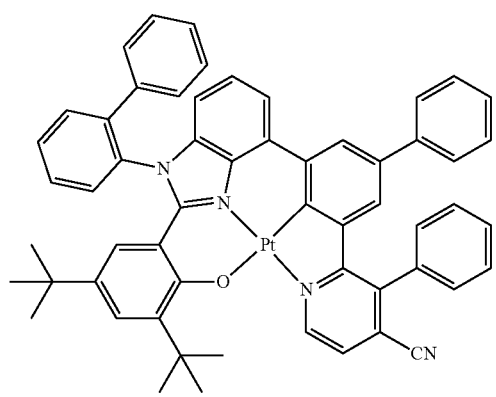
140
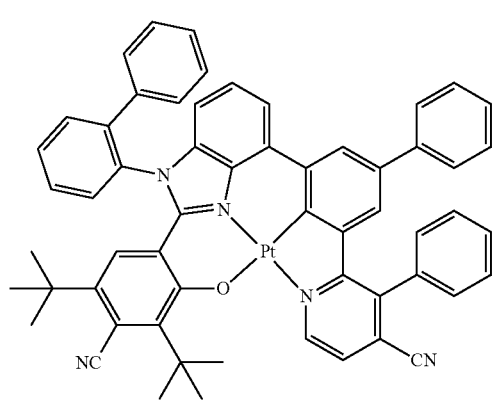
151
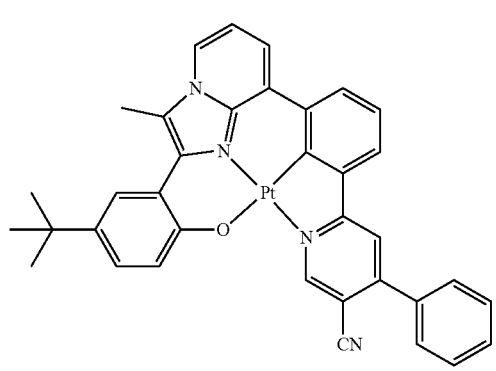
-continued
152
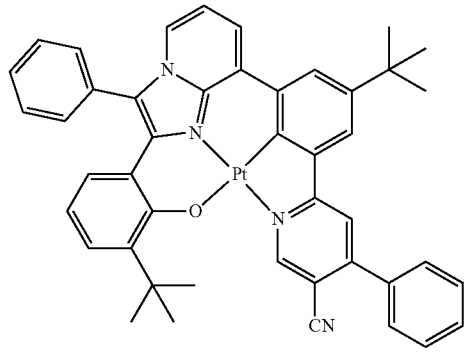
153
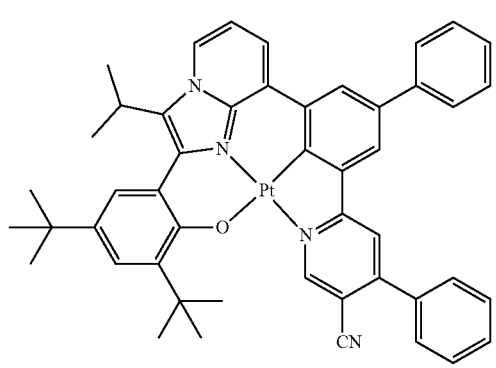
154
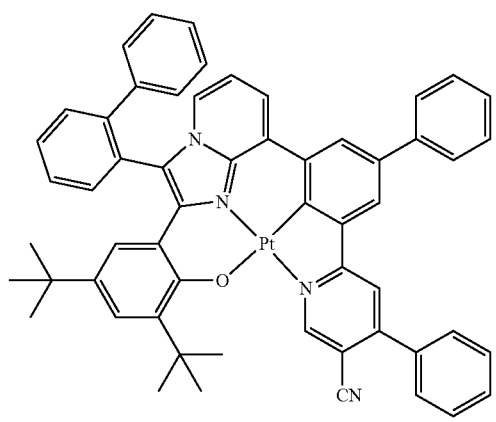
155
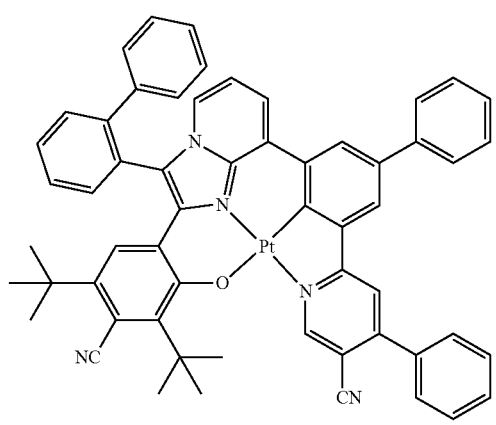

-continued
156
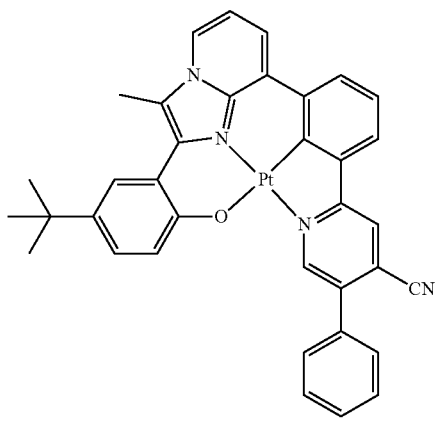
157
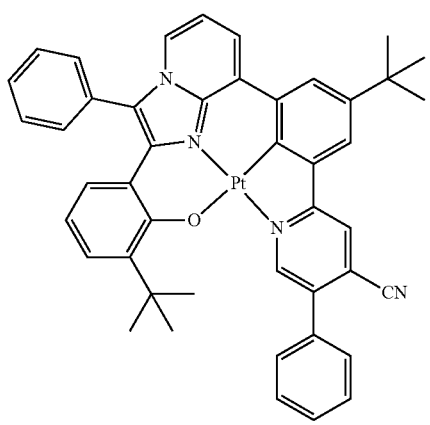
158
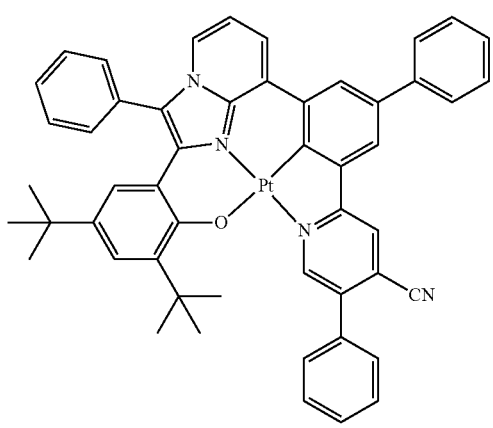
-continued
159
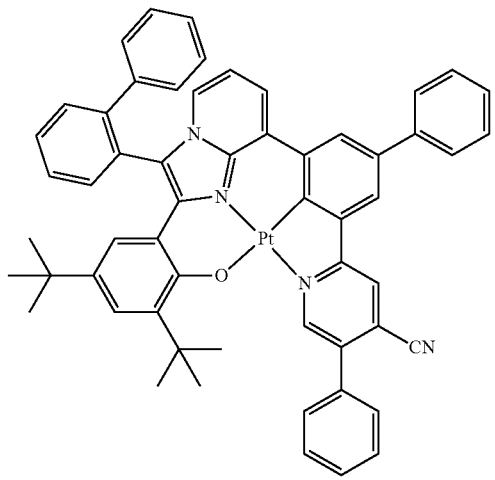
160
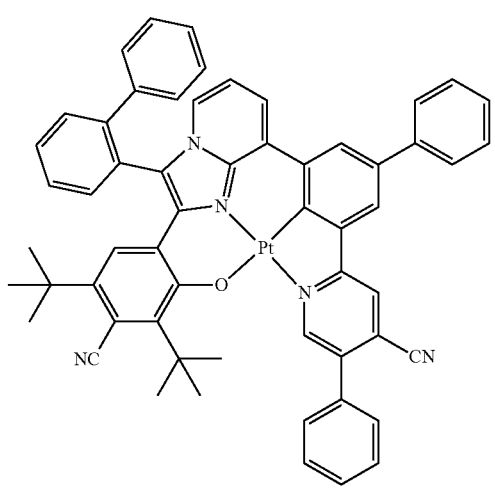
161
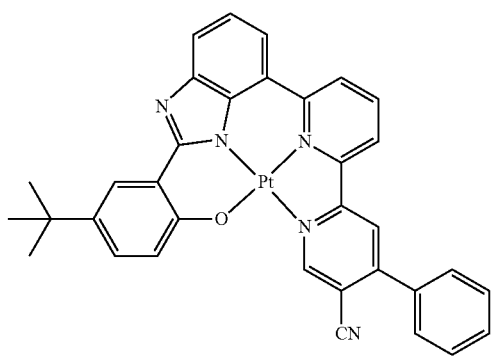

201
-continued
162
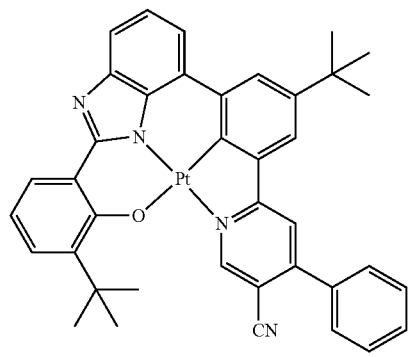
163
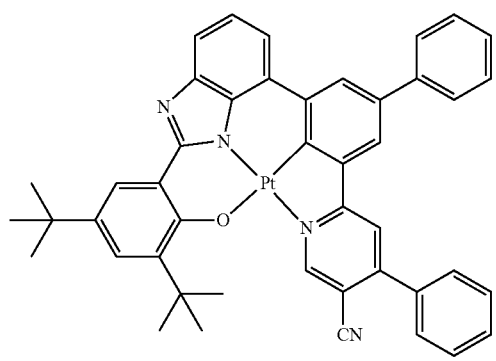
164
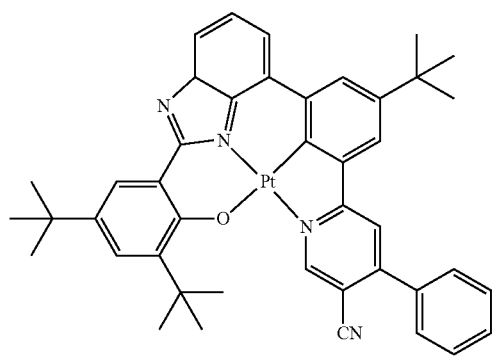
165
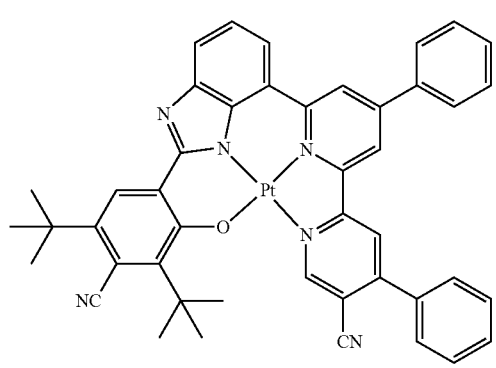
202
-continued
166
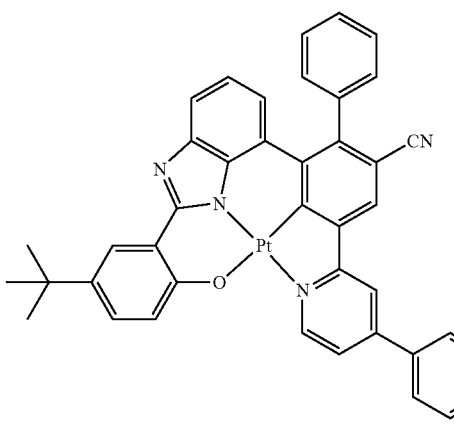
167
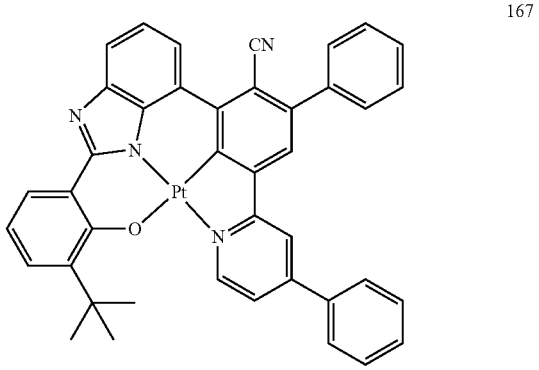
168
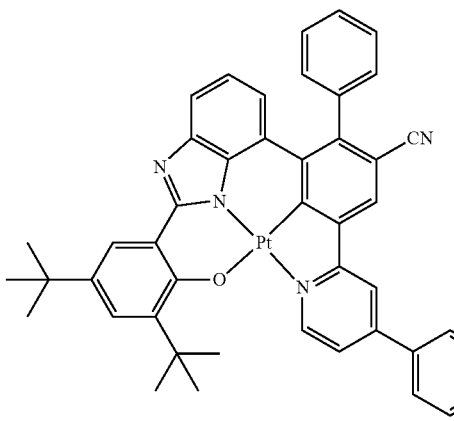
169
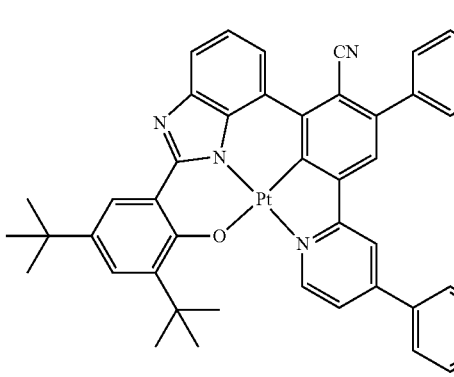

203
-continued
170
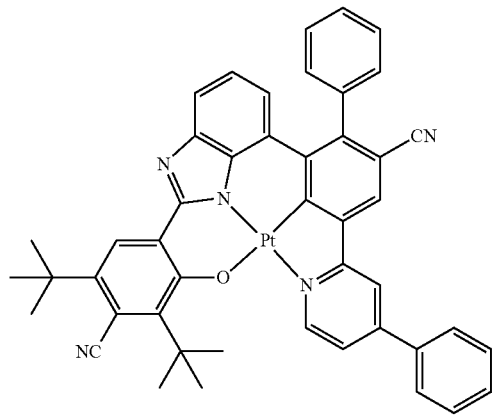
171
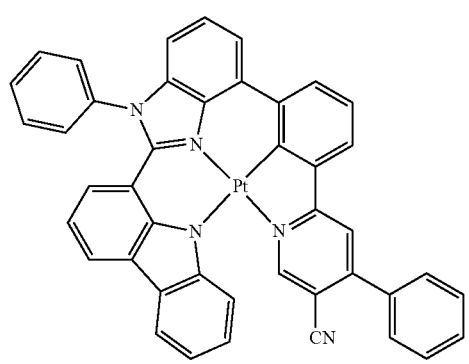
172
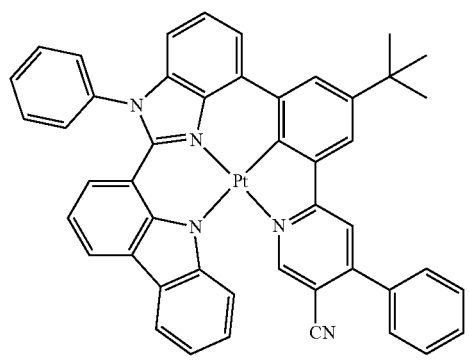
173
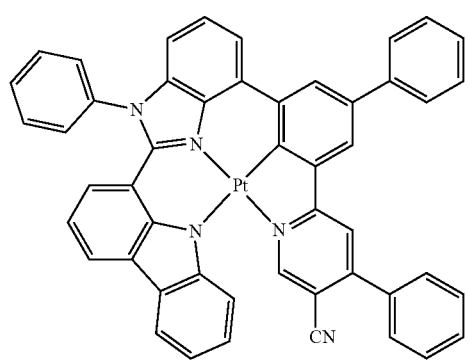
204
-continued
174
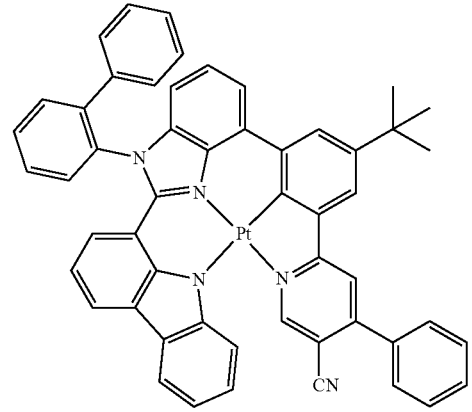
175
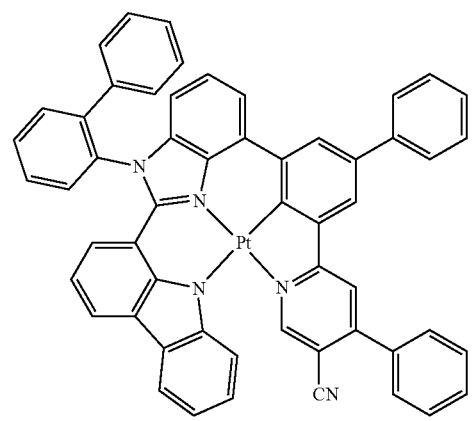
176
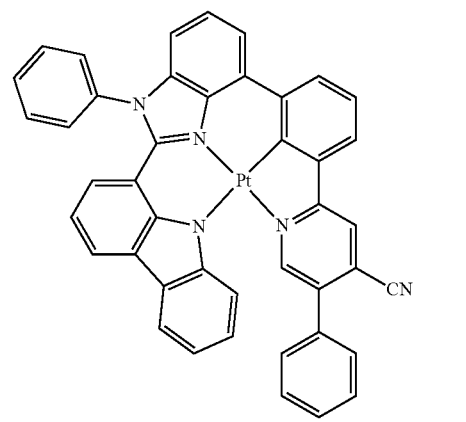

177
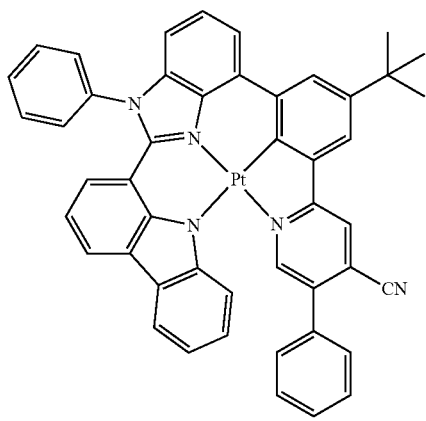
178
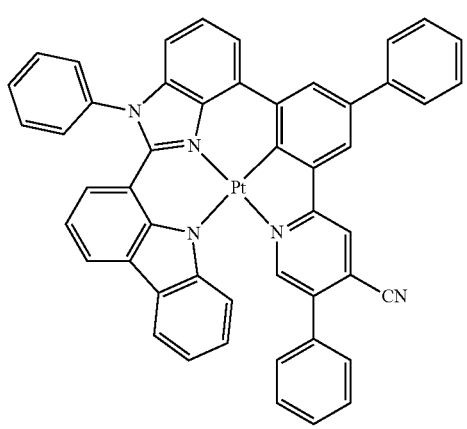
179
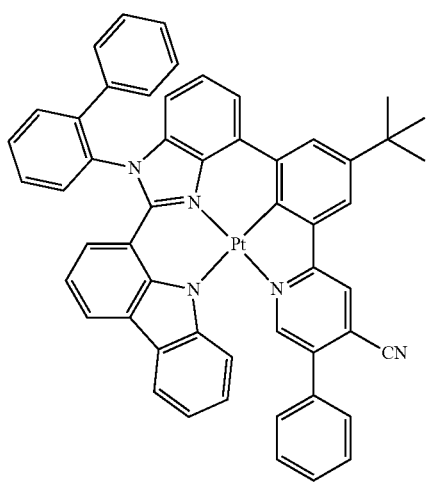
180
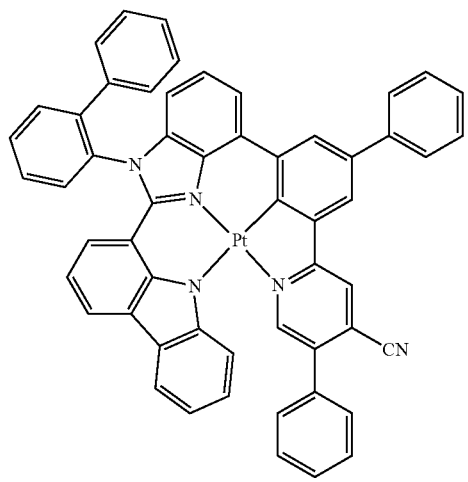
181
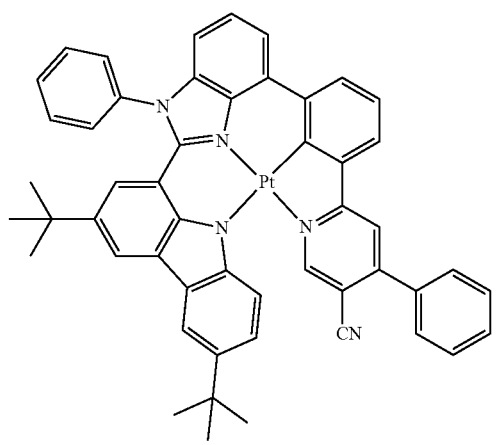
182
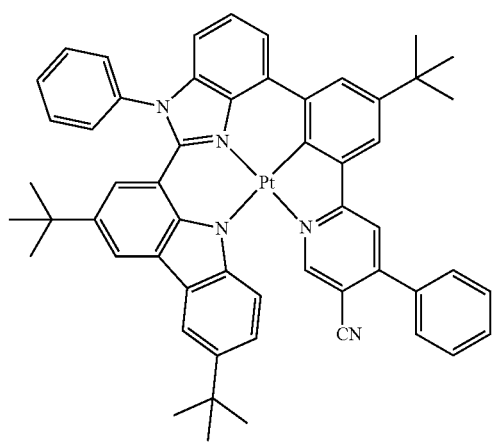

183
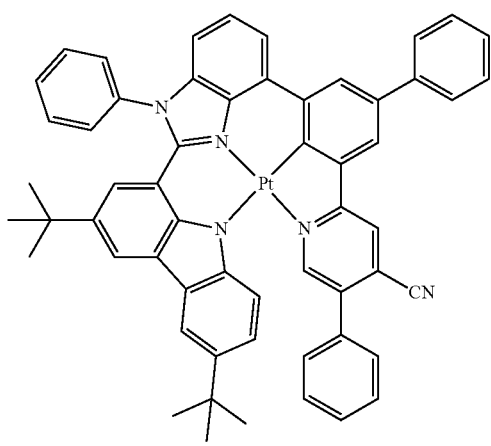
184
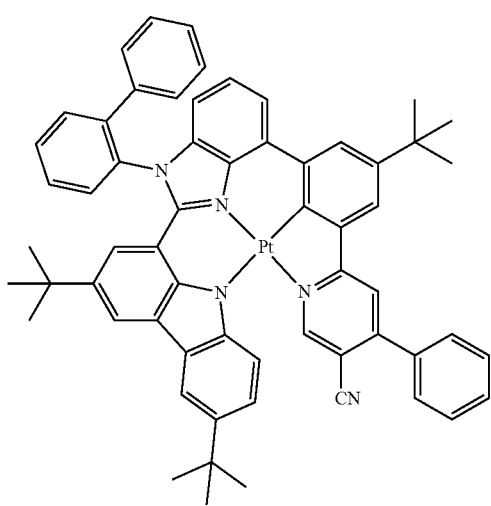
185
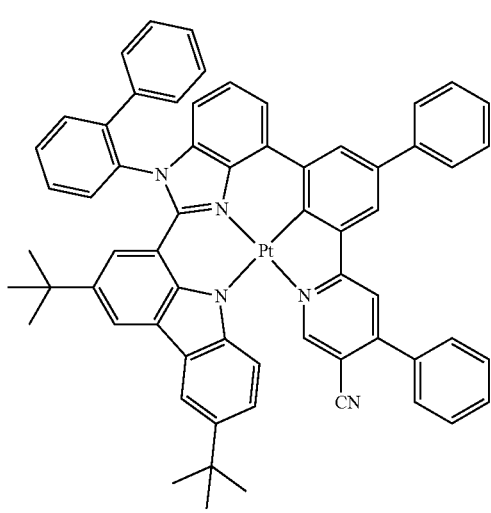
186
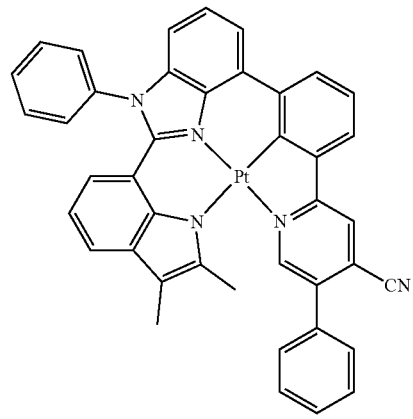
187
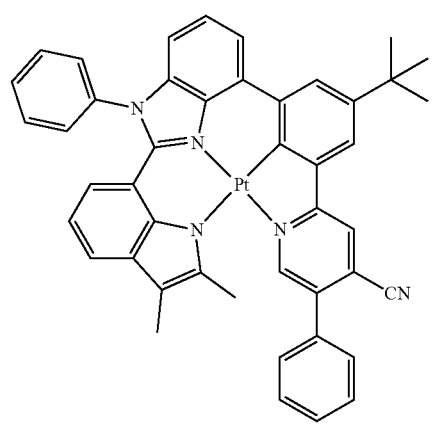
188
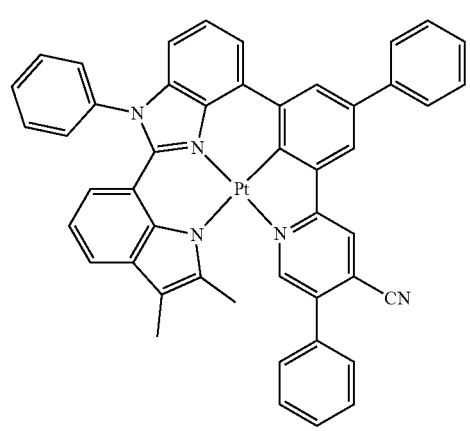

-continued

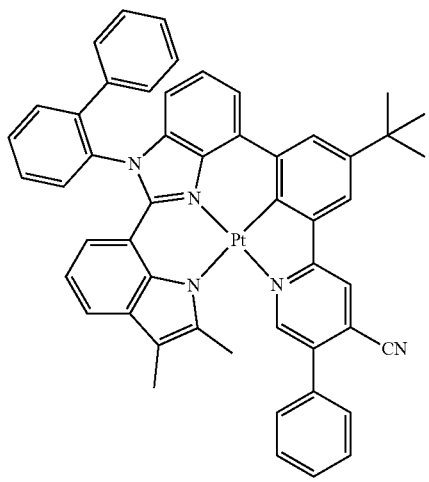
189

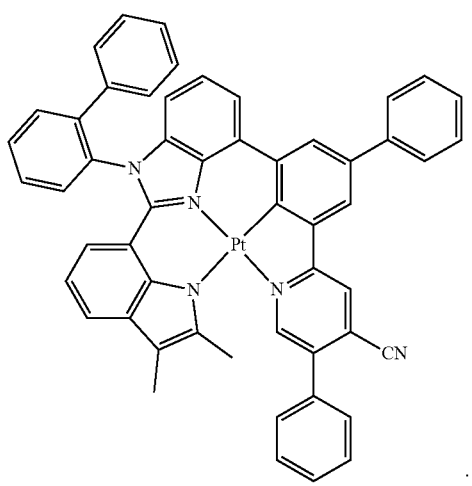
190

15. An organic light-emitting device comprising:
a first electrode;
a second electrode; and
an organic layer disposed between the first electrode and the second electrode,
wherein the organic layer comprising an emission layer, and
wherein the organic layer comprises at least one organometallic compound of claim 1.

16. The organic light-emitting device of claim 15, wherein
the first electrode is an anode,
the second electrode is a cathode, and
the organic layer further comprises a hole transport region disposed between the first electrode and the emission layer and an electron transport region disposed between the emission layer and the second electrode,
wherein the hole transport region comprises a hole injection layer, a hole transport layer, an electron blocking layer, or any combination thereof, and
wherein the electron transport region comprises a hole blocking layer, an electron transport layer, an electron injection layer, or any combination thereof.

17. The organic light-emitting device of claim 15, wherein the emission layer comprises the at least one organometallic compound.

18. The organic light-emitting device of claim 17, wherein the emission layer further comprises a host, and wherein an amount of the host is greater than an amount of the at least one organometallic compound.

19. A diagnostic composition comprising at least one organometallic compound of claim 1.

* * * * *